(12) United States Patent
Yamazaki

(10) Patent No.: US 10,326,026 B2
(45) Date of Patent: Jun. 18, 2019

(54) SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 277 days.

(21) Appl. No.: 15/440,437

(22) Filed: Feb. 23, 2017

(65) Prior Publication Data

US 2017/0162701 A1  Jun. 8, 2017

Related U.S. Application Data

(62) Division of application No. 14/694,291, filed on Apr. 23, 2015, now Pat. No. 9,608,124, which is a division
(Continued)

(30) Foreign Application Priority Data

Jan. 20, 2012 (JP) ................ 2012-010386
Jan. 20, 2012 (JP) ................ 2012-010404
Jan. 20, 2012 (JP) ................ 2012-010423

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 29/0657* (2013.01);
(Continued)

(58) Field of Classification Search
CPC ................ H01L 29/786; H01L 29/51
See application file for complete search history.

(56) References Cited

U.S. PATENT DOCUMENTS 5,528,032 A  6/1996 Uchiyama
5,731,856 A  3/1998 Kim et al.
(Continued)

FOREIGN PATENT DOCUMENTS

EP  1737044 A  12/2006
EP  2120267 A  11/2009
(Continued)

OTHER PUBLICATIONS

Song.I et al., "Short Channel Characteristics of Gallium-Indium-Zinc-Oxide Thin Film Transistors for Three-Dimensional Stacking Memory", IEEE Electron Device Letters, Jun. 1, 2008, vol. 29, No. 6, pp. 549-552.
(Continued)

*Primary Examiner* — Moazzam Hossain
(74) *Attorney, Agent, or Firm* — Robinson Intellectual Property Law Office; Eric J. Robinson

(57) ABSTRACT

Provided is a transistor which has favorable transistor characteristics and includes an oxide semiconductor, and a highly reliable semiconductor device which includes the transistor including the oxide semiconductor. In the semiconductor device including the transistor in which an oxide semiconductor film, a gate insulating film, and a gate electrode are stacked in this order, a sidewall insulating film is formed along side surfaces and a top surface of the gate electrode, and the oxide semiconductor film is subjected to etching treatment so as to have a cross shape having different lengths in the channel length direction or to have a larger length than a source electrode and a drain electrode in the channel width direction. Further, the source electrode and the drain electrode are formed in contact with the oxide semiconductor film.

10 Claims, 47 Drawing Sheets

Related U.S. Application Data of application No. 13/738,484, filed on Jan. 10, 2013, now Pat. No. 9,040,981.

(51) Int. Cl.

| | | |
|---|---|---|
| *H01L 29/06* | (2006.01) | |
| *H01L 29/24* | (2006.01) | |
| *H01L 29/49* | (2006.01) | |
| *H01L 29/51* | (2006.01) | |
| *H01L 29/10* | (2006.01) | |

(52) U.S. Cl.
CPC ...... *H01L 29/0692* (2013.01); *H01L 29/1033* (2013.01); *H01L 29/24* (2013.01); *H01L 29/4908* (2013.01); *H01L 29/513* (2013.01); *H01L 29/518* (2013.01); *H01L 29/786* (2013.01); *H01L 29/78618* (2013.01); *H01L 29/78696* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,227,302 B2 | 7/2012 | Ohnuma |
| 8,237,166 B2 | 8/2012 | Kumomi et al. |
| 8,384,076 B2 | 2/2013 | Park et al. |
| 9,240,488 B2 | 1/2016 | Yamazaki et al. |
| 9,378,980 B2 | 6/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishilh |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1* | 8/2007 | Hosono ............... C23C 14/0021 257/347 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237665 A1* | 10/2008 | Shishido ............... H01L 23/60 257/290 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1* | 7/2009 | Sano ............... H01L 21/428 257/43 |
| 2009/0278122 A1 | 11/2009 | Hosono et al. |
| 2009/0280600 A1 | 11/2009 | Hosono et al. |
| 2009/0283763 A1* | 11/2009 | Park ............... H01L 29/78621 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0012125 A1 | 1/2011 | Nicholas et al. |
| 2011/0101351 A1 | 5/2011 | Yamazaki |
| 2011/0186853 A1 | 8/2011 | Terai et al. |
| 2011/0256693 A1* | 10/2011 | D'Evelyn ............... C30B 7/105 438/478 |
| 2011/0309876 A1 | 12/2011 | Terai et al. |
| 2012/0175608 A1 | 7/2012 | Yamazaki |
| 2012/0175609 A1 | 7/2012 | Yamazaki |
| 2012/0175610 A1 | 7/2012 | Yamazaki |
| 2012/0175625 A1 | 7/2012 | Yamazaki |
| 2012/0178224 A1 | 7/2012 | Yamazaki |
| 2012/0178249 A1 | 7/2012 | Yamazaki |
| 2013/0001546 A1 | 1/2013 | Kamada et al. |
| 2013/0075732 A1 | 3/2013 | Saito et al. |
| 2016/0293767 A1 | 10/2016 | Yamazaki et al. |

FOREIGN PATENT DOCUMENTS

| | | |
|---|---|---|
| EP | 2226847 A | 9/2010 |
| EP | 2408011 A | 1/2012 |
| EP | 2927965 A | 10/2015 |
| JP | 60-198861 A | 10/1985 |

(56) References Cited

FOREIGN PATENT DOCUMENTS

| JP | 63-210022 A | 8/1988 |
|---|---|---|
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2008-112909 A | 5/2008 |
| JP | 2008-263128 A | 10/2008 |
| JP | 2009-267027 A | 11/2009 |
| JP | 2009-278115 A | 11/2009 |
| JP | 2009-283921 A | 12/2009 |
| JP | 2011-518434 | 6/2011 |
| JP | 2011-146694 A | 7/2011 |
| JP | 2011-171702 A | 9/2011 |
| WO | WO-2004/114391 | 12/2004 |
| WO | WO-2009/133829 | 11/2009 |
| WO | WO-2011/074407 | 6/2011 |

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-plane", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In'Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner

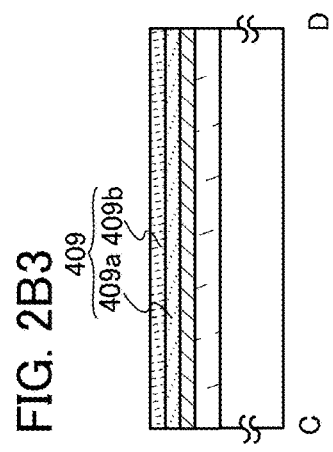
FIG. 2A2 FIG. 2A3
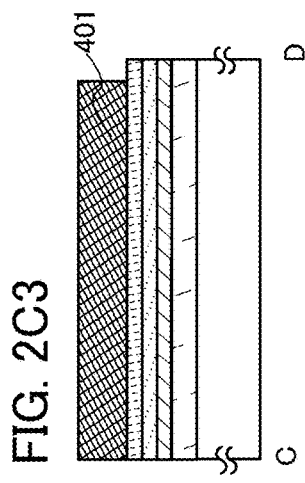
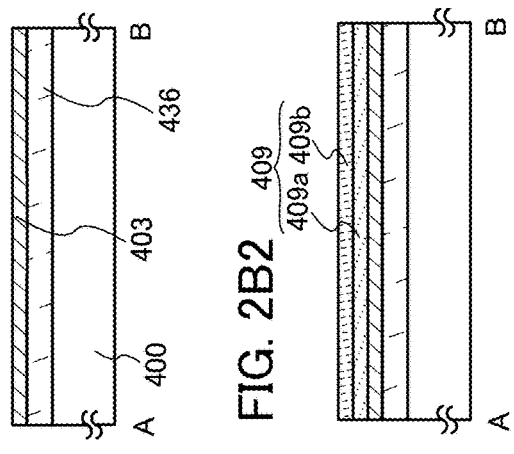
FIG. 2B2 FIG. 2B3
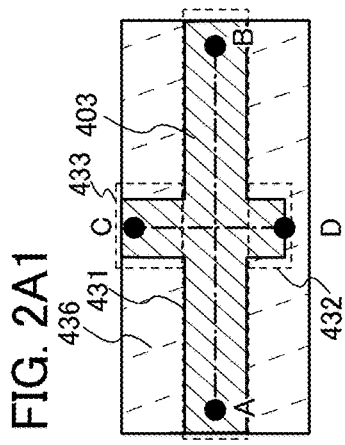
FIG. 2A1
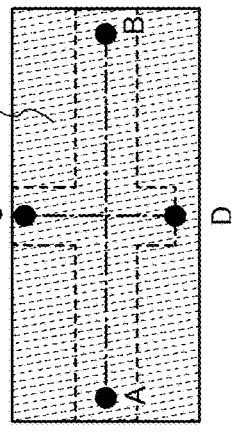
FIG. 2B1
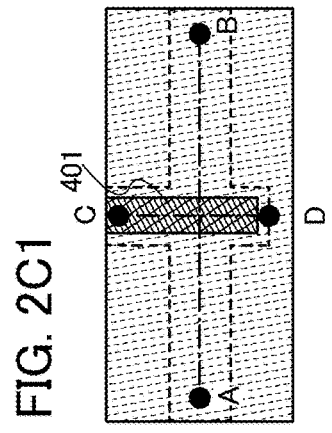
FIG. 2C1 FIG. 2C2 FIG. 2C3

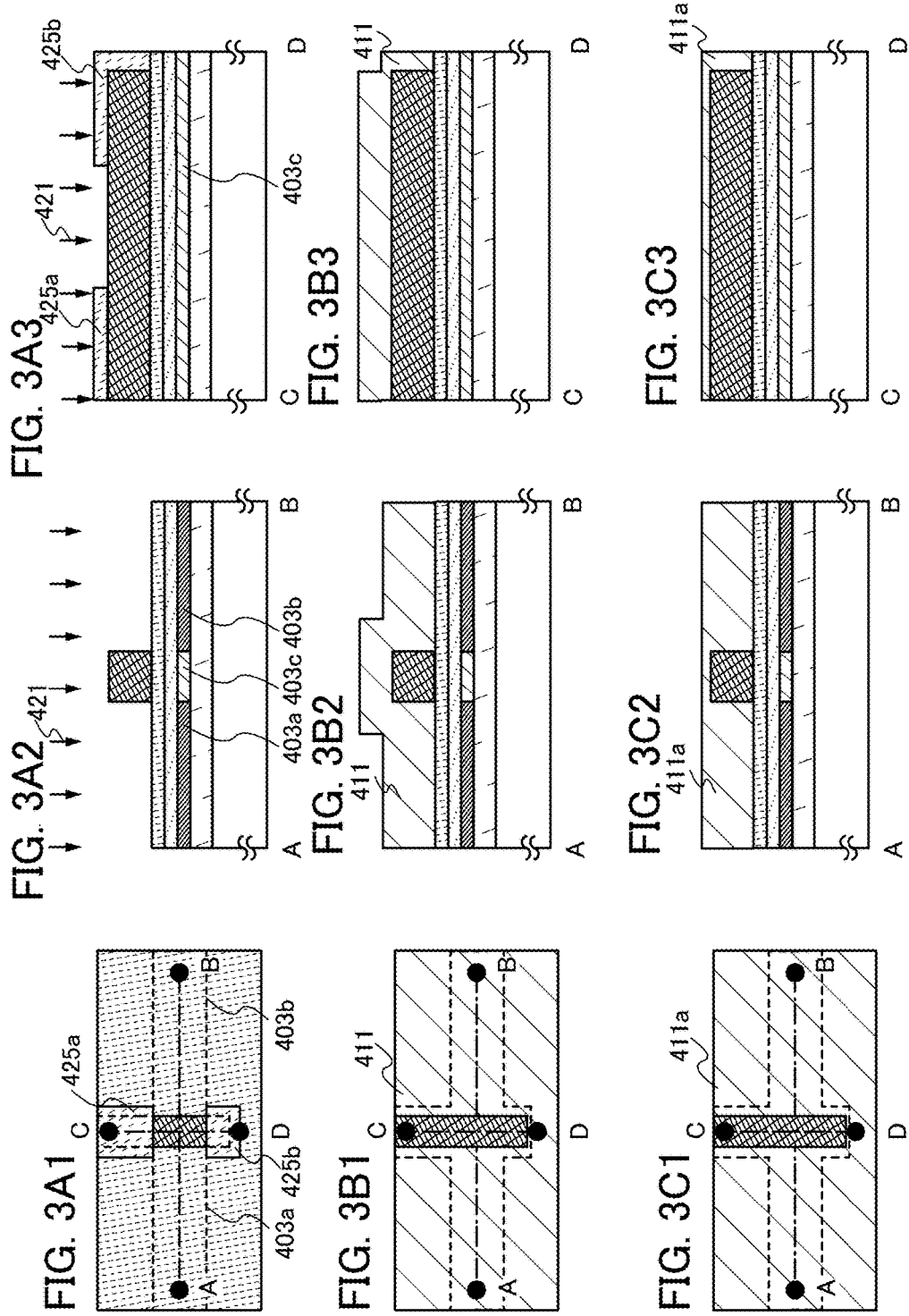

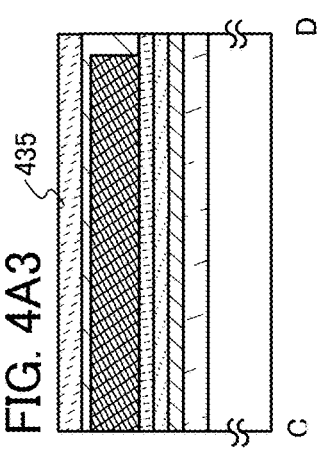
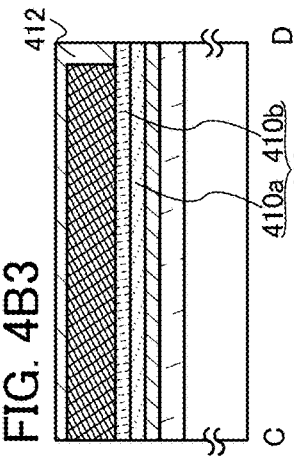
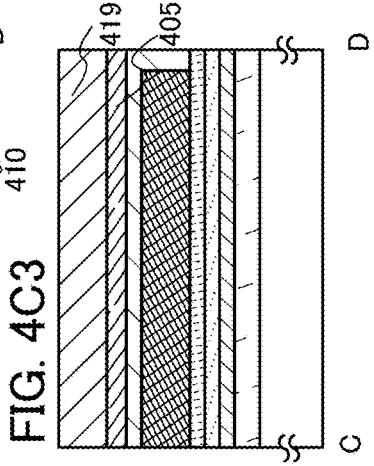
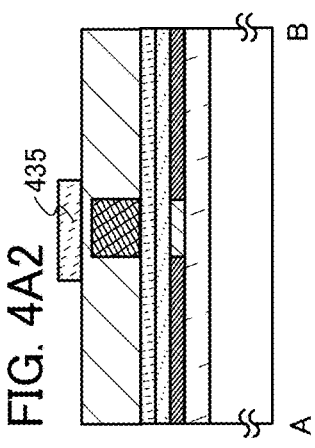
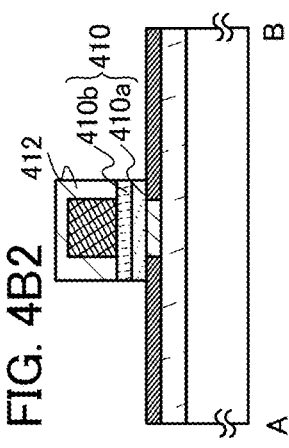
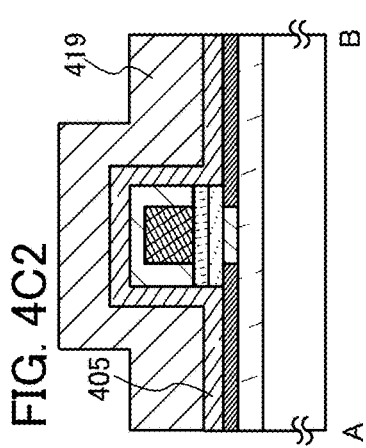
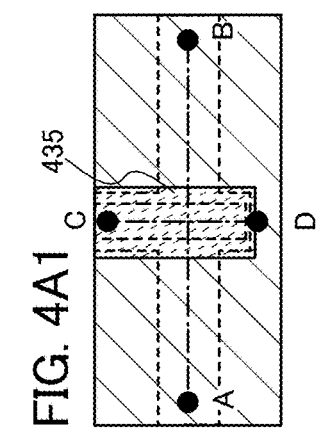
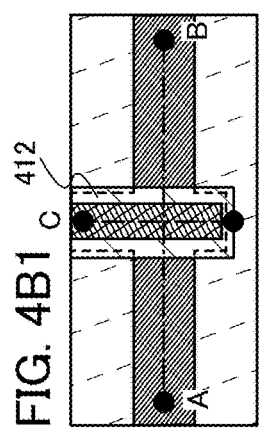
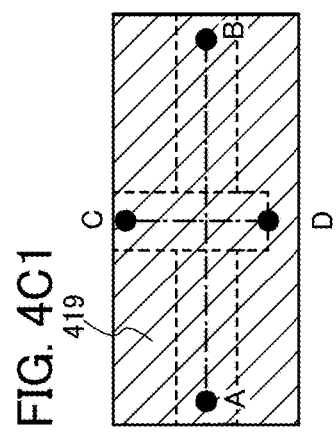

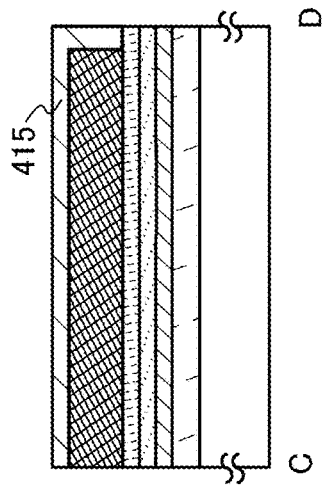
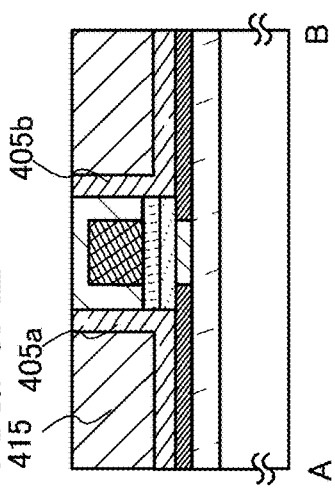
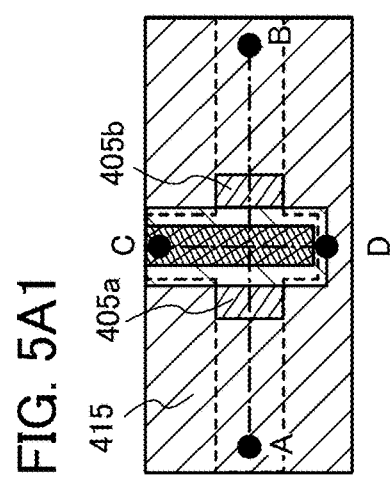
FIG. 5A1 FIG. 5A2 FIG. 5A3
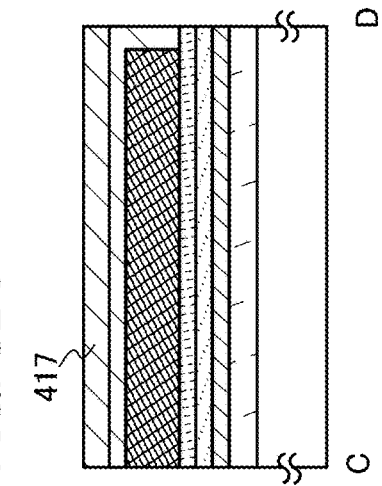
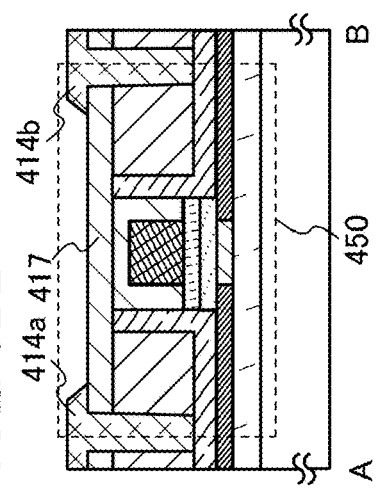
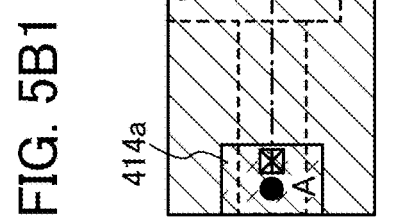
FIG. 5B1 FIG. 5B2 FIG. 5B3

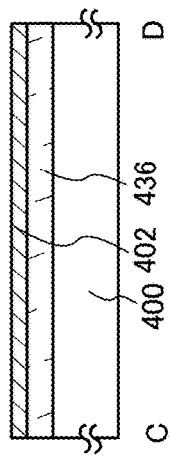
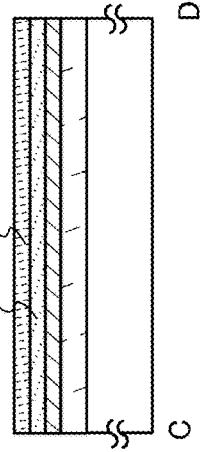
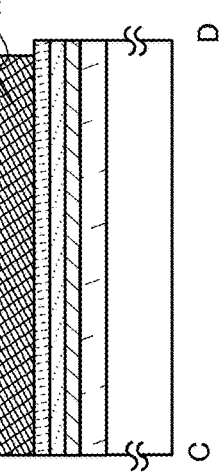
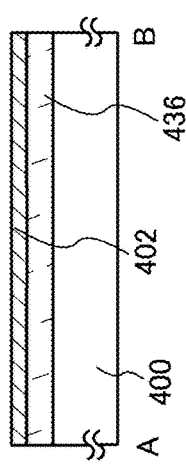
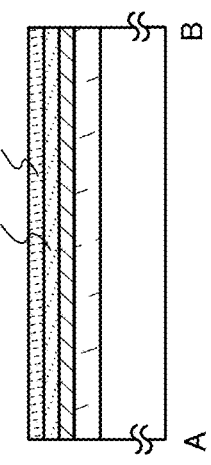
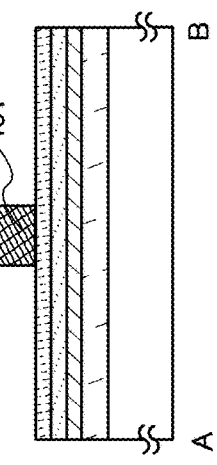
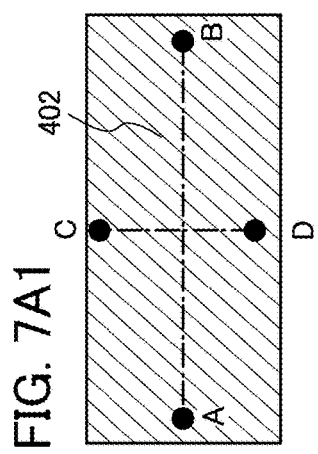
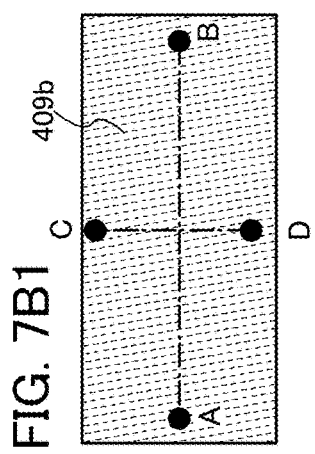
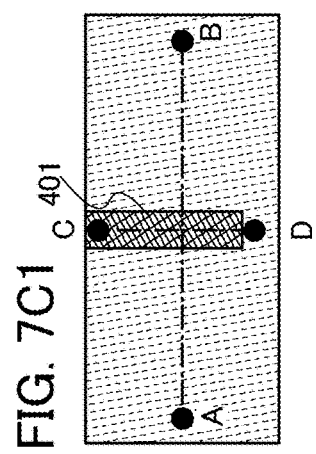

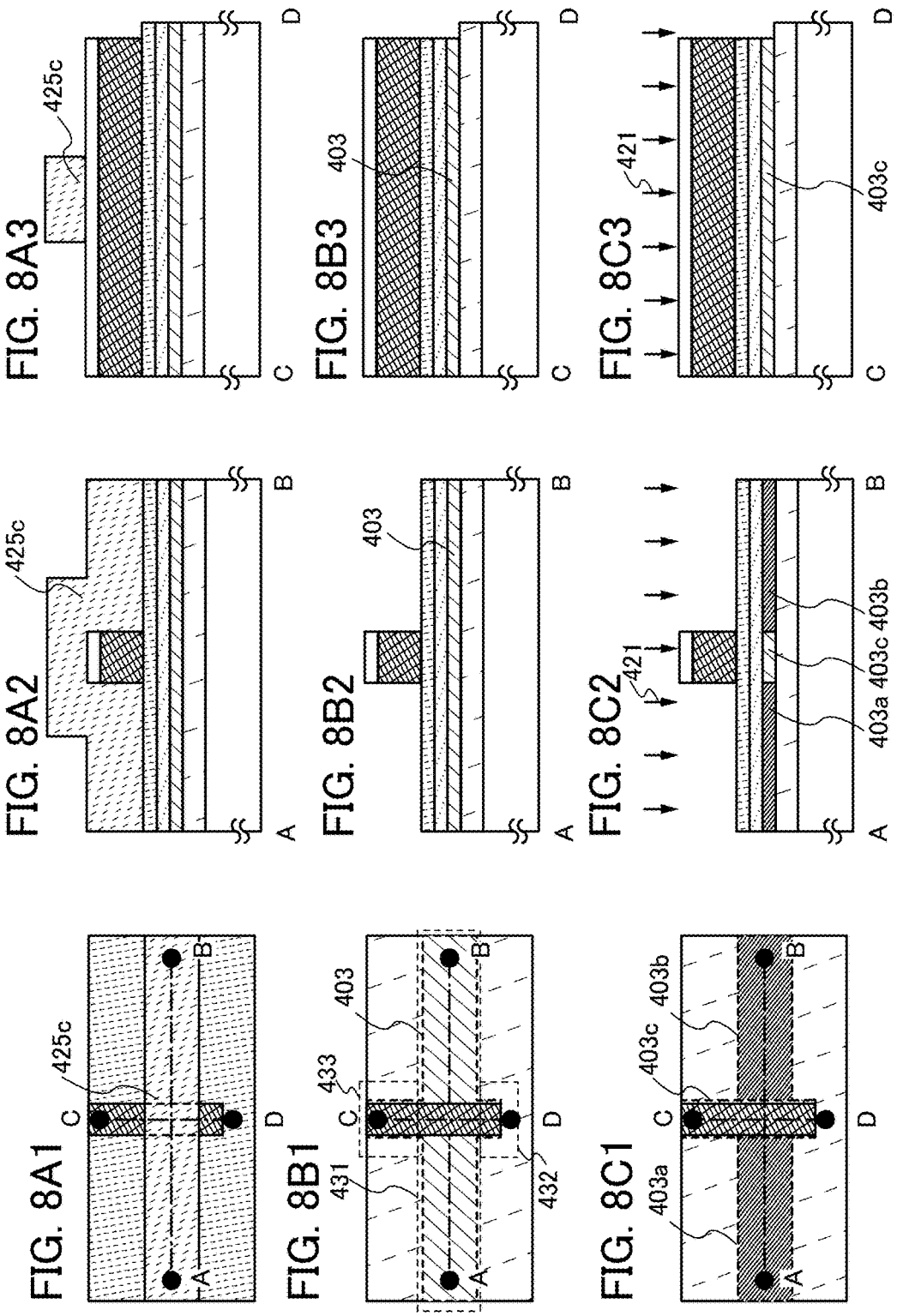

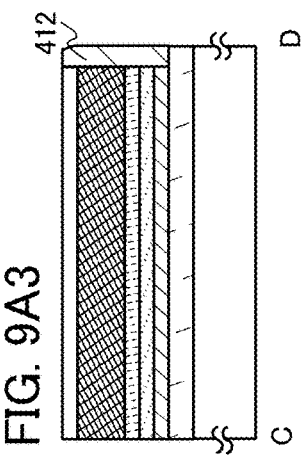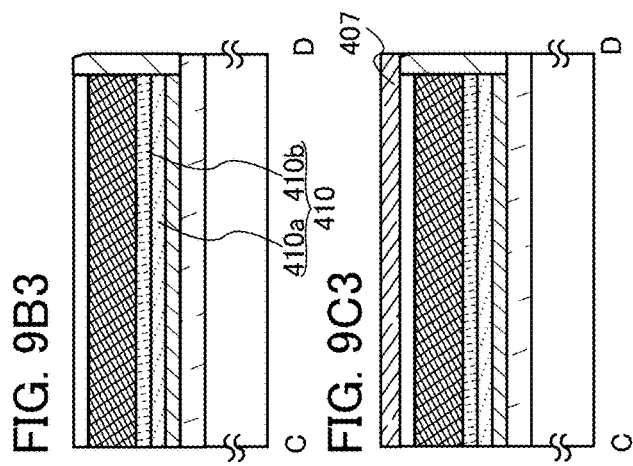
FIG. 9A1  FIG. 9A2  FIG. 9A3
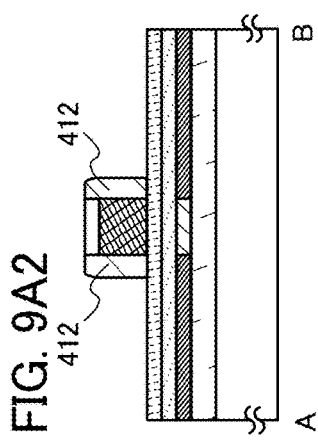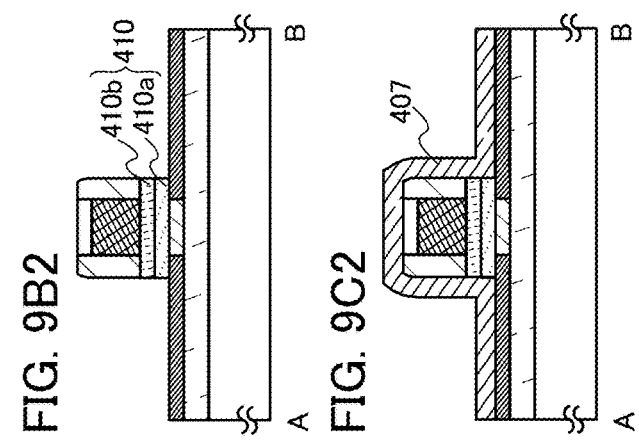
FIG. 9B1  FIG. 9B2  FIG. 9B3
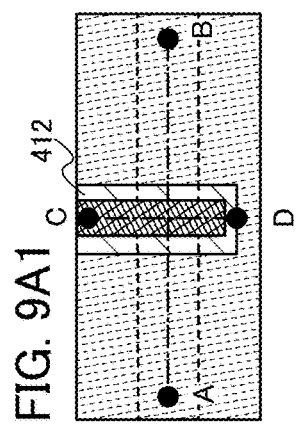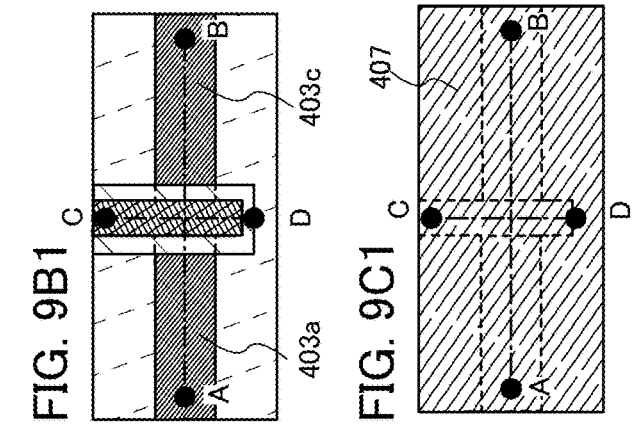
FIG. 9C1  FIG. 9C2  FIG. 9C3

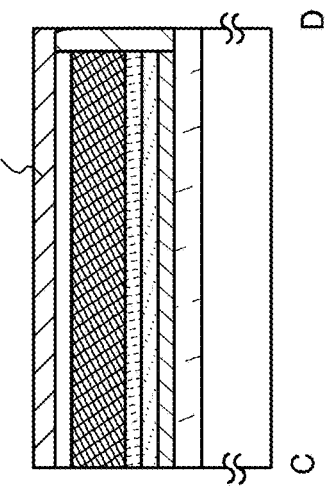
FIG. 10A3
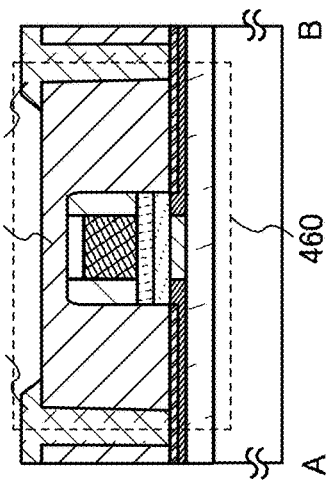
FIG. 10A2
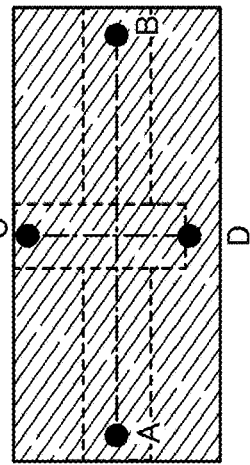
FIG. 10A1
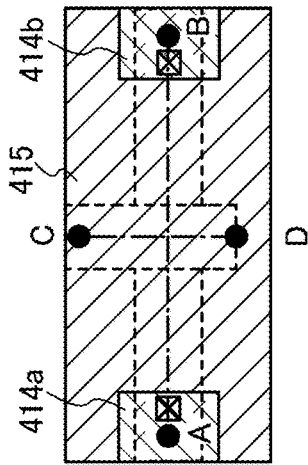
FIG. 10B3
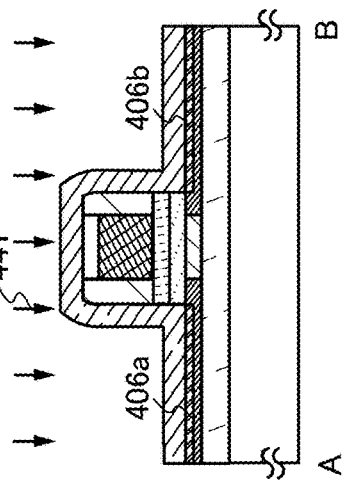
FIG. 10B2
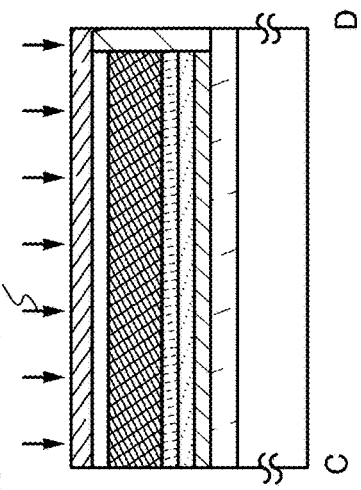
FIG. 10B1

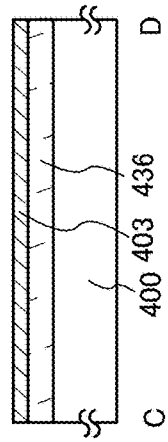
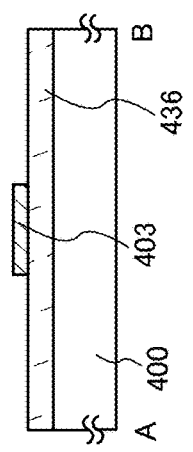
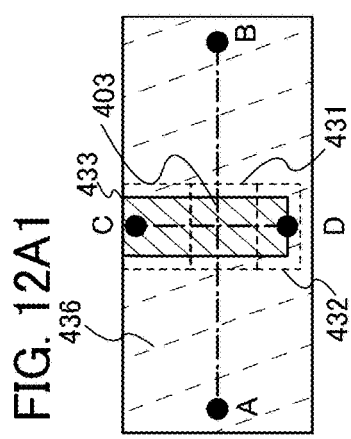
FIG. 12A3
FIG. 12A2
FIG. 12A1
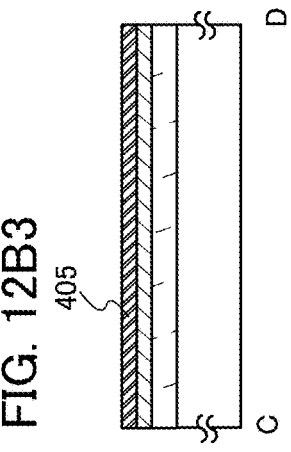
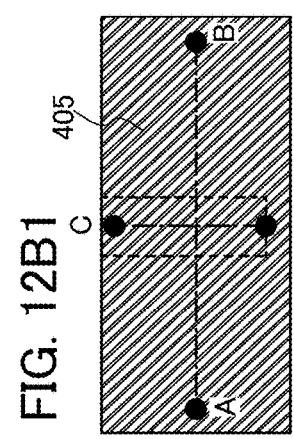
FIG. 12B3
FIG. 12B2
FIG. 12B1
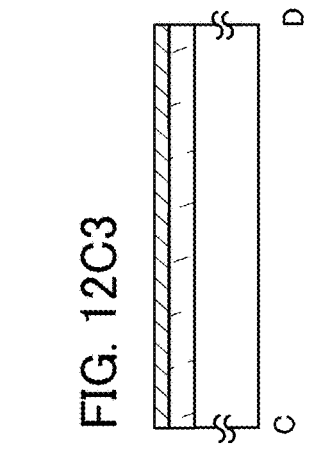
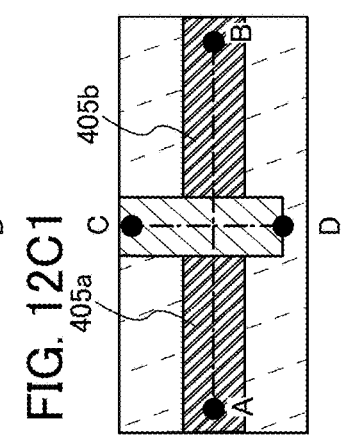
FIG. 12C3
FIG. 12C2
FIG. 12C1

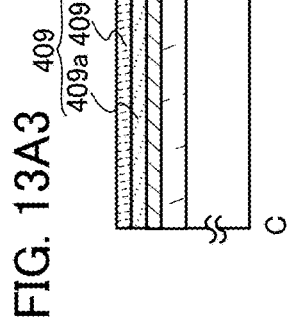
FIG. 13A1
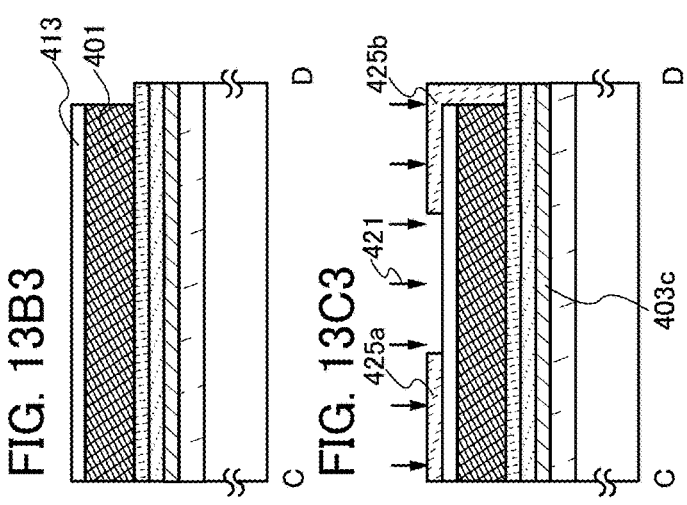
FIG. 13A2 FIG. 13A3
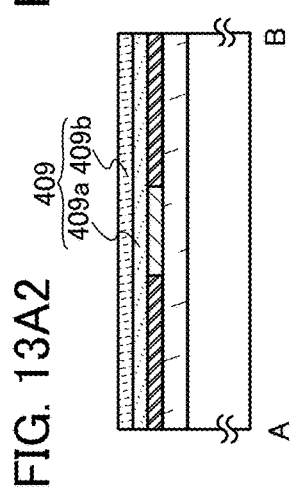
FIG. 13B1
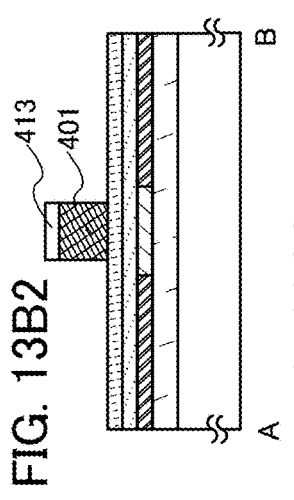 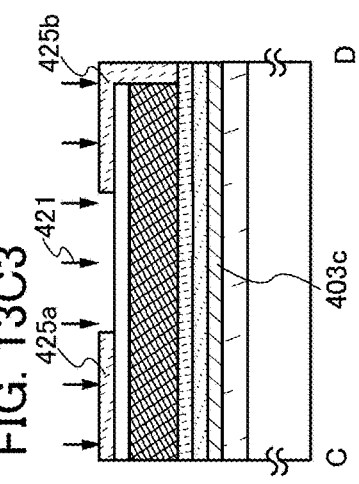
FIG. 13B2 FIG. 13B3
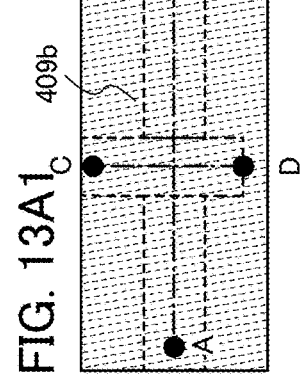
FIG. 13C1
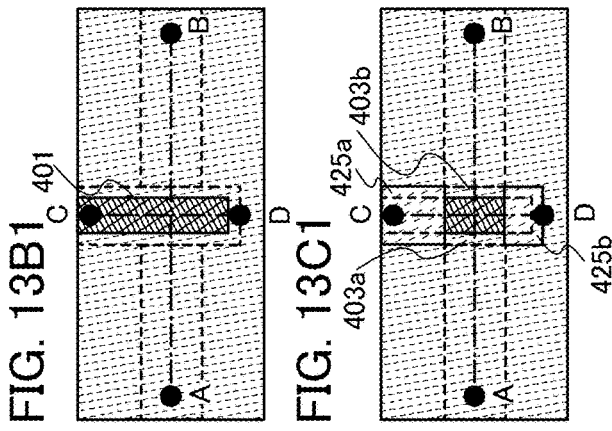
FIG. 13C2 FIG. 13C3

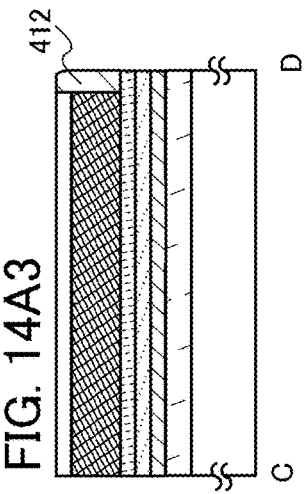 FIG. 14A1
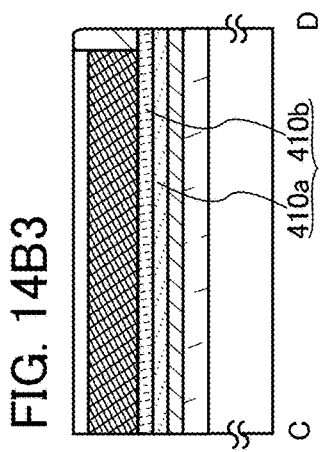 FIG. 14A2
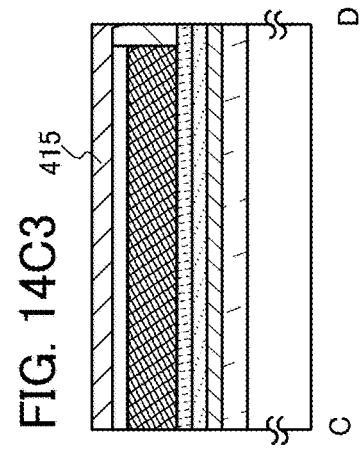 FIG. 14A3
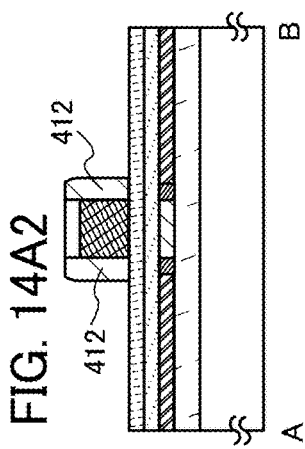 FIG. 14B1
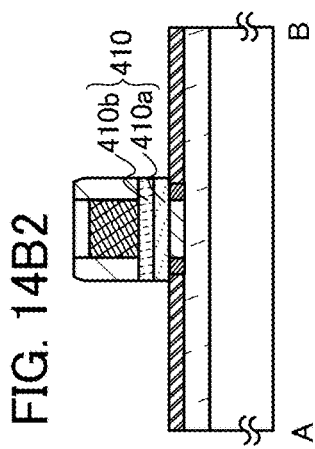 FIG. 14B2
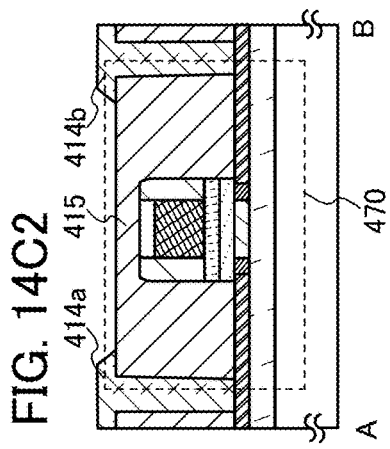 FIG. 14B3
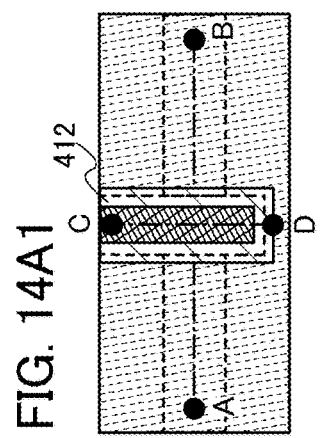 FIG. 14C1
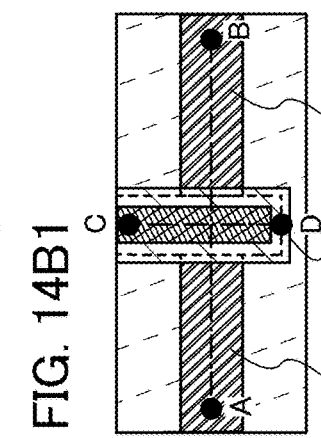 FIG. 14C2
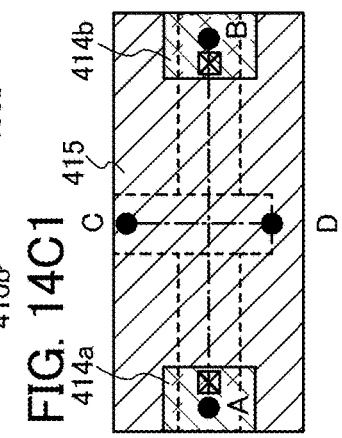 FIG. 14C3

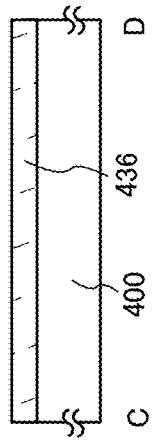
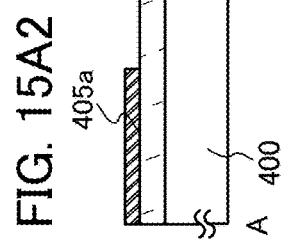
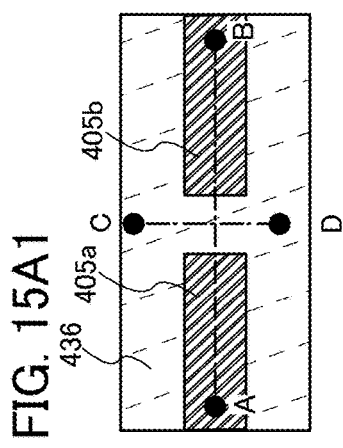
FIG. 15A1  FIG. 15A2  FIG. 15A3
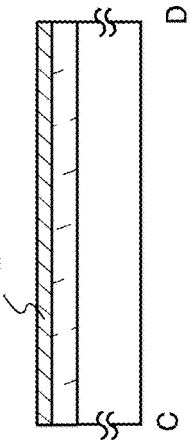
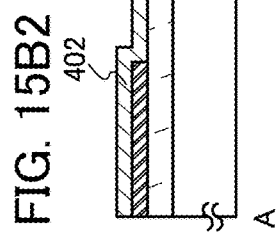
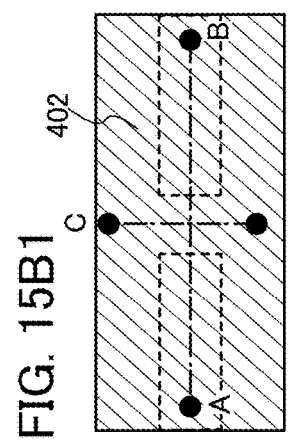
FIG. 15B1  FIG. 15B2  FIG. 15B3
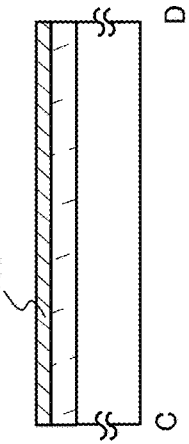
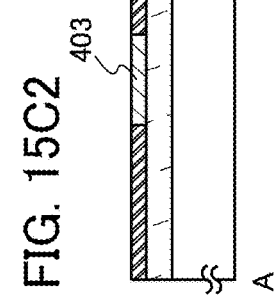
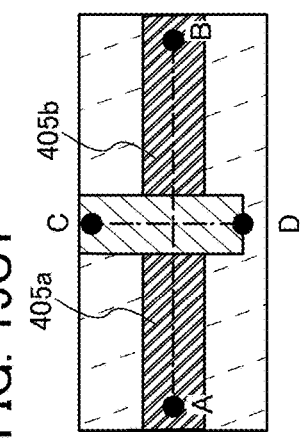
FIG. 15C1  FIG. 15C2  FIG. 15C3

Model A   Model B   Model C

In: ● Ga: ○ Zn: ● O: ●

FIG. 29A Model A
FIG. 29B Model B
FIG. 29C Model C
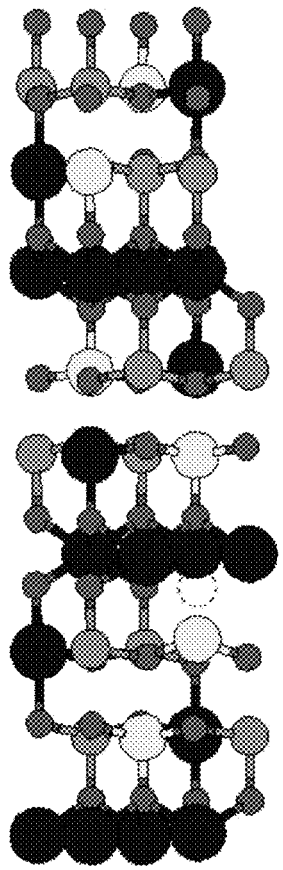
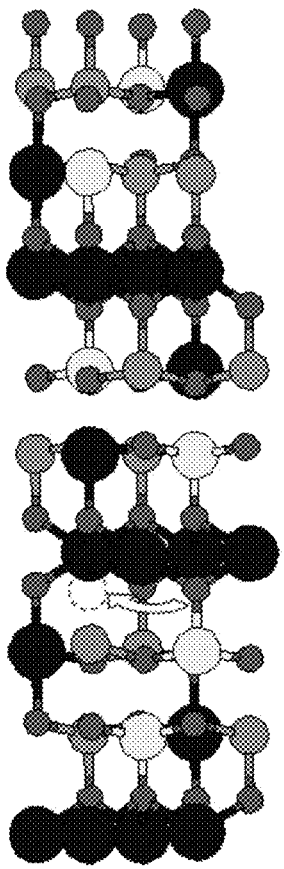
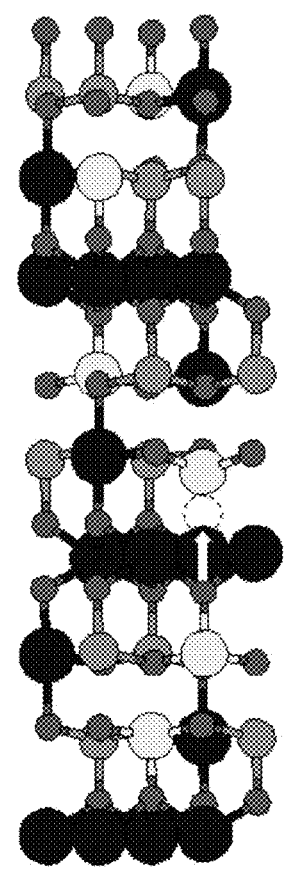
In: ● Ga: ○ Zn: ● O: ●

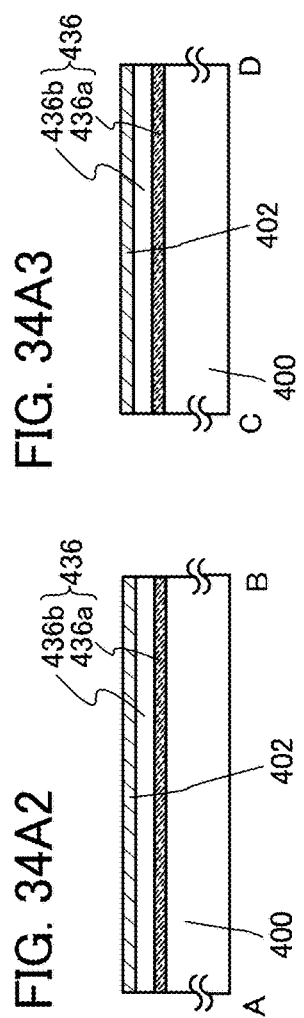
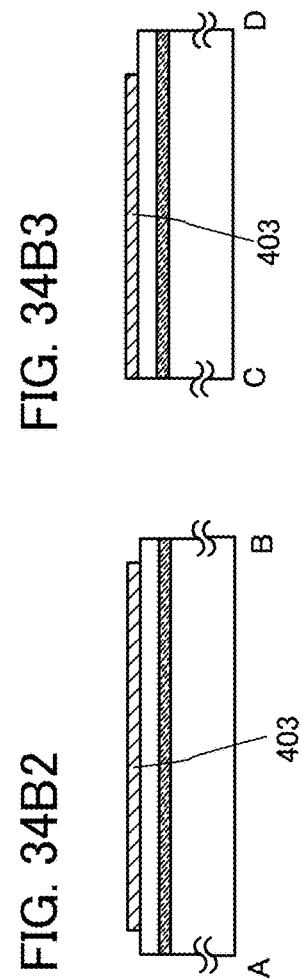
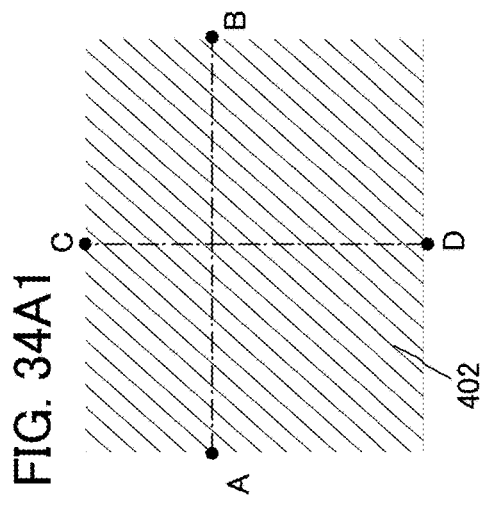
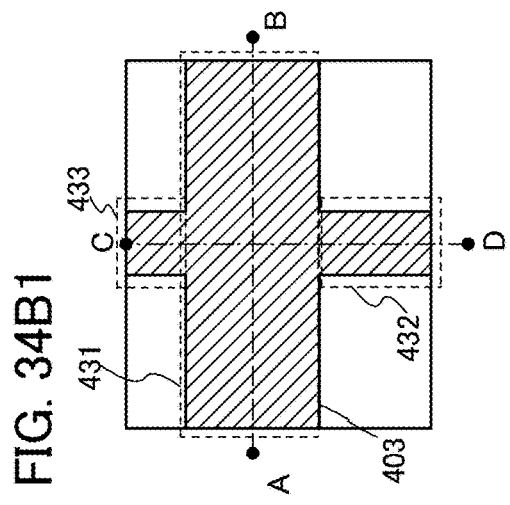

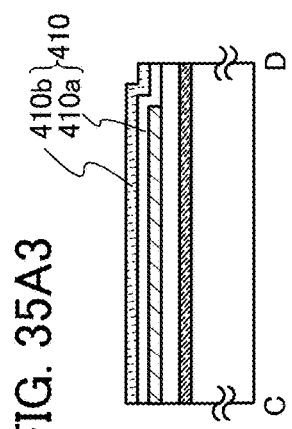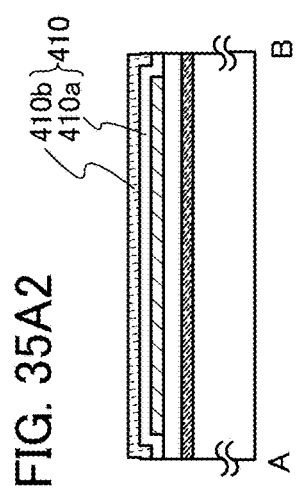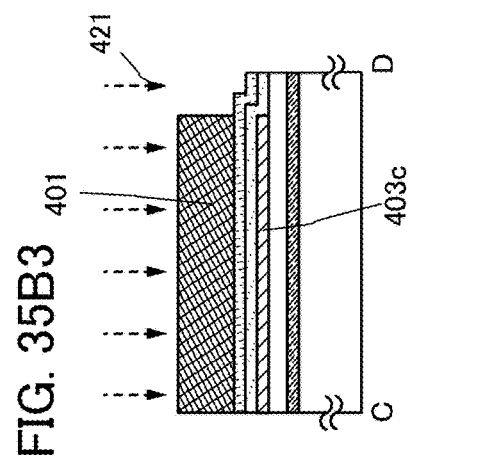
FIG. 35A1  FIG. 35A2  FIG. 35A3
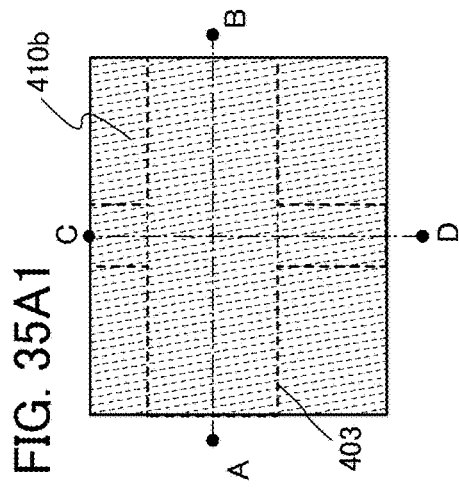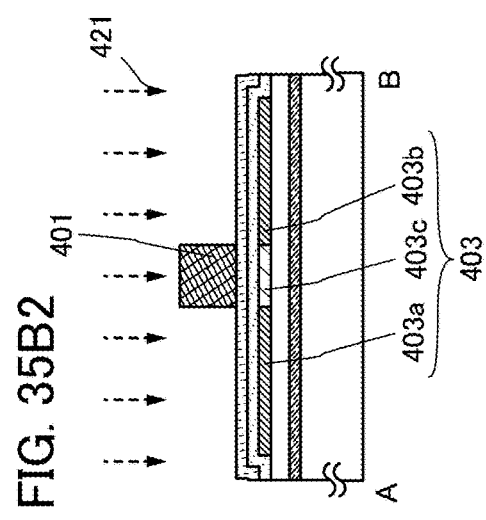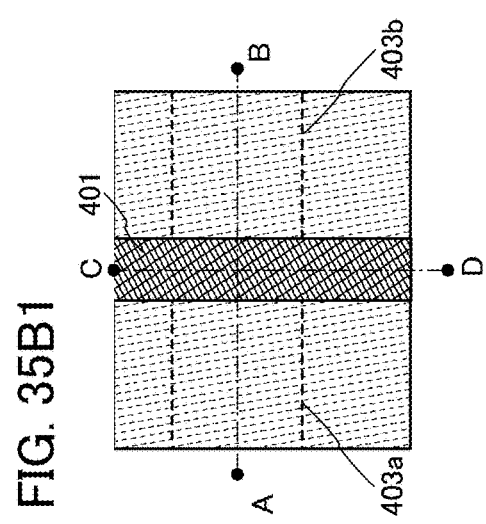
FIG. 35B1  FIG. 35B2  FIG. 35B3

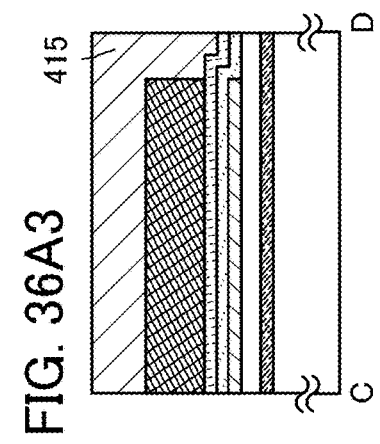
FIG. 36A1
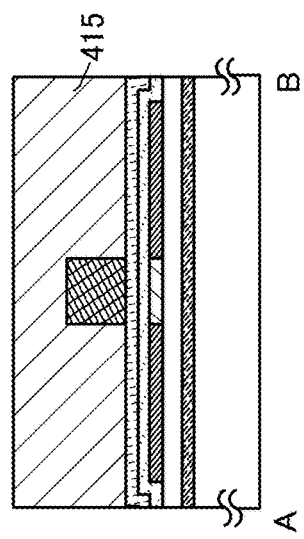
FIG. 36A2
FIG. 36A3
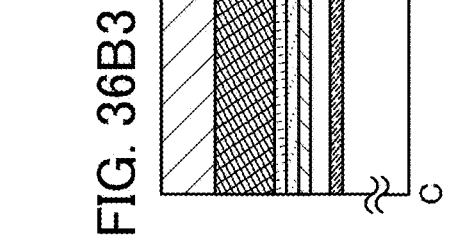
FIG. 36B1
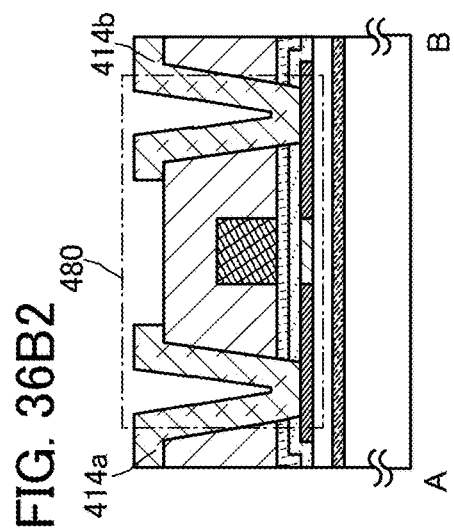
FIG. 36B2
FIG. 36B3
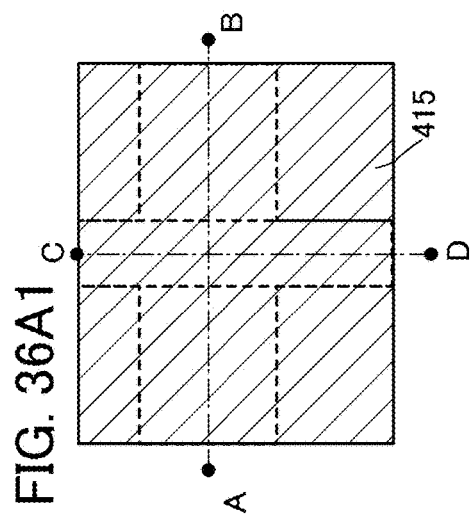
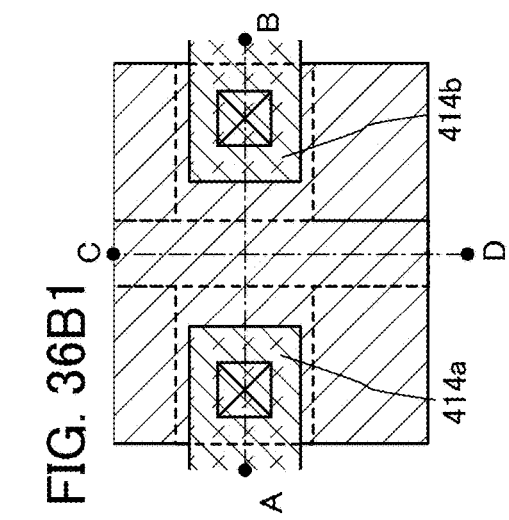

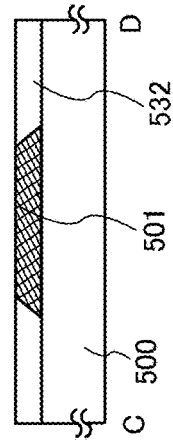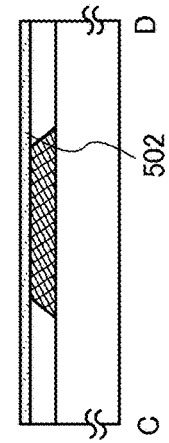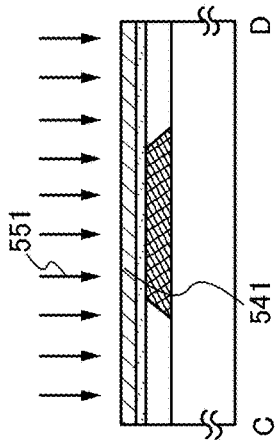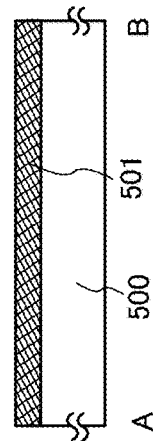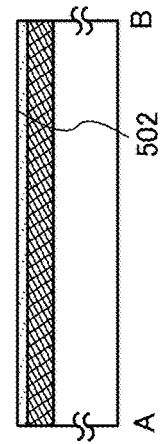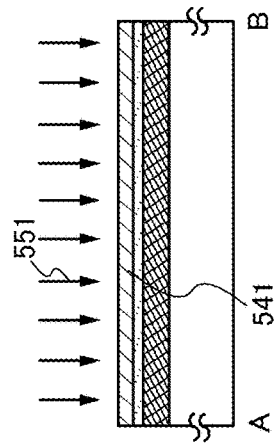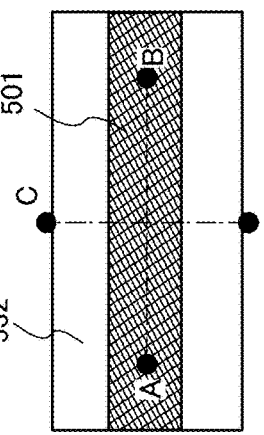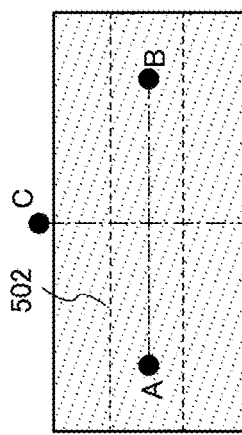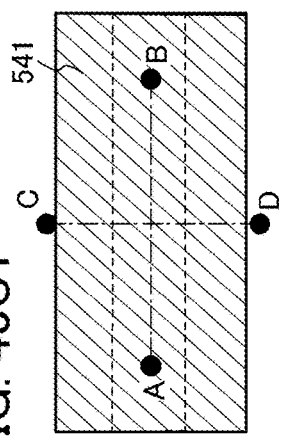

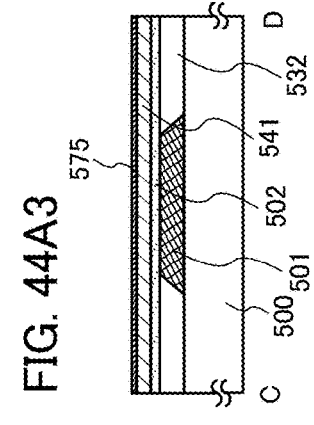
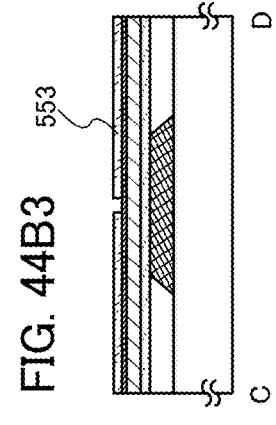
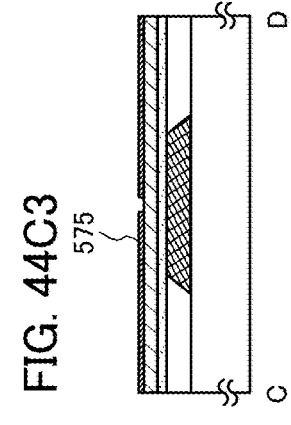
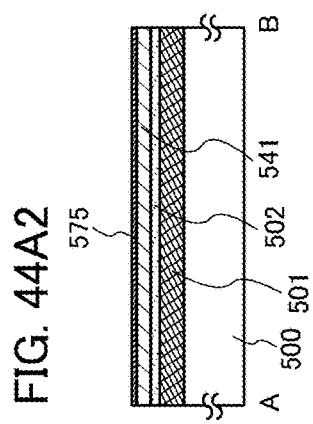
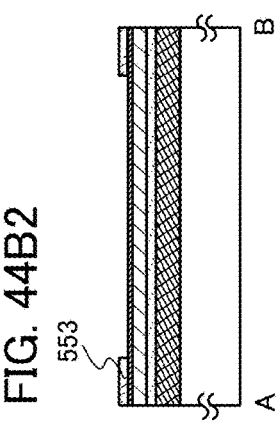
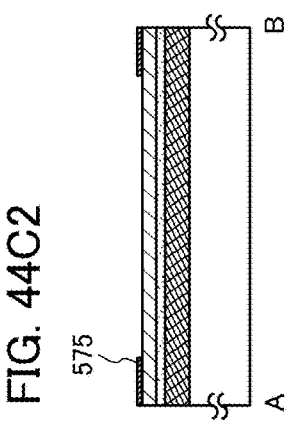
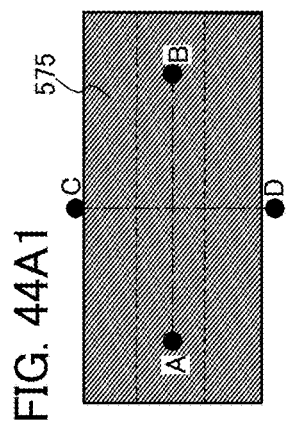
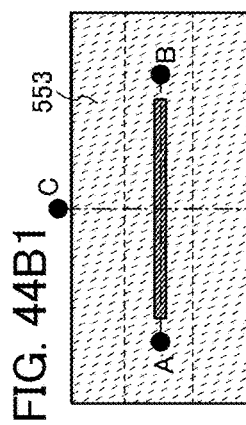
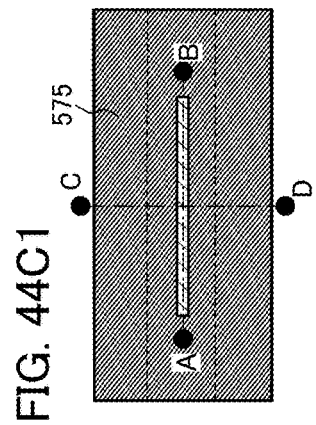

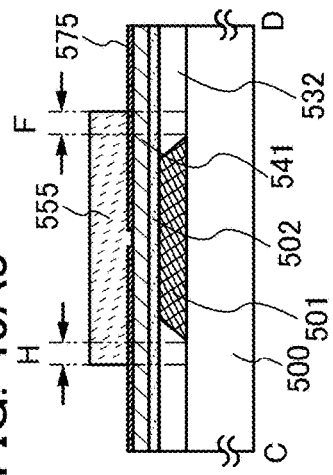
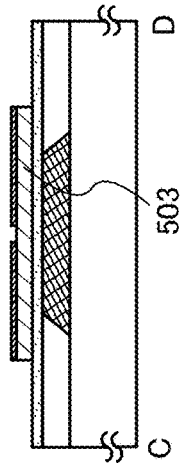
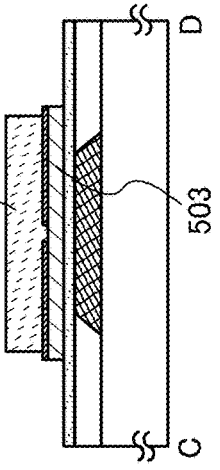
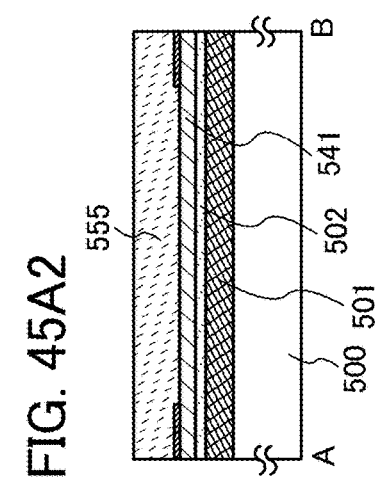
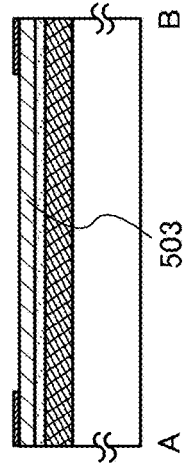
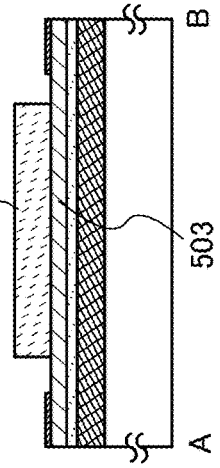
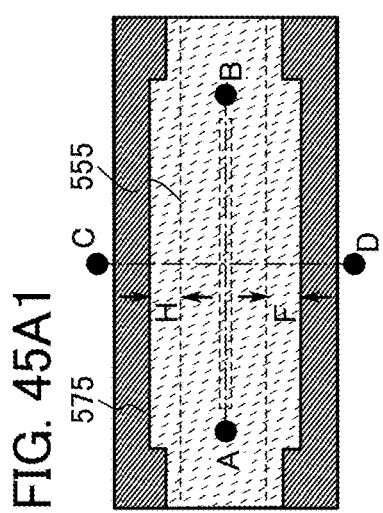
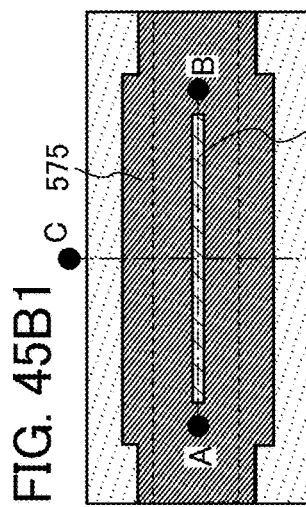
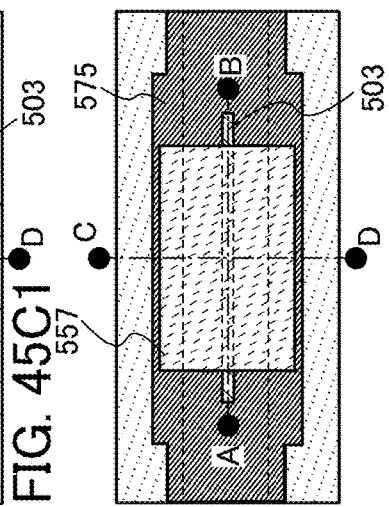

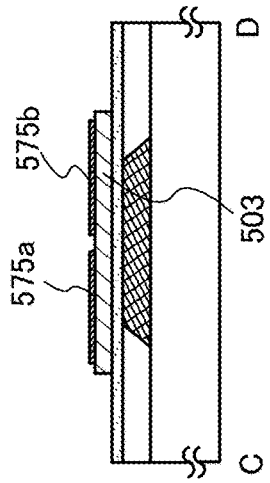
FIG. 46A3
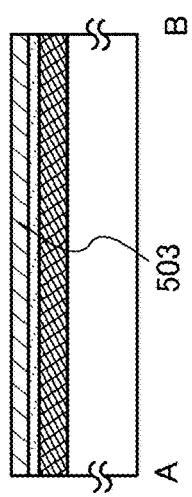
FIG. 46A2
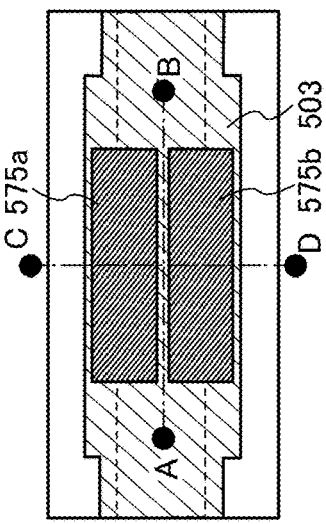
FIG. 46A1
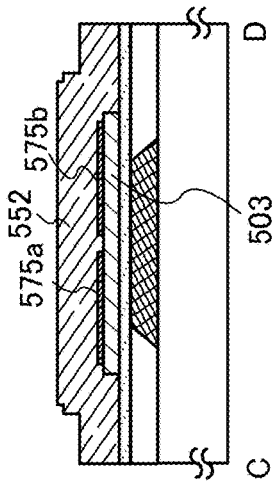
FIG. 46B3
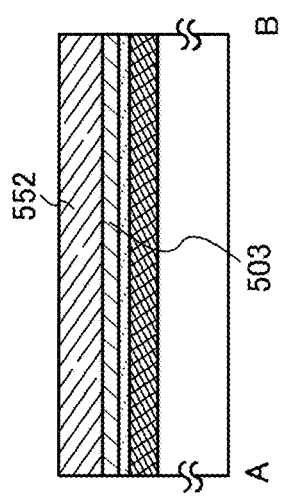
FIG. 46B2
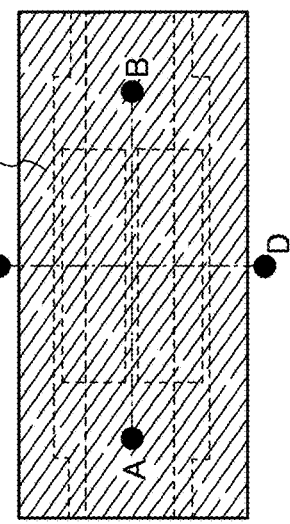
FIG. 46B1

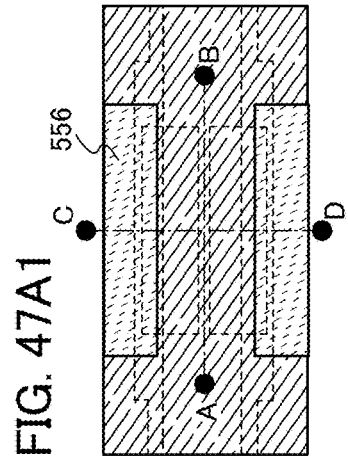
FIG. 47A1
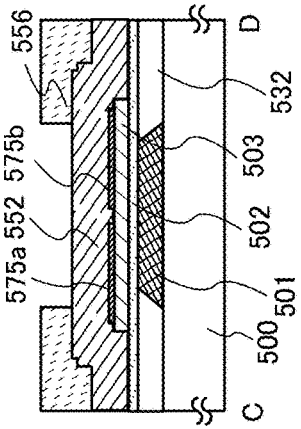
FIG. 47A2
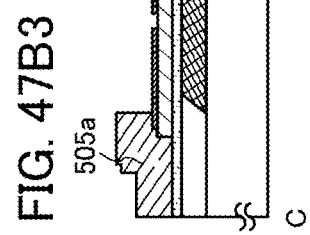
FIG. 47A3
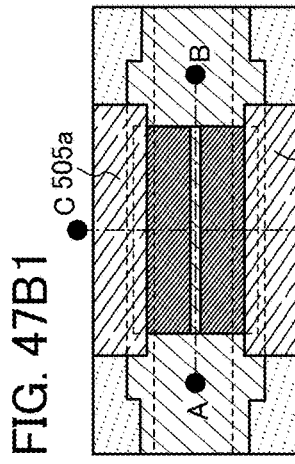
FIG. 47B1
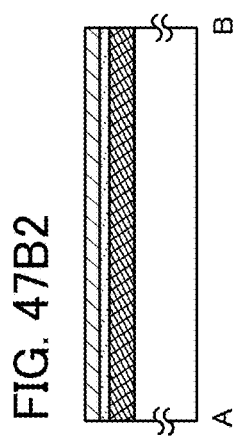
FIG. 47B2
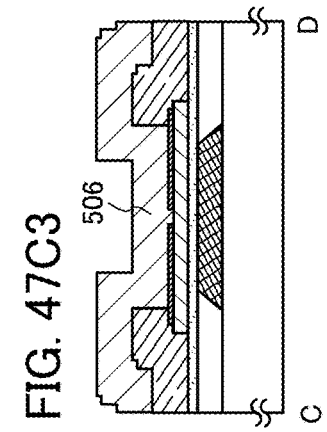
FIG. 47B3
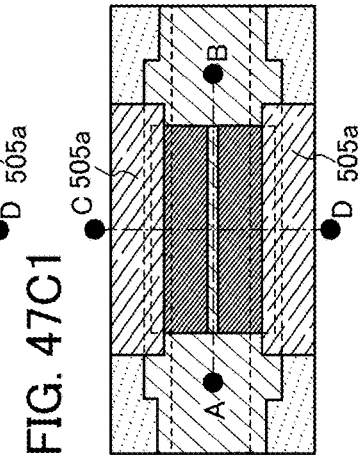
FIG. 47C1
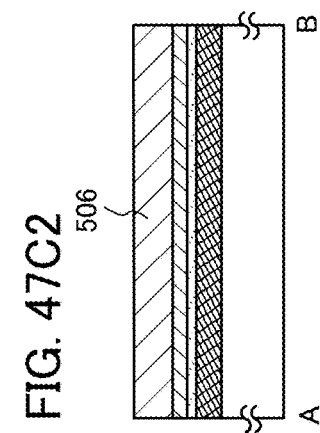
FIG. 47C2
FIG. 47C3

SEMICONDUCTOR DEVICE

BACKGROUND OF THE INVENTION

1. Field of the Invention

The present invention relates to semiconductor devices.

In this specification, a semiconductor device generally means a device which can function by utilizing semiconductor characteristics, and an electrooptic device, a semiconductor circuit, and electronic devices are all semiconductor devices.

2. Description of the Related Art

Attention has been focused on a technique for forming a transistor (also referred to as a thin film transistor (TFT)) using a semiconductor thin film formed over a substrate having an insulating surface. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

Electrical characteristics of a transistor in which a channel is formed in an oxide semiconductor film might change owing to processing conditions or heat treatment conditions. This change is considered to be due to desorption of oxygen (O) from the oxide semiconductor film during a step for forming the oxide semiconductor film, for example. Oxygen (O) has been found to be likely to desorb from a side surface (end surface) of the oxide semiconductor film. In other words, it has been found that in the transistor in which the channel is formed in the oxide semiconductor film, a region in the vicinity of the side surface of the oxide semiconductor film becomes a low-resistance region, and a parasitic channel of the transistor is likely to be formed in the region. Further, the parasitic channel has caused a problem of abnormal electrical characteristics of the transistor. For example, in a curve showing current-voltage characteristics of the transistor, current rises at a gate voltage lower than the original threshold voltage and is once stabilized, then rising again at the original threshold voltage; thus, the curve has a hump.

In view of the above problem, it is an object to provide a transistor which includes an oxide semiconductor and has favorable transistor characteristics. Further, it is an object to provide a highly reliable semiconductor device which includes a transistor including an oxide semiconductor.

According to one embodiment of the present invention, a semiconductor device includes an oxide semiconductor film which is etched so as to have a cross shape having different lengths in the channel length direction or to have a larger length than a source electrode and a drain electrode in the channel width direction. Specifically, any of the following structures is used.

One embodiment of the present invention is a semiconductor device including an oxide semiconductor film which is formed over an insulating surface and includes a first region, and a second region and a third region with a part of the first region interposed therebetween; a gate insulating film formed over the oxide semiconductor film; a gate electrode formed over the gate insulating film to overlap with at least a part of each of the first region, the second region, and the third region; and a source electrode and a drain electrode which are in contact with the oxide semiconductor film. Further, the first region includes a channel formation region overlapping with the gate electrode, and a first low-resistance region and a second low-resistance region which are in contact with the channel formation region; and the length of each of the second region and the third region in the channel length direction is smaller than the length of the first region in the channel length direction.

Another embodiment of the present invention is a semiconductor device including an oxide semiconductor film which is formed over an insulating surface and includes a first region, and a second region and a third region with a part of the first region interposed therebetween; a gate insulating film formed over the oxide semiconductor film; a gate electrode formed over the gate insulating film to overlap with at least a part of each of the first region, the second region, and the third region; a sidewall insulating film covering a side surface and a top surface of the gate electrode; a source electrode and a drain electrode which are in contact with the oxide semiconductor film, a side surface of the gate insulating film, and a side surface of the sidewall insulating film; and an interlayer insulating film formed over the source electrode and the drain electrode. Further, the first region includes a channel formation region overlapping with the gate electrode, and a first low-resistance region and a second low-resistance region which are in contact with the channel formation region; and the length of each of the second region and the third region in the channel length direction is smaller than the length of the first region in the channel length direction.

In any of the above structures, it is preferable that the sidewall insulating film be an insulating film including excessive oxygen.

In any of the above structures, it is preferable that a base insulating film have the insulating surface and be a stacked-layer film of a first oxygen supplying film and a first barrier film in this order from the oxide semiconductor film side.

In any of the above structures, it is preferable that the gate insulating film be a stacked-layer film of a second oxygen supplying film and a second barrier film in this order from the oxide semiconductor film side.

In any of the above structures, it is preferable that the length of the outline of the second region of the oxide semiconductor film be larger than the length of the first region of the oxide semiconductor film in the channel width direction.

In any of the above structures, it is preferable that the length of the outline of the third region of the oxide semiconductor film be larger than the length of the first region of the oxide semiconductor film in the channel width direction.

In any of the above structures, it is preferable that the length of the outline of the second region of the oxide semiconductor film be three times or more as large as the length of the first region in the channel width direction.

Another embodiment of the present invention is a semiconductor device including a gate electrode formed over an insulating film; a first gate insulating film and a second gate insulating film formed over the gate electrode; an oxide semiconductor film which is formed over the gate electrode with the first gate insulating film and the second gate insulating film interposed therebetween, and includes a channel region, a first region and a second region with the channel region interposed therebetween, which are in contact with the channel region, and a third region and a fourth region with the channel region, the first region, and the second region interposed therebetween, which are in contact with the channel region; a source electrode formed in contact with the first region; a drain electrode formed in contact with the second region; and a first insulating film and a second insulating film formed over the source electrode, the drain electrode, and the oxide semiconductor film. Further, the oxide semiconductor film is formed by stacking a second oxide semiconductor film over a first oxide semiconductor film; each of the first region, the second region, the third region, and the fourth region overlaps with at least the gate electrode; the sum of the channel length, the length of the first region in the channel length direction, and the length of the second region in the channel length direction is larger than the length of the gate electrode in the channel length direction; the sum of the channel width, the length of the third region in the channel width direction, and the length of the fourth region in the channel width direction is larger than the length of any of the first region and the second region in the channel width direction; the length of the third region in the channel width direction is larger than the channel length; and the length of the fourth region in the channel width direction is larger than the channel length.

In the above structure, it is preferable that the source electrode includes a stack of a first barrier layer and a first low-resistance material layer formed over the first barrier layer, and the gate electrode includes a stack of a second barrier layer and a second low-resistance material layer formed over the second barrier layer.

In any of the above structures, it is preferable that the area where the oxide semiconductor film is in contact with the source electrode is equal to the area of the first region, and the area where the oxide semiconductor film is in contact with the drain electrode is equal to the area of the second region.

In any of the above structures, it is preferable that the thickness of the first insulating film be larger than the thickness of the second insulating film.

In any of the above structures, it is preferable that the channel length be smaller than 50 nm.

In any of the above structures, it is preferable that the first oxide semiconductor film and the second oxide semiconductor film include a metal oxide having a different composition.

According to one embodiment of the present invention, a transistor includes an oxide semiconductor film which is etched so as to have a cross shape having different lengths in the channel length direction or to have a larger length than a source electrode and a drain electrode in the channel width direction. Thus, it is possible to reduce the probability of electrical connection between the source electrode and the drain electrode of the transistor through a region (a region in which the resistance is lowered by desorption of oxygen (O) or the like) in the vicinity of a side surface (end surface) of the oxide semiconductor film. That is, it is possible to provide a transistor which has favorable transistor characteristics and includes an oxide semiconductor, and to provide a highly reliable semiconductor device which includes the transistor including the oxide semiconductor.

BRIEF DESCRIPTION OF THE DRAWINGS

In the accompanying drawings:

FIGS. 2A1 to 2A3, 2B1 to 2B3, and 2C1 to 2C3 illustrate one embodiment of a method for manufacturing a semiconductor device;

FIGS. 3A1 to 3A3, 3B1 to 3B3, and 3C1 to 3C3 illustrate one embodiment of a method for manufacturing a semiconductor device;

FIGS. 4A1 to 4A3, 4B1 to 4B3, and 4C1 to 4C3 illustrate one embodiment of a method for manufacturing a semiconductor device;

FIGS. 5A1 to 5A3 and 5B1 to 5B3 illustrate one embodiment of a method for manufacturing a semiconductor device;

FIGS. 7A1 to 7A3, 7B1 to 7B3, and 7C1 to 7C3 illustrate one embodiment of a method for manufacturing a semiconductor device;

FIGS. 8A1 to 8A3, 8B1 to 8B3, and 8C1 to 8C3 illustrate one embodiment of a method for manufacturing a semiconductor device;

FIGS. 9A1 to 9A3, 9B1 to 9B3, and 9C1 to 9C3 illustrate one embodiment of a method for manufacturing a semiconductor device;

FIGS. 10A1 to 10A3 and 10B1 to 10B3 illustrate one embodiment of a method for manufacturing a semiconductor device;

FIGS. 12A1 to 12A3, 12B1 to 12B3, and 12C1 to 12C3 illustrate one embodiment of a method for manufacturing a semiconductor device;

FIGS. 13A1 to 13A3, 13B1 to 13B3, and 13C1 to 13C3 illustrate one embodiment of a method for manufacturing a semiconductor device;

FIGS. 14A1 to 14A3, 14B1 to 14B3, and 14C1 to 14C3 illustrate one embodiment of a method for manufacturing a semiconductor device;

FIGS. 15A1 to 15A3, 15B1 to 15B3, and 15C1 to 15C3 illustrate one embodiment of a method for manufacturing a semiconductor device;

FIGS. 29A to 29C are model diagrams used in computation of oxygen vacancy transfer;

FIGS. 34A1 to 34A3 and 34B1 to 34B3 illustrate one embodiment of a method for manufacturing a semiconductor device;

FIGS. 35A1 to 35A3 and 35B1 to 35B3 illustrate one embodiment of a method for manufacturing a semiconductor device;

FIGS. 36A1 to 36A3 and 36B1 to 36B3 illustrate one embodiment of a method for manufacturing a semiconductor device;

FIGS. 43A1 to 43A3, 43B1 to 43B3, and 43C1 to 43C3 illustrate one embodiment of a method for manufacturing a semiconductor device;

FIGS. 44A1 to 44A3, 44B1 to 44B3, and 44C1 to 44C3 illustrate one embodiment of a method for manufacturing a semiconductor device;

FIGS. 45A1 to 45A3, 45B1 to 45B3, and 45C1 to 45C3 illustrate one embodiment of a method for manufacturing a semiconductor device;

FIGS. 46A1 to 46A3 and 46B1 to 46B3 illustrate one embodiment of a method for manufacturing a semiconductor device; and FIGS. 47A1 to 47A3, 47B1 to 47B3, and 47C1 to 47C3 illustrate one embodiment of a method for manufacturing a semiconductor device.

DETAILED DESCRIPTION OF THE INVENTION

Figure 1A:
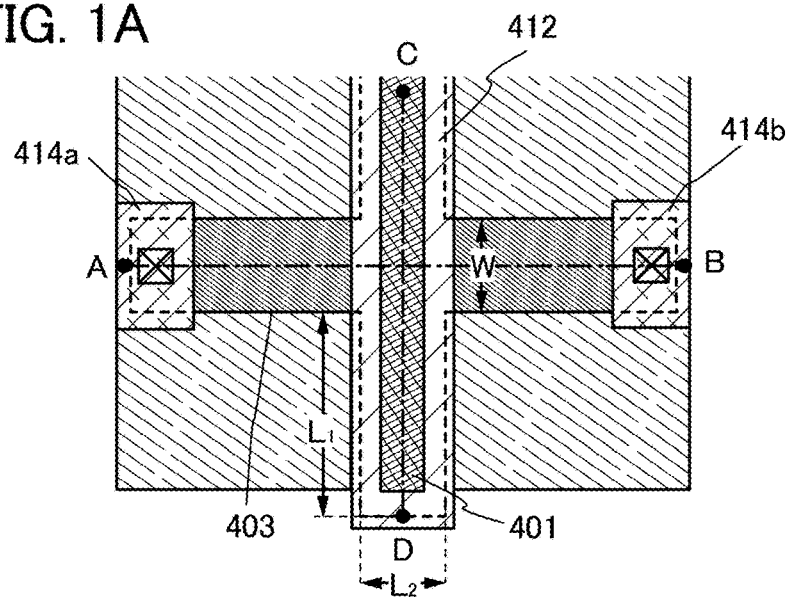
FIGS. 1A to 1C are a plan view and cross-sectional views illustrating one embodiment of a semiconductor device.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the invention. Accordingly, the invention should not be construed as being limited to the description of the embodiments below. In describing structures of the invention with reference to the drawings, the same reference numerals are used in common for the same portions in different drawings. The same hatching pattern is applied to similar parts, and the similar parts are not especially denoted by reference numerals in some cases. In addition, for convenience, an insulating film such as a gate insulating film is not illustrated in a top view in some cases.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of different conductivity type is used or when the direction of current flowing is changed in circuit operation, for example. Therefore, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are an electrode and a wiring.

Furthermore, hereinafter, ordinal numbers, such as "first" and "second," are used merely for convenience, and the present invention is not limited to the numbers.

Embodiment 1

Figure 1B:
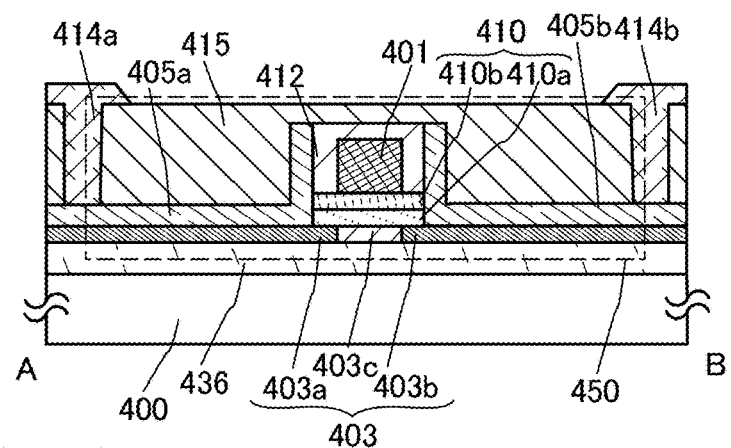
Figure 1C:
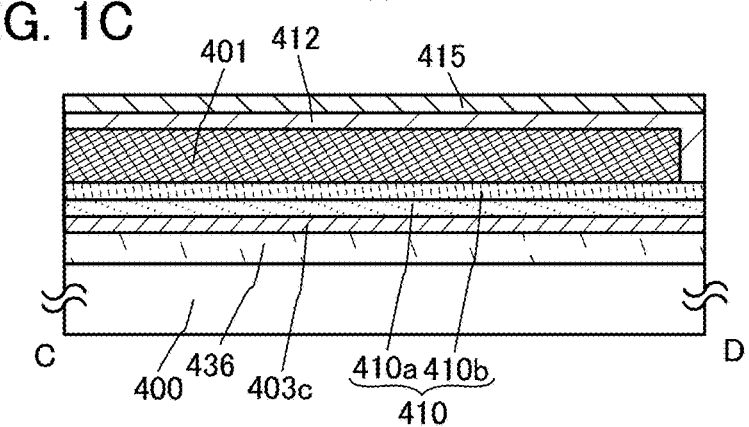

In this embodiment, one embodiment of a semiconductor device will be described with reference to FIGS. 1A to 1C. FIG. 1A is a top view of a transistor included in the semiconductor device, FIG. 1B is a cross-sectional view taken along dashed-dotted line A-B (channel length direction) in FIG. 1A, and FIG. 1C is a cross-sectional view taken along dashed-dotted line C-D in FIG. 1A. Note that some components illustrated in FIG. 1B or 1C are not illustrated in FIG. 1A for simplicity of the drawing.

A transistor 450 illustrated in FIGS. 1A to 1C includes, over a substrate 400 having an insulating surface and provided with a base insulating film 436, an oxide semiconductor film 403 including a channel formation region 403c, a source region 403a, and a drain region 403b; a gate insulating film 410; a gate electrode 401; a sidewall insulating film 412 along side surfaces and a top surface of the gate electrode 401; a source electrode 405a overlapping with the source region 403a; a drain electrode 405b overlapping with the drain region 403b; an interlayer insulating film 415 over the source electrode 405a and the drain electrode 405b; and a wiring layer 414a and a wiring layer 414b electrically connected to the source electrode 405a and the drain electrode 405b, respectively.

Figure 16A:
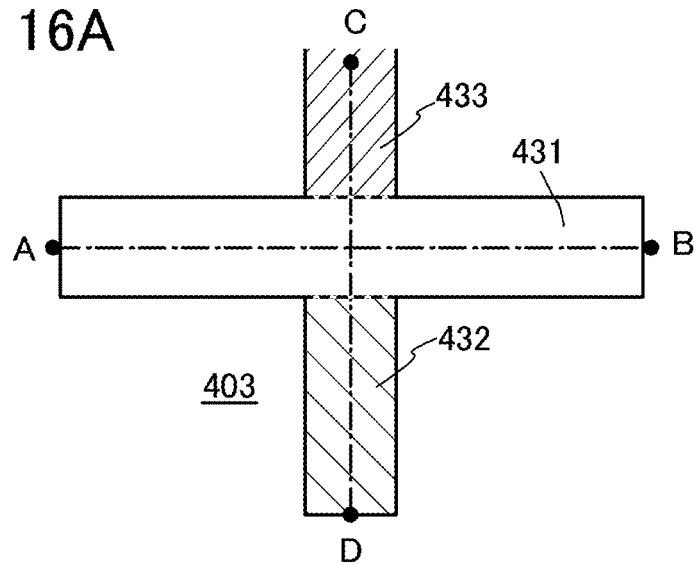
FIGS. 16A and 16B illustrate an oxide semiconductor film.

As illustrated in FIG. 16A, the oxide semiconductor film 403 includes a first region 431, and a second region 432 and a third region 433 with part of the first region 431 interposed therebetween. The gate electrode 401 is provided so as to at least partly overlap with each of the first region 431 to the third region 433. Note that the oxide semiconductor film 403 illustrated in FIG. 16A has a different hatching pattern for simplicity of the drawing.

The first region 431 includes the channel formation region 403c overlapping with the gate electrode 401, and a pair of low-resistance regions (also referred to as the source region 403a and the drain region 403b because the low-resistance regions serve as the source region and the drain region) with the channel formation region 403c interposed therebetween. Further, each of the low-resistance regions is in contact with the channel formation region 403c and has a lower resistance than the channel formation region 403c. The length of each of the second region 432 and the third region 433 in the channel length direction is smaller than that of the first region 431 in the channel length direction.

A dopant is added to the oxide semiconductor film 403 with the use of the gate electrode 401 as a mask, whereby the source region 403a and the drain region 403b are formed with the channel formation region 403c interposed therebetween in the oxide semiconductor film 403. Further, each of the source region 403a and the drain region 403b is a low-resistance region having a lower resistance than the channel formation region 403c and containing the dopant. In this case, resist masks are formed over the second region 432 and the third region 433 of the oxide semiconductor film 403 so as to prevent the addition of the dopant thereto. In this manner, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced.

Further, the length of the outline of each of the second region 432 and the third region 433 of the oxide semiconductor film 403 (total length of double of length $L_1$ and length $L_2$, i.e., $2L_1+L_2$, in FIG. 1A) is larger than the length of the first region 431 in the channel width direction (length W in FIG. 1A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 1A; however, by increasing the length of the outline of each of the second region 432 and the third region 433 of the oxide semiconductor film 403, the leakage path becomes longer and resistance components at the outline increase. Thus, formation of a parasitic channel and an increase in leakage current can be suppressed at an end portion of the oxide semiconductor film 403 when the transistor is in an off-state. Even if oxygen desorbs from the end portion of the oxide semiconductor film 403, the end portion of the oxide semiconductor film 403 is apart from the channel formation region 403c interposed between the source electrode 405a and the drain electrode 405b; thus, an influence on electrical characteristics of the transistor 450 can be reduced. Accordingly, electrical characteristics of the transistor 450 can be prevented from degrading and be favorable.

The dopant is an impurity which changes the conductivity of the oxide semiconductor film 403. Examples of a method for adding the dopant include an ion implantation method, an ion doping method, and a plasma immersion ion implantation method.

With the oxide semiconductor film 403 including the source region 403a and the drain region 403b with the channel formation region 403c interposed therebetween in the channel length direction, on-state characteristics (e.g., on-state current and field-effect mobility) of the transistor 450 are increased, which enables high-speed operation and high-speed response of the transistor 450.

An example of a method for manufacturing the semiconductor device including the transistor 450 will be described below.

FIG. 2A1 is a top view illustrating a step for manufacturing the transistor, FIG. 2A2 is a cross-sectional view taken along dashed-dotted line A-B in FIG. 2A1, and FIG. 2A3 is a cross-sectional view taken along dashed-dotted line C-D in FIG. 2A1. Note that FIGS. 2A1 to 2A3 may be collectively referred to as FIG. 2A in the following description. The same can be applied to other similar expressions in this specification.

First, the base insulating film 436 is formed over the substrate 400 having an insulating surface.

There is no particular limitation on a substrate that can be used as the substrate 400 as long as it has heat resistance high enough to withstand heat treatment performed later. For example, a single crystal semiconductor substrate or a polycrystalline semiconductor substrate of silicon, silicon carbide, or the like, a compound semiconductor substrate of silicon germanium or the like, an SOI (silicon on insulator) substrate, or the like can be used. Alternatively, a glass substrate such as a barium borosilicate glass substrate or an aluminoborosilicate glass substrate, a ceramic substrate, a quartz substrate, a sapphire substrate, or the like can be used.

The semiconductor device may be manufactured using a flexible substrate as the substrate 400. To manufacture a flexible semiconductor device, the transistor 450 including the oxide semiconductor film 403 may be directly formed over a flexible substrate. Alternatively, the transistor 450 including the oxide semiconductor film 403 may be formed over another manufacturing substrate, and then may be separated and transferred to a flexible substrate. Note that in order to separate the transistor from the manufacturing substrate and transfer it to the flexible substrate, a separation layer is preferably provided between the manufacturing substrate and the transistor 450 including the oxide semiconductor film 403.

The substrate 400 may be subjected to heat treatment. For example, the heat treatment may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to 1 hour.

The base insulating film 436 can be formed using an oxide insulating film formed using silicon oxide, silicon oxynitride, aluminum oxide, aluminum oxynitride, hafnium oxide, or gallium oxide, or a mixed material thereof.

Further, a nitride insulating film may be provided between the base insulating film 436 and the substrate 400 as a barrier film for preventing impurities from entering from the substrate 400 side. The nitride insulating film can be formed using silicon nitride, silicon nitride oxide, aluminum nitride, or aluminum nitride oxide, or a mixed material thereof.

As the oxide insulating film of the base insulating film 436, an insulating film (oxygen supplying film) from which oxygen is released by heat treatment is preferably used.

Note that "oxygen is released by heat treatment" described above refers to a released amount of oxygen when converted into oxygen atoms in thermal desorption spectroscopy (TDS) analysis is greater than or equal to $1.0 \times 10^{19}$ atoms/cm$^3$, preferably greater than or equal to $3.0 \times 10^{19}$ atoms/cm$^3$, further preferably greater than or equal to $1.0 \times 10^{20}$ atoms/cm$^3$, still further preferably greater than or equal to $3.0 \times 10^{20}$ atoms/cm$^3$.

Here, a method in which the released amount of oxygen is measured by being converted into oxygen atoms using the TDS analysis will now be described.

The released amount of gas in the TDS analysis is proportional to the integral value of a spectrum. Therefore, the released amount of gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula (1) with the TDS analysis results of a silicon wafer containing hydrogen at a predetermined density which is the standard sample and the TDS analysis results of the insulating film. Here, all spectra having a mass-to-charge ratio (M/z) of 32 which are obtained by the TDS analysis are assumed to originate from an oxygen molecule. CH$_3$OH, which is given as a compound where M/z=32, is not taken into consideration on the assumption that it is unlikely to be present. Further, an oxygen molecule including an oxygen atom where M/z=17 or M/z=18 which is an isotope of an oxygen atom is not taken into consideration either because the proportion of such a molecule in the natural world is minimal.

[FORMULA 1]

$$N_{O2} = \frac{N_{H2}}{S_{H2}} \times S_{O2} \times \alpha \tag{1}$$

$N_{H2}$ is the value obtained by conversion of the number of hydrogen molecules desorbed from the standard sample into densities. $S_{H2}$ is the integral value of a spectrum when the standard sample is subjected to the TDS analysis. Here, the reference value of the standard sample is set to $N_{H2}/S_{H2}$. $S_{O2}$ is the integral value of a spectrum when the insulating film is subjected to the TDS analysis. $\alpha$ is a coefficient which influences spectrum intensity in the TDS analysis. Refer to Japanese Published Patent Application No. H06-275697 for details of Formula 1. Note that the released amount of oxygen from the above insulating film is measured with a thermal desorption spectrometer produced by ESCO Ltd., EMD-WA1000S/W, using a silicon wafer containing hydrogen atoms at $1 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The released amount of oxygen when converted into oxygen atoms is twice the number of the released oxygen molecules.

Further, in the case where the hydrogen concentration in an insulating film containing excessive oxygen (insulating film containing oxygen at an amount exceeding the stoichiometry) is $7.2 \times 10^{20}$ atoms/cm$^3$ or higher, variations in initial characteristics of transistors are increased, a channel length dependence of electrical characteristics of a transistor is increased, and a transistor is significantly degraded in the BT stress test; therefore, the hydrogen concentration in the insulating film containing excessive oxygen is preferably lower than $7.2 \times 10^{20}$ atoms/cm$^3$. In other words, the hydrogen concentration in the oxide semiconductor film is preferably lower than or equal to $5 \times 10^{19}$ atoms/cm$^3$, and the hydrogen concentration in the insulating film containing excessive oxygen is preferably lower than $7.2 \times 10^{20}$ atoms/cm$^3$.

In addition, a blocking film (such as an AlO$_x$ film) for preventing oxygen from being released from the oxide semiconductor film is preferably provided so as to cover the oxide semiconductor film and to be positioned outside the insulating film containing excessive oxygen.

The oxide semiconductor film is covered with the insulating film containing excessive oxygen or a blocking film, so that the oxide semiconductor film can be in a state in which oxygen the amount of which is approximately the same as the stoichiometry is contained or a supersaturated state in which oxygen which exceeds the stoichiometry is contained. For example, in the case where the stoichiometry of the oxide semiconductor film is In:Ga:Zn:O=1:1:1:4 [atomic ratio], the ratio of oxygen atoms in the IGZO is larger than 4.

Note that in this specification, "oxynitride" such as silicon oxynitride contains more oxygen than nitrogen.

Further, in this specification, "nitride oxide" such as silicon nitride oxide contains more nitrogen than oxygen.

Next, the oxide semiconductor film 403 is formed over the base insulating film 436 (see FIG. 2A).

The oxide semiconductor film 403 can be deposited by a sputtering method, a molecular beam epitaxy (MBE) method, a CVD method, a pulsed laser deposition method, an atomic layer deposition (ALD) method, or the like. The oxide semiconductor film 403 may be deposited with the use of a sputtering apparatus which performs deposition in the state where top surfaces of a plurality of substrates are substantially perpendicular to a top surface of a sputtering target. The oxide semiconductor film 403 is subjected to etching treatment so as to have a cross shape. For easy understanding, the oxide semiconductor film 403 is divided to three regions: the first region 431, the second region 432, and the third region 433. The first region 431 is interposed between the second region 432 and the third region 433, and the length of each of the second region 432 and the third region 433 in the channel length direction is smaller than the length of the first region 431 in the channel length direction.

In the deposition of the oxide semiconductor film 403, the concentration of hydrogen contained in the oxide semiconductor film 403 is preferably reduced. In order to reduce the concentration of hydrogen contained in the oxide semiconductor film 403, for example, in the case where a sputtering method is employed to deposit the oxide semiconductor film, oxygen, a high-purity rare gas (typically, argon) from which impurities such as hydrogen, water, a hydroxyl group, or hydride have been removed, or a mixed gas of oxygen and the rare gas is preferably used as a gas supplied to a deposition chamber of a sputtering apparatus.

The oxide semiconductor film 403 is formed in such a manner that a gas from which hydrogen and moisture have been removed is introduced into a deposition chamber while moisture remaining in the deposition chamber is removed, whereby the concentration of hydrogen in the deposited oxide semiconductor film 403 can be reduced. In order to remove moisture remaining in the deposition chamber, an entrapment vacuum pump such as a cryopump, an ion pump, or a titanium sublimation pump is preferably used. The exhaustion unit may be a turbo molecular pump provided with a cold trap. A cryopump has a high capability in removing a compound containing a hydrogen atom, such as water ($H_2O$) (preferably, also a compound containing a carbon atom), and the like; therefore, the concentration of impurities contained in the oxide semiconductor film 403 deposited in the deposition chamber which is exhausted with a cryopump can be reduced.

To deposit the oxide semiconductor film 403 by a sputtering method, the relative density of a metal oxide target that is used for depositing the oxide semiconductor film 403 is higher than or equal to 90% and lower than or equal to 100%, preferably higher than or equal to 95% and lower than or equal to 100%. With the use of a metal oxide target with a high relative density, the deposited oxide semiconductor film 403 can be dense.

As a material of the oxide semiconductor film 403, for example, an In-M-Zn—O-based material may be used. Here, a metal element M is an element whose bond energy with oxygen is higher than that of In and that of Zn. Alternatively, M is an element which has a function of suppressing desorption of oxygen from the In-M-Zn—O-based material. Owing to the effect of the metal element M, generation of oxygen vacancies in the oxide semiconductor film is suppressed. Thus, change in electrical characteristics of the transistor, which is caused by oxygen vacancies, can be reduced; accordingly, a highly reliable transistor can be obtained.

The metal element M can be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or HE The metal element M can be formed using one or more elements selected from the above elements. Further, Si or Ge can be used instead of the metal element M.

Here, in an oxide semiconductor including In, M, Zn, and O, the higher the concentration of In is, the higher the carrier mobility and the carrier density are. As a result, the oxide semiconductor has higher conductivity as the concentration of In is higher.

The oxide semiconductor film 403 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked-layer structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in a formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

Further, it is preferable that the CAAC-OS film be deposited by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In this case, the flat-plate-like sputtered particle or the pellet-like sputtered particle reaches a surface where the CAAC-OS film is to be deposited while maintaining its crystal state, whereby the CAAC-OS film can be deposited.

The flat-plate-like sputtered particle has an equivalent circle diameter on a plane parallel to the a-b plane of, for example, 3 nm to 10 nm, and a thickness (length in the direction perpendicular to the a-b plane) is greater than or equal to 0.7 nm and less than 1 nm. The flat-plate-like sputtered particle may have a regular triangular or regular hexagonal shape on a plane parallel to the a-b plane. Here, the term "equivalent circle diameter on a plane" refers to the diameter of a perfect circle having the same area as the plane.

To deposit the CAAC-OS film, the following conditions are preferably used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate, so that a flat plane of the sputtered particle is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

By reducing the amount of impurities entering the CAAC-OS film during its deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a gas may be reduced. Specifically, a gas whose dew point is −80° C. or lower, preferably −100° C. or lower is used.

Further, it is preferable that the proportion of oxygen in the gas be increased and the power be optimized in order to reduce plasma damage at the deposition. The proportion of oxygen in the gas is 30 vol % or higher, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. Further, the heat treatment is performed for 1 minute to 24 hours, preferably 6 minutes to 4 hours. The heat treatment may be performed in an inert atmosphere or an oxidation atmosphere. It is preferable to perform heat treatment in an inert atmosphere and then to perform heat treatment in an oxidation atmosphere. The heat treatment in an inert atmosphere can reduce the concentration of impurities in the CAAC-OS film for a short time. At the same time, the heat treatment in an inert atmosphere may generate oxygen vacancies in the CAAC-OS film. In this case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced atmosphere can reduce the concentration of impurities in the CAAC-OS film for a shorter time.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

It is preferable that the oxide semiconductor film be highly purified and hardly contain impurities such as copper, aluminum, and chlorine. As a manufacturing process of the transistor, a process in which these impurities might not be contained and attached to the surface of the oxide semiconductor film is preferably selected as appropriate. When the impurity is attached to the surface of the oxide semiconductor film, it is preferable that the oxide semiconductor film be exposed to oxalic acid or dilute hydrofluoric acid, or be subjected to plasma treatment ($N_2O$ plasma treatment or the like), whereby the impurities on the surface of the oxide semiconductor film be removed. Specifically, the concentration of copper in the oxide semiconductor film is lower than or equal to $1\times10^{18}$ atoms/cm$^3$, preferably lower than or equal to $1\times10^{17}$ atoms/cm$^3$. Further, the concentration of aluminum in the oxide semiconductor film is lower than or equal to $1\times10^{18}$ atoms/cm$^3$. Further, the concentration of chlorine in the oxide semiconductor film is lower than or equal to $2\times10^{18}$ atoms/cm$^3$.

The oxide semiconductor film is preferably in a supersaturated state in which oxygen which exceeds the stoichiometry is contained just after its deposition. For example, when an oxide semiconductor film is deposited by a sputtering method, it is preferable that the film be deposited in a gas containing a high proportion of oxygen, and it is especially preferable that the film be formed in an oxygen atmosphere (oxygen gas 100%). When the deposition is performed in the condition where the proportion of oxygen in a gas is large, particularly in a 100% oxygen gas atmosphere, a release of Zn from the film can be suppressed even at a deposition temperature higher than or equal to 300° C., for example.

The oxide semiconductor film is preferably highly purified by sufficient removal of impurities such as hydrogen or sufficient supply of oxygen to be in a supersaturated state. Specifically, the concentration of hydrogen in the oxide semiconductor film is $5\times10^{19}$ atoms/cm$^3$ or lower, preferably $5\times10^{18}$ atoms/cm$^3$ or lower, further preferably $5\times10^{17}$ atoms/cm$^3$ or lower. Note that the concentration of hydrogen in the oxide semiconductor film is measured by secondary ion mass spectrometry (SIMS). Further, for sufficient supply of oxygen to make the film in a supersaturated state, an insulating film (e.g., SiO$_x$) containing excessive oxygen is provided to be in contact with and cover the oxide semiconductor film.

Note that the oxide semiconductor film 403 may have a structure in which a plurality of oxide semiconductor films are stacked. For example, the oxide semiconductor film 403 may have a stacked-layer structure of a first oxide semiconductor film and a second oxide semiconductor film which are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using a three-component metal oxide.

Further, the constituent elements of the first oxide semiconductor film and the second oxide semiconductor film may be the same and the composition thereof may be different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

At this time, one of the first oxide semiconductor film and the second oxide semiconductor film which is closer to the gate electrode (on a channel side) preferably contains In and Ga at a proportion of In>Ga. The other which is farther from the gate electrode (on a back channel side) preferably contains In and Ga at a proportion of In≤Ga.

In an oxide semiconductor, the s orbital of heavy metal mainly contributes to carrier transfer, and when the In proportion in the oxide semiconductor is increased, overlap of the s orbitals is likely to be increased. Therefore, an oxide having a composition of In>Ga has higher mobility than an oxide having a composition of In≤Ga. Further, in Ga, the formation energy of an oxygen vacancy is larger and thus the oxygen vacancy is less likely to occur than in In; therefore, the oxide having a composition of In≤Ga has more stable characteristics than the oxide having a composition of In>Ga.

An oxide semiconductor containing In and Ga at a proportion of In>Ga is used on a channel side, and an oxide semiconductor containing In and Ga at a proportion of In≤Ga is used on a back channel side, whereby field-effect mobility and reliability of the transistor can be further improved.

Further, oxide semiconductors having different crystallinities may be used for the first oxide semiconductor film and the second oxide semiconductor film. That is, the oxide semiconductor film 403 may be formed by using any of a single crystal oxide semiconductor, a polycrystalline oxide semiconductor, an amorphous oxide semiconductor, and a CAAC-OS, as appropriate. When an amorphous oxide semiconductor is used for at least one of the first oxide semiconductor film and the second oxide semiconductor film, internal stress or external stress of the oxide semiconductor film 403 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor film on the channel side is preferably formed using a crystalline oxide semiconductor such as a CAAC-OS.

Further, the oxide semiconductor film 403 may have a stacked-layer structure of three or more layers in which an amorphous oxide semiconductor film is interposed between a plurality of crystalline oxide semiconductor films. Furthermore, a structure in which a crystalline oxide semiconductor film and an amorphous oxide semiconductor film are alternately stacked may be employed.

These two structures for making the oxide semiconductor film 403 have a stacked-layer structure of a plurality of layers can be combined as appropriate.

In the case where the oxide semiconductor film 403 has a stacked-layer structure of a plurality of layers, oxygen may be added each time the oxide semiconductor film is formed. For addition of oxygen, heat treatment in an oxygen atmosphere, an ion implantation method, an ion doping method, a plasma immersion ion implantation method, plasma treatment performed in an atmosphere containing oxygen, or the like can be employed.

Oxygen is added each time the oxide semiconductor film is formed, whereby an effect of reducing oxygen vacancies in the oxide semiconductor can be improved.

Next, a gate insulating film 409 is formed over the base insulating film 436 and the oxide semiconductor film 403 (see FIG. 2B). Note that the gate insulating film 409 may be provided at least below the gate electrode 401 to be formed later.

The gate insulating film 409 is preferably a stacked-layer film of an oxygen supplying film 409a and a bather film 409b. The oxygen supplying film 409a is an insulating film from which oxygen is released by heat treatment, like the base insulating film 436, so that oxygen vacancies in the oxide semiconductor film can be reduced. The barrier film 409b can prevent moisture and hydrogen from entering and diffusing in the oxide semiconductor film 403. In addition, desorption of oxygen from the oxide semiconductor film 403 can be suppressed. As a material for the oxygen supplying film 409a, silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like can be used. As a material for the barrier film 409b, aluminum oxide or the like can be used. The oxygen supplying film 409a and the barrier film 409b can be formed by a plasma CVD method, a sputtering method, or the like.

In this embodiment, a silicon oxide film is formed as the oxygen supplying film 409a, and plasma treatment is performed in an oxygen atmosphere, whereby oxygen is added to the silicon oxide film. Then, an aluminum film is formed over the oxygen supplying film 409a and plasma treatment is performed in an oxygen atmosphere, whereby oxygen is added to the aluminum film. Thus, an aluminum oxide film serving as the barrier film 409b is formed.

Alternatively, the oxygen-excess silicon oxide film and aluminum oxide film can be formed by stacking a silicon oxide film and an aluminum film in this order, and by applying a bias from the substrate 400 side to add oxygen to the silicon oxide film and the aluminum film.

Further alternatively, the oxygen-excess silicon oxide film may be formed by a plasma CVD method and by addition of oxygen, and then an aluminum oxide film may be formed by a sputtering method.

Next, a conductive film is formed over the gate insulating film 409, and the conductive film is etched, whereby the gate electrode 401 is formed (see FIG. 2C).

The gate electrode 401 can be formed using a metal material such as molybdenum, titanium, tantalum, tungsten, aluminum, copper, chromium, neodymium, or scandium or an alloy material which contains any of these materials as its main component. Alternatively, the gate electrode 401 may be formed using a semiconductor film typified by a polycrystalline silicon film doped with an impurity element such as phosphorus, or a silicide film such as a nickel silicide film. The gate electrode 401 may have a single-layer structure or a stacked-layer structure.

The gate electrode 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. The gate electrode 401 can have a stacked-layer structure of the above conductive material and the above metal material.

As one layer of the gate electrode 401, which is in contact with the gate insulating film 409, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV (electron volts), preferably higher than or equal to 5.5 eV; thus, when these films are used for the gate electrode, the threshold voltage of the transistor can be positive. Accordingly, a so-called normally-off switching element can be achieved.

Further, oxygen doping treatment may be performed on the oxide semiconductor film 403 in order to form the oxide semiconductor film 403 containing excessive oxygen. The oxide semiconductor film 403 can be doped with oxygen (an oxygen radical, an oxygen atom, an oxygen molecule, ozone, an oxygen ion (an oxygen molecular ion), and/or an oxygen cluster ion) by an ion implantation method, an ion doping method, a plasma immersion ion implantation method, plasma treatment, or the like. For the ion implantation method, a gas cluster ion beam may be used. The oxygen doping treatment may be performed over the entire area at a time or may be performed using a moving (scanning) linear ion beam or the like.

For example, oxygen for the doping (an oxygen radical, an oxygen atom, an oxygen molecule, ozone, an oxygen ion (an oxygen molecule ion) and/or an oxygen cluster ion) may be supplied from a plasma generating apparatus with the use of a gas containing oxygen or from an ozone generating apparatus. Specifically, the oxide semiconductor film 403 can be processed by, for example, generating oxygen with an apparatus for etching treatment on a semiconductor device, an apparatus for ashing on a resist mask, or the like.

For the oxygen doping treatment, a gas containing oxygen can be used. As the gas containing oxygen, oxygen, dinitrogen monoxide, nitrogen dioxide, carbon dioxide, carbon monoxide, or the like can be used. Alternatively, a rare gas may be used for the oxygen doping treatment.

For example, in the case where an oxygen ion is implanted by an ion implantation method for oxygen doping, the dose may be greater than or equal to $1 \times 10^{13}$ ions/cm$^2$ and less than or equal to $5 \times 10^{16}$ ions/cm$^2$.

Next, a resist mask 425a and a resist mask 425b are formed to cover the third region 433 and the second region 432, respectively, and a dopant 421 is added to the oxide semiconductor film 403 with the use of the resist mask 425a, the resist mask 425b, and the gate electrode 401 as masks, whereby the source region 403a and the drain region 403b are formed in the first region 431. In the first region 431, a region where the dopant 421 is not added serves as the channel formation region 403c (see FIG. 3A).

By forming resist masks over the second region 432 and the third region 433 of the oxide semiconductor film 403 so as to prevent the addition of the dopant thereto, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced. The source region 403a and the drain region 403b of the oxide semiconductor film 403, to which the dopant 421 is added, has a disordered crystal structure, and thus the oxide semiconductor film 403 becomes amorphous. The amorphous oxide semiconductor is likely to absorb an impurity which serves as a donor, such as hydrogen, from the channel formation region 403c having crystallinity, such as the CAAC-OS film. Accordingly, favorable transistor characteristics can be obtained.

Further, the length of the outline of each of the second region 432 and the third region 433 of the oxide semiconductor film 403 (total length of double of length $L_1$ and length $L_2$, i.e., $2L_1+L_2$, in FIG. 1A) is larger than the length of the first region 431 in the channel width direction (length W in FIG. 1A). Specifically, the length of the outline of each of the second region 432 and the third region 433 of the oxide semiconductor film 403 is three times or more, preferably ten times or more, as large as the length of the first region 431 in the channel width direction. By increasing the length of the outline of each of the second region 432 and the third region 433 of the oxide semiconductor film 403, resistance components at the outline increase. Thus, formation of a parasitic channel and an increase in leakage current can be suppressed at an end portion of the oxide semiconductor film 403 when the transistor is in an off-state. Even if oxygen desorbs from the end portion of the oxide semiconductor film 403, the end portion of the oxide semiconductor film 403 is apart from the channel formation region 403c interposed between the source electrode 405a and the drain electrode 405b; thus, an influence on electrical characteristics of the transistor 450 can be reduced. Accordingly, electrical characteristics of the transistor 450 can be prevented from degrading and be favorable.

The dopant 421 is an impurity by which the conductivity of the oxide semiconductor film 403 is changed. As the dopant 421, one or more selected from the following can be used: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant 421 can be added into the oxide semiconductor film 403 through another film (for example, the gate insulating film 409) depending on its addition method. Examples of the method for adding the dopant 421 include an ion implantation method, an ion doping method, and a plasma immersion ion implantation method. In that case, it is preferable to use a single ion of the dopant 421, or a fluoride ion or chloride ion thereof.

The addition of the dopant 421 may be controlled by setting the addition conditions such as the accelerated voltage and the dose, or the thickness of the films through which the dopant passes as appropriate. In this embodiment, phosphorus is used as the dopant 421, whose ion is added by an ion implantation method. Note that the dose of the dopant 421 may be greater than or equal to $1 \times 10^{13}$ ions/cm$^2$ and less than or equal to $5 \times 10^{16}$ ions/cm$^2$.

The concentration of the dopant 421 in the source region 403a or the drain region 403b is preferably higher than or equal to $5 \times 10^{18}$/cm$^3$ and lower than or equal to $1 \times 10^{22}$/cm$^3$.

The dopant 421 may be added while the substrate 400 is heated.

The addition of the dopant 421 to the oxide semiconductor film 403 may be performed plural times, and the number of kinds of dopant may be plural.

After the addition of the dopant 421, heat treatment may be performed. The heat treatment is preferably performed at a temperature(s) higher than or equal to 300° C. and lower than or equal to 700° C., further preferably higher than or equal to 300° C. and lower than or equal to 450° C., for one hour in an oxygen atmosphere. The heat treatment may be performed in a nitrogen atmosphere, under reduced pressure, or in an air (ultra-dry air).

In this embodiment, phosphorus (P) ions are implanted into the oxide semiconductor film 403 by an ion implantation method. Note that the conditions of the phosphorus (P) ion implantation are as follows: the acceleration voltage is 30 kV and the dose is $1.0 \times 10^{15}$ ions/cm$^2$. Note that the channel length of the oxide semiconductor film 403 is preferably less than 60 nm.

Thus, the oxide semiconductor film 403 in which the source region 403a and the drain region 403b are formed with the channel formation region 403c interposed therebetween is formed. In this embodiment, the dopant 421 is added after the gate electrode 401 is formed; however, without limitation, the dopant 421 may be added after the sidewall insulating film 412 is formed, for example.

Next, an insulating film 411 is formed over the gate insulating film 409 and the gate electrode 401 (see FIG. 3B).

As a material for the insulating film 411, silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like can be used.

Note that the insulating film 411 may have a single-layer structure or a stacked-layer structure.

Next, removing (polishing) treatment is performed on part of the insulating film 411 while the gate electrode 401 is not exposed and an insulating film 411a is formed (see FIG. 3C).

As a removing method, chemical mechanical polishing (CMP) treatment is preferably used.

Note that the CMP treatment is used as the removing treatment in this embodiment; however, another removing method may be used. Alternatively, the polishing treatment such as the CMP treatment may be combined with etching (dry etching or wet etching) treatment or plasma treatment. In the case where the removing treatment is combined with etching treatment, plasma treatment, or the like, the order of the steps may be, without any particular limitation, set as appropriate depending on the material, thickness, and surface roughness of the insulating film 411.

Note that the CMP treatment may be performed only once or plural times. When the CMP treatment is performed plural times, first polishing is preferably performed with a high polishing rate followed by final polishing with a low polishing rate. By performing polishing at different polishing rates in this manner, the planarity of the surface of the insulating film 411a can be further improved.

Then, a resist mask 435 is selectively formed over the insulating film 411a (see FIG. 4A)

Next, with the use of the resist mask 435, the insulating film 411a and the gate insulating film 409 are selectively etched, whereby the sidewall insulating film 412 and the gate insulating film 410 which is a stacked-layer film of an oxygen supplying film 410a and a barrier film 410b are formed (see FIG. 4B).

The sidewall insulating film 412 is preferably an insulating film (oxygen supplying film) from which oxygen is released by heat treatment. In this case, oxygen can be supplied from the sidewall insulating film 412 to the oxide semiconductor film 403 through the gate insulating film 410 and the like. Further, the sidewall insulating film 412 may have a stacked-layer structure of two or more layers. In this embodiment, after a first silicon nitride oxide film is formed by a CVD method to a thickness of 30 nm, oxygen is added to the silicon nitride oxide film by performing plasma treatment in an oxygen atmosphere; further, a second silicon nitride oxide film is formed to a thickness of 370 nm and the first and second silicon nitride oxide films are etched, whereby the sidewall insulating film 412 is formed.

Then, over the oxide semiconductor film 403 and the sidewall insulating film 412, a conductive film 405 is formed. Over the conductive film 405, an interlayer insulating film 419 is formed (see FIG. 4C).

The conductive film 405 may be formed to have a single-layer structure or a stacked-layer structure using one or more of Al, Ti, Cr, Co, Ni, Cu, Y, Zr, Mo, Ag, Ta, Ru, and W, a nitride of any of these elements, an oxide of any of these elements, and an alloy of any of these elements. Alternatively, an oxide or an oxynitride which contains at least In and Zn may be used. For example, an In—Ga—Zn—O—N-based material may be used.

As a material for the interlayer insulating film 419, silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like can be used. The interlayer insulating film 419 may have a single-layer structure or a stacked-layer structure. Further, the interlayer insulating film 419 may have a stacked-layer structure of an oxygen supplying film and a barrier film, like the gate insulating film.

Next, removing (polishing) treatment is performed on the interlayer insulating film 419 and part of the conductive film 405 so that the sidewall insulating film 412 can be exposed, and the interlayer insulating film 415, the source electrode 405*a*, and the drain electrode 405*b* are formed (see FIG. 5A).

For the removing treatment, chemical mechanical polishing (CMP) treatment is preferably used.

Note that in this embodiment, top surfaces of the source electrode 405*a*, the drain electrode 405*b*, the sidewall insulating film 412, and the interlayer insulating film 415 are at the same level. With such a structure, coverage with a thin film that is to be formed in a later step (a manufacturing step or the like of a semiconductor device or an electronic device including the transistor) can be improved, so that disconnection of a thin film or a wiring can be prevented. For example, if there is a step among the source electrode 405*a*, the drain electrode 405*b*, the sidewall insulating film 412, and the interlayer insulating film 415, a film or a wiring over the step is cut and a defect occurs; however, if the top surfaces of the source electrode 405*a* and the drain electrode 405*b* are at the same level as the top surfaces of the sidewall insulating film 412 and the interlayer insulating film 415, such a defect can be prevented and the reliability can be improved.

Note that the CMP treatment is used as the removing treatment in this embodiment; however, another removing method may be used. Alternatively, the polishing treatment such as the CMP treatment may be combined with etching (dry etching or wet etching) treatment or plasma treatment. When the removing treatment is combined with etching treatment, plasma treatment, or the like, the order of steps may be, without any particular limitation, set as appropriate depending on the material, thicknesses, and surface roughness of the interlayer insulating film 415.

Note that the CMP treatment may be performed only once or plural times. When the CMP treatment is performed plural times, first polishing is preferably performed with a high polishing rate followed by final polishing with a low polishing rate. By performing polishing at different polishing rates, the planarity of the surface of the interlayer insulating film 415 can be further improved.

As described above, the removing treatment is performed so that the sidewall insulating film 412 can be exposed, whereby the source electrode 405*a* and the drain electrode 405*b* can be formed.

Alternatively, the source electrode 405*a* and the drain electrode 405*b* can be formed after the conductive film 405 is formed, by forming a resist mask over the conductive film 405 and performing selective etching on the conductive film 405.

Next, an insulating film 417 is formed over the interlayer insulating film 415, the sidewall insulating film 412, the source electrode 405*a*, and the drain electrode 405*b*, and then the wiring layer 414*a* and the wiring layer 414*b* which are electrically connected to the source electrode 405*a* and the drain electrode 405*b*, respectively, through openings provided in the insulating film 417 and the interlayer insulating film 415 are formed (see FIG. 5B).

The wiring layers 414*a* and 414*b* can be formed using a material and a method which are similar to those of the gate electrode 401. In this manner, the transistor 450 can be manufactured.

As described above, with the transistor including the oxide semiconductor film formed in a cross shape by etching treatment so as to have different lengths in the channel length direction, it is possible to reduce the probability of electrical connection between the source electrode and the drain electrode of the transistor through a region (a region in which the resistance is lowered by desorption of oxygen (O) or the like) in the vicinity of a side surface (end surface) of the oxide semiconductor film.

Accordingly, it is possible to provide a transistor which has favorable transistor characteristics and includes an oxide semiconductor, and to provide a highly reliable semiconductor device which includes the transistor including the oxide semiconductor.

The methods and structures described in this embodiment can be combined as appropriate with any of the methods and structures described in the other embodiments.

Embodiment 2

Figure 6A:
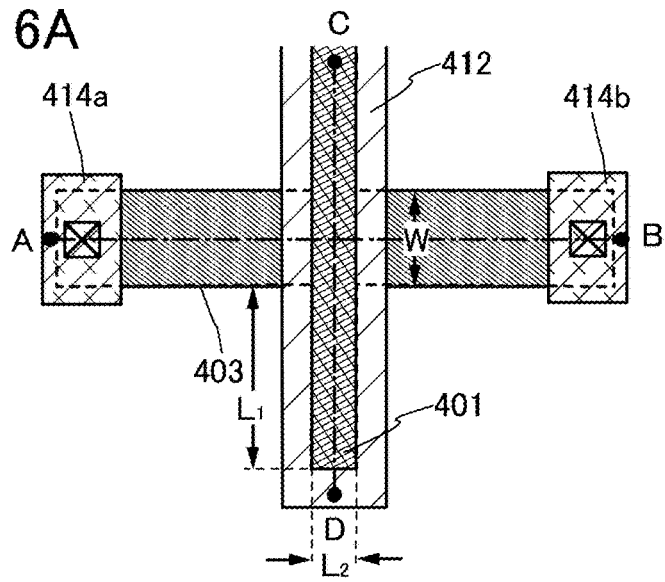
FIGS. 6A to 6C are a plan view and cross-sectional views illustrating one embodiment of a semiconductor device.
Figure 6B:
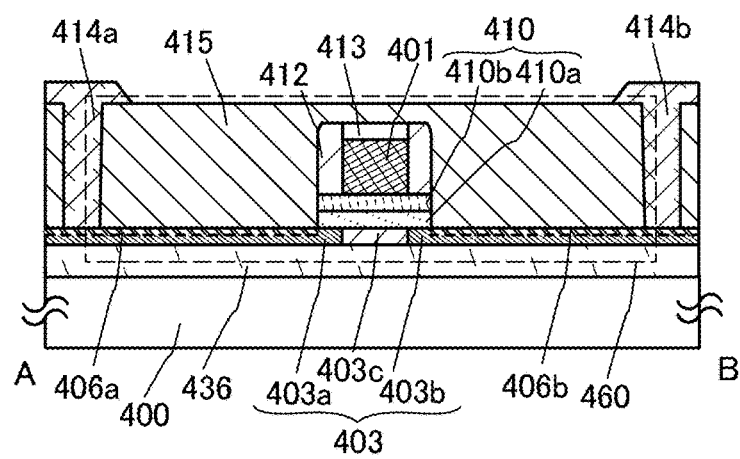
Figure 6C:
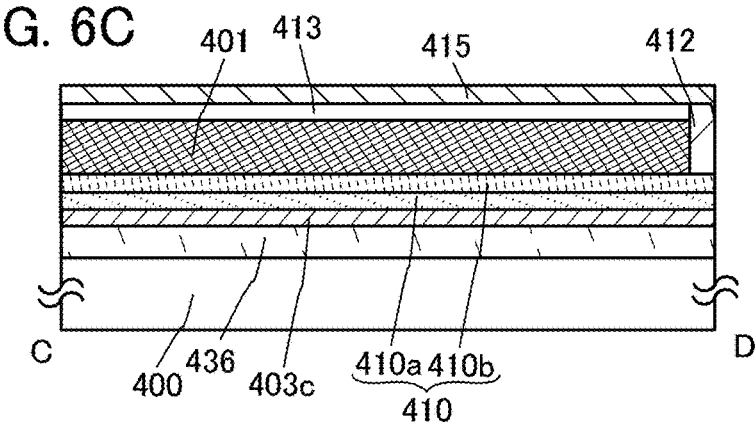

In this embodiment, another embodiment of a semiconductor device will be described with reference to FIGS. 6A to 6C. FIG. 6A is a top view of a transistor included in the semiconductor device, FIG. 6B is a cross-sectional view taken along dashed-dotted line A-B (channel length direction) in FIG. 6A, and FIG. 6C is a cross-sectional view taken along dashed-dotted line C-D in FIG. 6A. Note that some components illustrated in FIG. 6B or 6C are not illustrated in FIG. 6A for simplicity of the drawing.

A transistor 460 illustrated in FIGS. 6A to 6C includes, over the substrate 400 having an insulating surface provided with the base insulating film 436, the oxide semiconductor film 403 including the channel formation region 403*c*, the source region 403*a*, and the drain region 403*b*; a low-resistance region 406*a*; a low-resistance region 406*b*; the gate insulating film 410; the gate electrode 401; the sidewall insulating film 412 along a side surface of the gate electrode 401; an insulating film 413 over the gate electrode 401; the interlayer insulating film 415 over the low-resistance region 406*a* and the low-resistance region 406*b*; and the wiring layer 414*a* and the wiring layer 414*b* which serve as a source electrode and a drain electrode, respectively.

As illustrated in FIG. 16A, the oxide semiconductor film 403 includes the first region 431, and the second region 432 and the third region 433 with part of the first region 431 interposed therebetween. A stacked-layer of the gate electrode 401 and the insulating film 413 is provided so as to at least partly overlap with each of the first region 431 to the third region 433. Note that the oxide semiconductor film 403 illustrated in FIG. 16A has a different hatching pattern for simplicity of the drawing.

The first region 431 includes the channel formation region 403*c* overlapping with the gate electrode 401, and a pair of low-resistance regions (also referred to as the source region 403*a* and the drain region 403*b* because the low-resistance regions serve as the source region and the drain region) with the channel formation region 403*c* interposed therebetween. Further, each of the low-resistance regions is in contact with the channel formation region 403*c* and has a lower resistance than the channel formation region 403*c*. The length of each of the second region 432 and the third region 433 in the channel length direction is smaller than that of the first region 431 in the channel length direction.

The low-resistance regions 406*a* and 406*b* can lower contact resistances between the oxide semiconductor film 403 and the wiring layers 414*a* and 414*b* serving as the source electrode and the drain electrode. The low-resistance regions 406a and 406b are formed by modifying at least part of top surfaces of the source region 403a and the drain region 403b of the oxide semiconductor film 403.

A dopant is added to the oxide semiconductor film 403 with the use of the gate electrode 401 as a mask, whereby the source region 403a and the drain region 403b is formed with the channel formation region 403c interposed therebetween in the oxide semiconductor film 403. Further, each of the source region 403a and the drain region 403b is a low-resistance region having a lower resistance than the channel formation region 403c and containing the dopant. In this case, resist masks are formed over the second region 432 and the third region 433 of the oxide semiconductor film 403 so as to prevent the addition of the dopant thereto. In this manner, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced.

Further, the length of the outline of each of the second region 432 and the third region 433 of the oxide semiconductor film 403 (total length of double of length $L_1$ and length $L_2$, i.e., $2L_1+L_2$, in FIG. 6A) is larger than the length of the first region 431 in the channel width direction (length W in FIG. 6A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 6A; however, by increasing the length of the outline of each of the second region 432 and the third region 433 of the oxide semiconductor film 403, the leakage path becomes longer and resistance components at the outline increase. Thus, formation of a parasitic channel and an increase in leakage current can be suppressed at an end portion of the oxide semiconductor film 403 when the transistor is in an off-state. Even if oxygen desorbs from the channel formation region 403c interposed between the source electrode 405a and the drain electrode 405b, oxygen desorbs directly from a corner portion of the channel formation region 403c interposed between the source electrode 405a and the drain electrode 405b or indirectly from end portions of the second region 432 and the third region 433 of the oxide semiconductor film 403; therefore, the desorbed amount of oxygen is small. Thus, an influence on electrical characteristics of the transistor 460 can be reduced. Accordingly, electrical characteristics of the transistor 460 can be prevented from degrading and be favorable.

The dopant is an impurity which changes the conductivity of the oxide semiconductor film 403. Examples of a method for adding the dopant include an ion implantation method, an ion doping method, and a plasma immersion ion implantation method.

With the oxide semiconductor film 403 including the source region 403a and the drain region 403b with the channel formation region 403c interposed therebetween in the channel length direction, on-state characteristics (e.g., on-state current and field-effect mobility) of the transistor 460 are increased, which enables high-speed operation and high-speed response of the transistor 460.

An example of a method for manufacturing the semiconductor device including the transistor 460 will be described below.

FIG. 7A1 is a top view illustrating a step for manufacturing the transistor, FIG. 7A2 is a cross-sectional view taken along dashed-dotted line A-B in FIG. 7A1, and FIG. 7A3 is a cross-sectional view taken along dashed-dotted line C-D in FIG. 7A1.

First, the base insulating film 436 and the oxide semiconductor film 402 are formed over the substrate 400 having an insulating surface (see FIG. 7A).

The substrate 400 and the base insulating film 436 can be formed using a material and a method which are similar to those in Embodiment 1. Further, the oxide semiconductor film 402 can be formed using a material and a method which are similar to those of the oxide semiconductor film 403 in Embodiment 1.

Next, the gate insulating film 409 is formed over the oxide semiconductor film 402 (see FIG. 7B). Note that the gate insulating film 409 may be provided at least below the gate electrode 401 to be formed later.

The gate insulating film 409 is preferably a stacked-layer film of the oxygen supplying film 409a and the barrier film 409b. The oxygen supplying film 409a is an insulating film from which oxygen is released by heat treatment, like the base insulating film 436, so that oxygen vacancies in the oxide semiconductor film can be reduced. The barrier film 409b can prevent moisture and hydrogen from entering and diffusing in the oxide semiconductor film 402. In addition, desorption of oxygen from the oxide semiconductor film 402 can be suppressed. As a material for the oxygen supplying film 409a, silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like can be used. As a material for the barrier film 409b, aluminum oxide or the like can be used.

In this embodiment, a silicon oxide film is formed as the oxygen supplying film 409a, and plasma treatment is performed, whereby oxygen is added to the silicon oxide film. Then, an aluminum film is formed over the oxygen supplying film 409a and plasma treatment is performed, whereby oxygen is added to the aluminum film. Thus, an aluminum oxide film serving as the barrier film 409b is formed.

Alternatively, the oxygen-excess silicon oxide film and aluminum oxide film can be formed by stacking a silicon oxide film and an aluminum film in this order, and by applying a bias from the substrate 400 side to add oxygen to the silicon oxide film and the aluminum film.

Next, a stacked layer of a conductive film and an insulating film is formed over the gate insulating film 409, and the conductive film and the insulating film are etched, whereby a stacked layer of the gate electrode 401 and the insulating film 413 is formed (see FIG. 7C).

The gate electrode 401 can be formed using a material and a method which are similar to those in Embodiment 1.

As the insulating film 413, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating film 413 can be formed by a plasma CVD method, a sputtering method, or the like.

Then, a resist mask 425c is formed over the gate insulating film 409 and the insulating film 413 (see FIG. 8A).

Next, with the use of the resist mask 425c, the gate insulating film 409 and the oxide semiconductor film 402 are selectively etched (see FIG. 8B). At this time, in addition to the resist mask 425c, the gate electrode 401 also serves as a mask; thus, the oxide semiconductor film 403 having a cross shape can be obtained. Further, the oxide semiconductor film 403 includes the first region 431, and the second region 432 and the third region 433 with part of the first region 431 interposed therebetween.

Next, the dopant 421 is added to the oxide semiconductor film 403 with the use of the gate electrode 401 and the insulating film 413 as masks, whereby the source region 403a and the drain region 403b are formed in the first region 431. In the first region 431, a region where the dopant 421 is not added serves as the channel formation region 403c (see FIG. 8C).

By forming resist masks over the second region 432 and the third region 433 of the oxide semiconductor film 403 so as to prevent the addition of the dopant thereto, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced. The oxide semiconductor film of the source region 403a and the drain region 403b, to which the dopant 421 is added, has a disordered crystal structure, and thus becomes amorphous. The amorphous oxide semiconductor is likely to absorb an impurity which serves as a donor, such as hydrogen, from the channel formation region 403c having crystallinity, such as the CAAC-OS film. Accordingly, favorable transistor characteristics can be obtained.

Further, the length of the outline of each of the second region 432 and the third region 433 of the oxide semiconductor film 403 (total length of double of length $L_1$ and length $L_2$, i.e., $2L_1+L_2$, in FIG. 6A) is larger than the length of the first region 431 in the channel width direction (length W in FIG. 6A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 6A; however, by increasing the length of the outline of each of the second region 432 and the third region 433 of the oxide semiconductor film 403, the leakage path becomes longer and resistance components at the outline increase. Thus, formation of a parasitic channel and an increase in leakage current can be suppressed at an end portion of the oxide semiconductor film 403 when the transistor is in an off-state. Even if oxygen desorbs from the channel formation region 403c interposed between the source electrode 405a and the drain electrode 405b, oxygen desorbs directly from a corner portion of the channel formation region 403c interposed between the source electrode 405a and the drain electrode 405b or indirectly from end portions of the second region 432 and the third region 433 of the oxide semiconductor film 403; therefore, the desorbed amount of oxygen is small. Thus, an influence on electrical characteristics of the transistor 460 can be reduced. Accordingly, electrical characteristics of the transistor 460 can be prevented from degrading and be favorable.

For the kinds, addition method, and the like of the dopant 421, Embodiment 1 can be referred to.

Next, an insulating film is formed over the gate electrode 401 and the insulating film 413, and the insulating film is etched, whereby the sidewall insulating film 412 is formed (see FIG. 9A). Further, with the use of the gate electrode 401 and the sidewall insulating film 412 as masks, the gate insulating film 409 is etched, whereby the gate insulating film 410 which is a stacked-layer film of the oxygen supplying film 410a and the barrier film 410b is formed (see FIG. 9B).

The sidewall insulating film 412 can be formed using a material and a method which are similar to those of the insulating film 413. The sidewall insulating film 412 is preferably an insulating film (oxygen supplying film) from which oxygen is released by heat treatment. In this case, oxygen can be supplied from the sidewall insulating film 412 to the oxide semiconductor film 403 through the gate insulating film 410 and the like. Further, the sidewall insulating film 412 may have a stacked-layer structure of two or more layers. In this embodiment, after a first silicon nitride oxide film is formed by a CVD method to a thickness of 30 nm, oxygen is added to the silicon nitride oxide film by performing plasma treatment in an oxygen atmosphere; further, a second silicon nitride oxide film is formed to a thickness of 370 nm and the first and second silicon nitride oxide films are etched, whereby the sidewall insulating film 412 is formed.

Then, over the oxide semiconductor film 403, the sidewall insulating film 412, and the insulating film 413, a conductive film 407 is formed (see FIG. 9C).

The conductive film 407 can be formed using aluminum, titanium, or the like.

Next, a dopant 441 is added to the conductive film 407, and a metal of the conductive film 407 is diffused into the oxide semiconductor film 403, whereby the low-resistance regions 406a and 406b having even lower resistances are formed in the source region 403a and the drain region 403b (see FIG. 10A).

The dopant 441 can be argon, for example. Examples of the method for adding the dopant 441 include an ion implantation method, an ion doping method, and a plasma immersion ion implantation method. The addition of the dopant 441 may be controlled by setting the addition conditions such as the accelerated voltage and the dose, or the thickness of the films through which the dopant passes as appropriate.

In the above manner, the metal of the conductive film 407 disperses into the oxide semiconductor film 403, and the source region 403a and the drain region 403b of the oxide semiconductor film 403, to which the dopant 441 is added, has a disordered crystal structure, and thus the oxide semiconductor film 403 becomes amorphous. Further, the low-resistance regions 406a and 406b can be formed.

Alternatively, the low-resistance regions 406a and 406b may be formed by performing heat treatment after the conductive film 407 is formed so as to cause a reaction at the interface between the conductive film 407 and the oxide semiconductor film 403.

Next, the conductive film 407 is removed, and then the interlayer insulating film 415 is formed over the low-resistance regions 406a and 406b, the sidewall insulating film 412, and the insulating film 413 (see FIG. 10B).

The interlayer insulating film 415 can be formed using a material and a method which are similar to those of the insulating film 413. The interlayer insulating film 415 has a thickness which is large enough to planarize unevenness caused by the transistor 460. Further, the interlayer insulating film 415 may have a stacked-layer structure of an oxygen supplying film and a barrier film, like the gate insulating film.

Next, the wiring layer 414a and the wiring layer 414b which are electrically connected to the low-resistance region 406a and the low-resistance region 406b, respectively, through openings provided in the interlayer insulating film 415 are formed. The wiring layer 414a and the wiring layer 414b serve as the source electrode and the drain electrode, respectively.

The wiring layers 414a and 414b can be formed using a material and a method which are similar to those of the gate electrode 401. In this manner, the transistor 460 can be manufactured.

As described above, with the transistor including the oxide semiconductor film formed in a cross shape by etching treatment so as to have different lengths in the channel length direction, it is possible to reduce the probability of electrical connection between the source electrode and the drain electrode of the transistor through a region (a region in which the resistance is lowered by desorption of oxygen (O) or the like) in the vicinity of a side surface (end surface) of the oxide semiconductor film.

Accordingly, it is possible to provide a transistor which has favorable transistor characteristics and includes an oxide semiconductor, and to provide a highly reliable semiconductor device which includes the transistor including the oxide semiconductor.

The methods and structures described in this embodiment can be combined as appropriate with any of the methods and structures described in the other embodiments.

Embodiment 3

Figure 11A:
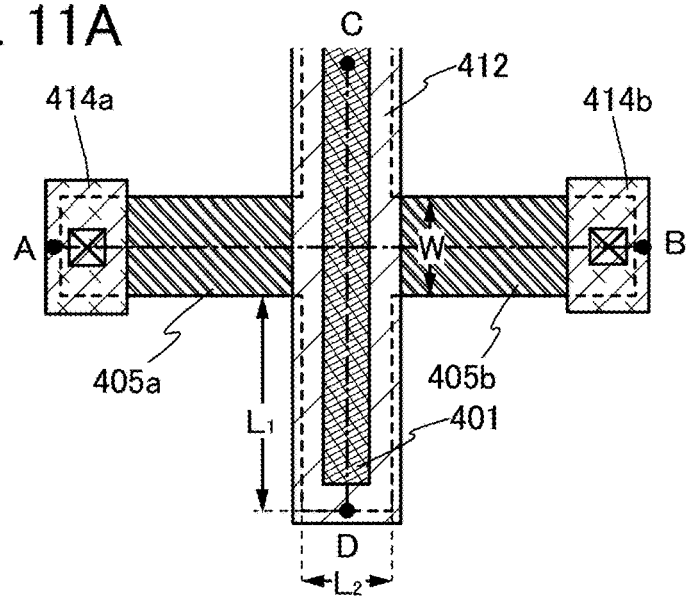
FIGS. 11A to 11C are a plan view and cross-sectional views illustrating one embodiment of a semiconductor device.
Figure 11B:
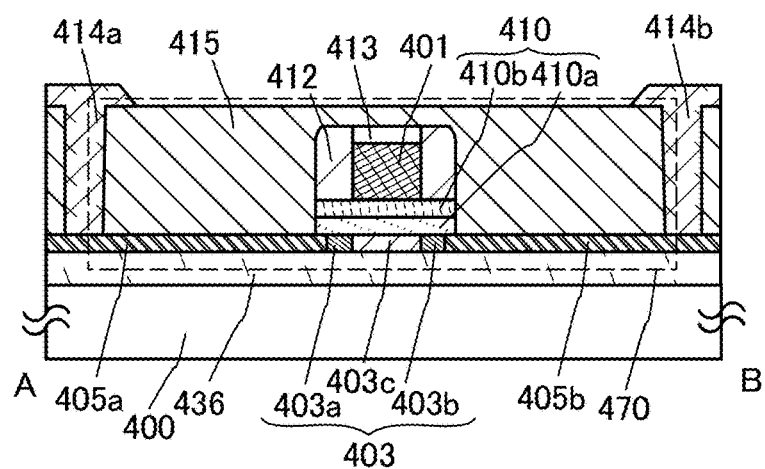
Figure 11C:
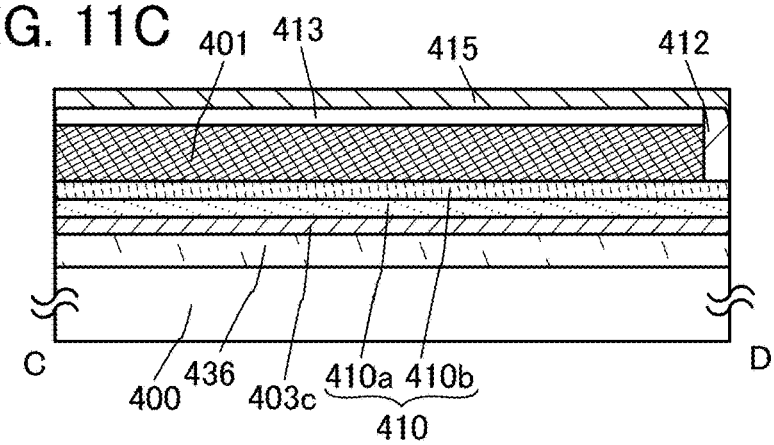

In this embodiment, another embodiment of a semiconductor device will be described with reference to FIGS. 11A to 11C. FIG. 11A is a top view of a transistor included in the semiconductor device, FIG. 11B is a cross-sectional view taken along dashed-dotted line A-B (channel length direction) in FIG. 11A, and FIG. 11C is a cross-sectional view taken along dashed-dotted line C-D in FIG. 11A. Note that some components illustrated in FIG. 11B or 11C are not illustrated in FIG. 11A for simplicity of the drawing.

A transistor 470 illustrated in FIGS. 11A to 11C includes, over the substrate 400 having an insulating surface provided with the base insulating film 436, the oxide semiconductor film 403 including the channel formation region 403c, the source region 403a, and the drain region 403b; the source electrode 405a; the drain electrode 405b; the gate insulating film 410; the gate electrode 401; the sidewall insulating film 412 along a side surface of the gate electrode 401; the insulating film 413 over the gate electrode 401; and the interlayer insulating film 415 over the source electrode 405a and the drain electrode 405b.

Figure 16B:
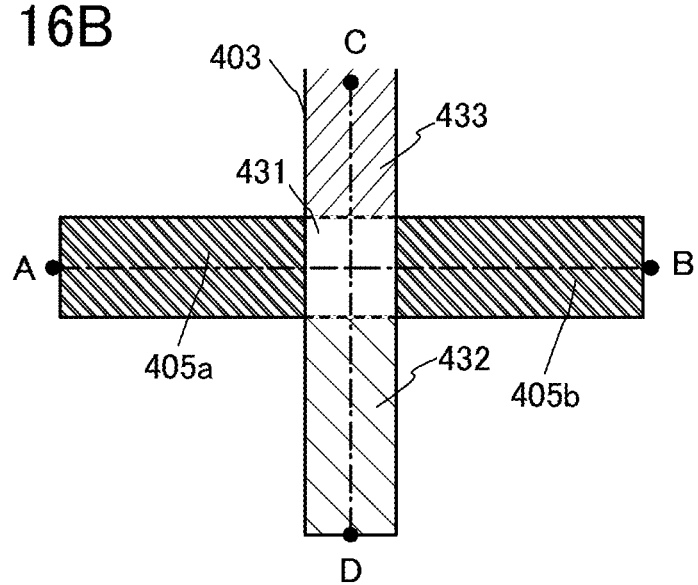

As illustrated in FIG. 16B, the oxide semiconductor film 403 includes the first region 431, and the second region 432 and the third region 433 with part of the first region 431 interposed therebetween. A stacked-layer of the gate electrode 401 and the insulating film 413 is provided so as to at least partly overlap with each of the first region 431 to the third region 433. Note that the oxide semiconductor film 403 illustrated in FIG. 16B has a different hatching pattern for simplicity of the drawing.

The first region 431 includes the channel formation region 403c overlapping with the gate electrode 401, and a pair of low-resistance regions (also referred to as the source region 403a and the drain region 403b because the low-resistance regions serve as the source region and the drain region) with the channel formation region 403c interposed therebetween. Further, each of the low-resistance regions is in contact with the channel formation region 403c and has a lower resistance than the channel formation region 403c. In the first region 431, one side surface of the oxide semiconductor film 403 in the channel length direction is in contact with the source electrode 405a, and the other side surface of the oxide semiconductor film 403 in the channel length direction is in contact with the drain electrode 405b. Further, the length of the oxide semiconductor film 403 in the channel width direction is larger than that of the source electrode 405a and the drain electrode 405b in the channel width direction.

A dopant is added to the oxide semiconductor film 403 with the use of the gate electrode 401 as a mask, whereby the source region 403a and the drain region 403b is formed with the channel formation region 403c interposed therebetween in the oxide semiconductor film 403. Further, each of the source region 403a and the drain region 403b has a lower resistance than the channel formation region 403c and contains the dopant. In this case, resist masks are formed over the second region 432 and the third region 433 of the oxide semiconductor film 403 so as to prevent the addition of the dopant thereto. In this manner, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced. The source region 403a and the drain region 403b of the oxide semiconductor film 403, to which the dopant 421 is added, has a disordered crystal structure, and thus the oxide semiconductor film 403 becomes amorphous. The amorphous oxide semiconductor is likely to absorb an impurity which serves as a donor, such as hydrogen, from the channel formation region 403c having crystallinity, such as the CAAC-OS film. Accordingly, favorable transistor characteristics can be obtained.

Further, the length of the outline of each of the second region 432 and the third region 433 of the oxide semiconductor film 403 (total length of double of length $L_1$ and length $L_2$, i.e., $2L_1+L_2$, in FIG. 11A) is larger than the length of the first region 431 in the channel width direction (length W in FIG. 11A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 11A; however, by increasing the length of the outline of each of the second region 432 and the third region 433 of the oxide semiconductor film 403, resistance components at the outline increase. Thus, formation of a parasitic channel and an increase in leakage current can be suppressed at an end portion of the oxide semiconductor film 403 when the transistor is in an off-state. Even if oxygen desorbs from the channel formation region 403c interposed between the source electrode 405a and the drain electrode 405b, oxygen desorbs directly from a corner portion of the channel formation region 403c interposed between the source electrode 405a and the drain electrode 405b or indirectly from end portions of the second region 432 and the third region 433 of the oxide semiconductor film 403; therefore, the desorbed amount of oxygen is small. Thus, an influence on electrical characteristics of the transistor 470 can be reduced. Accordingly, electrical characteristics of the transistor 470 can be prevented from degrading and be favorable.

The dopant is an impurity which changes the conductivity of the oxide semiconductor film 403. Examples of a method for adding the dopant include an ion implantation method, an ion doping method, and a plasma immersion ion implantation method.

With the oxide semiconductor film 403 including the source region 403a and the drain region 403b with the channel formation region 403c interposed therebetween in the channel length direction, on-state characteristics (e.g., on-state current and field-effect mobility) of the transistor 470 are increased, which enables high-speed operation and high-speed response of the transistor 470.

An example of a method for manufacturing the semiconductor device including the transistor 470 will be described below.

FIG. 12A1 is a top view illustrating a step for manufacturing the transistor, FIG. 12A2 is a cross-sectional view taken along dashed-dotted line A-B in FIG. 12A1, and FIG. 12A3 is a cross-sectional view taken along dashed-dotted line C-D in FIG. 12A1.

First, the base insulating film 436 is formed over the substrate 400 having an insulating surface.

The substrate 400 and the base insulating film 436 can be formed using a material and a method which are similar to those in Embodiment 1.

Next, the oxide semiconductor film 403 is formed over the base insulating film 436 (see FIG. 12A). For easy understanding, the oxide semiconductor film 403 is divided to three regions: the first region 431, the second region 432, and the third region 433. The first region 431 is interposed between the second region 432 and the third region 433, and is to be in contact with the source electrode 405a and the drain electrode 405b which are formed later.

The oxide semiconductor film 403 can be formed using a material and a method which are similar to those in Embodiment 1.

Next, the conductive film 405 is formed over the base insulating film 436 and the oxide semiconductor film 403 (see FIG. 12B).

The conductive film 405 can be formed using a material and a method which are similar to those of the conductive film 407 in Embodiment 1.

Next, removing (polishing) treatment is performed on the conductive film 405 to expose the oxide semiconductor film 403, whereby the source electrode 405a and the drain electrode 405b are formed (see FIG. 12C).

The removing (polishing) treatment can be performed as in Embodiment 1.

Next, the gate insulating film 409 is formed over the oxide semiconductor film 403, the source electrode 405a, and the drain electrode 405b (see FIG. 13A). Note that the gate insulating film 409 may be provided at least below the gate electrode 401 to be formed later.

The gate insulating film 409 is preferably a stacked-layer film of the oxygen supplying film 409a and the barrier film 409b. The oxygen supplying film 409a is an insulating film from which oxygen is released by heat treatment, like the base insulating film 436, so that oxygen vacancies in the oxide semiconductor film can be reduced. The barrier film 409b can prevent moisture and hydrogen from entering and diffusing in the oxide semiconductor film 403. In addition, desorption of oxygen from the oxide semiconductor film 403 can be suppressed. The oxygen supplying film 409a and the barrier film 409b can be formed using a material and a method which are similar to those in Embodiment 1.

Next, a stacked layer of a conductive film and an insulating film is formed over the gate insulating film 409, and the conductive film and the insulating film are etched, whereby a stacked layer of the gate electrode 401 and the insulating film 413 is formed (see FIG. 13B).

The gate electrode 401 and the insulating film 413 can be formed using a material and a method which are similar to those in Embodiment 2.

Next, the resist mask 425a and the resist mask 425b are formed to cover the third region 433 and the second region 432, respectively, and the dopant 421 is added to the oxide semiconductor film 403 with the use of the resist mask 425a, the resist mask 425b, the gate electrode 401, and the insulating film 413 as masks, whereby the source region 403a and the drain region 403b are formed in the first region 431. In the first region 431, a region where the dopant 421 is not added serves as the channel formation region 403c (see FIG. 13C).

By forming the resist masks over the second region 432 and the third region 433 of the oxide semiconductor film 403 so as to prevent the addition of the dopant thereto, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced.

Further, the length of the outline of each of the second region 432 and the third region 433 of the oxide semiconductor film 403 (total length of double of length $L_1$ and length $L_2$, i.e., $2L_1+L_2$, in FIG. 11A) is larger than the length of the first region 431 in the channel width direction (length W in FIG. 11A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 11A; however, by increasing the length of the outline of each of the second region 432 and the third region 433 of the oxide semiconductor film 403, the leakage path becomes longer and resistance components at the outline increase. Thus, formation of a parasitic channel and an increase in leakage current can be suppressed at an end portion of the oxide semiconductor film 403 when the transistor is in an off-state. Even if oxygen desorbs from the channel formation region 403c interposed between the source electrode 405a and the drain electrode 405b, oxygen desorbs directly from a corner portion of the channel formation region 403c interposed between the source electrode 405a and the drain electrode 405b or indirectly from end portions of the second region 432 and the third region 433 of the oxide semiconductor film 403; therefore, the desorbed amount of oxygen is small. Thus, an influence on electrical characteristics of the transistor 470 can be reduced. Accordingly, electrical characteristics of the transistor 470 can be prevented from degrading and be favorable.

For the kinds, addition method, and the like of the dopant 421, Embodiment 1 can be referred to.

Next, an insulating film is formed over the gate electrode 401 and the insulating film 413, and the insulating film is etched, whereby the sidewall insulating film 412 is formed (see FIG. 14A). Further, with the use of the gate electrode 401 and the sidewall insulating film 412 as masks, the gate insulating film 409 is etched, whereby the gate insulating film 410 which is a stacked-layer film of the oxygen supplying film 410a and the barrier film 410b is formed (see FIG. 14B).

The sidewall insulating film 412 can be formed using a material and a method which are similar to those in Embodiment 2.

Next, the interlayer insulating film 415 is formed over the source electrode 405a, the drain electrode 405b, the sidewall insulating film 412, and the insulating film 413, and then the wiring layer 414a and the wiring layer 414b which are electrically connected to the source electrode 405a and the drain electrode 405b, respectively, through openings provided in the interlayer insulating film 415 are formed (see FIG. 14C).

The interlayer insulating film 415 and the wiring layers 414a and 414b can be formed using a material and a method which are similar to those in Embodiment 1.

In this manner, the transistor 470 can be manufactured.

Alternatively, the structure in FIG. 12C can be manufactured by the following method.

First, the base insulating film 436 is formed over the substrate 400 having an insulating surface.

The substrate 400 and the base insulating film 436 can be formed using a material and a method which are similar to those in Embodiment 1.

Next, the source electrode 405a and the drain electrode 405b are formed over the base insulating film 436 (see FIG. 15A)

Then, the oxide semiconductor film 402 is formed over the base insulating film 436, the source electrode 405a, and the drain electrode 405b (see FIG. 15B).

The oxide semiconductor film 402 can be formed using a material and a method which are similar to those of the oxide semiconductor film 403 in this embodiment.

Next, removing (polishing) treatment is performed on the oxide semiconductor film 402 to expose the source electrode 405a and the drain electrode 405b, whereby the oxide semiconductor film 403 is formed (see FIG. 15C).

The removing (polishing) treatment can be performed as in Embodiment 1.

The structure in FIG. 12C can also be manufactured in the above manner.

As described above, with the transistor including the oxide semiconductor film which is etched so as to have a larger length than a source electrode and a drain electrode in the channel width direction, it is possible to reduce the probability of electrical connection between the source electrode and the drain electrode of the transistor through a region (a region in which the resistance is lowered by desorption of oxygen (O) or the like) in the vicinity of a side surface (end surface) of the oxide semiconductor film.

Accordingly, it is possible to provide a transistor which has favorable transistor characteristics and includes an oxide semiconductor, and to provide a highly reliable semiconductor device which includes the transistor including the oxide semiconductor.

The methods and structures described in this embodiment can be combined as appropriate with any of the methods and structures described in the other embodiments.

Embodiment 4

Figure 33A:
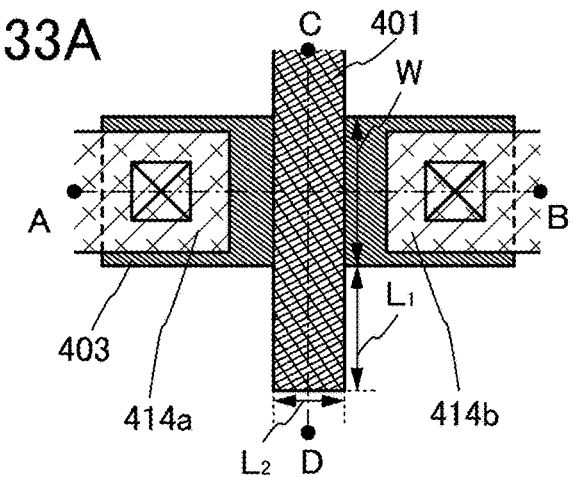
FIGS. 33A to 33C are a plan view and cross-sectional views illustrating one embodiment of a semiconductor device.
Figure 33B:
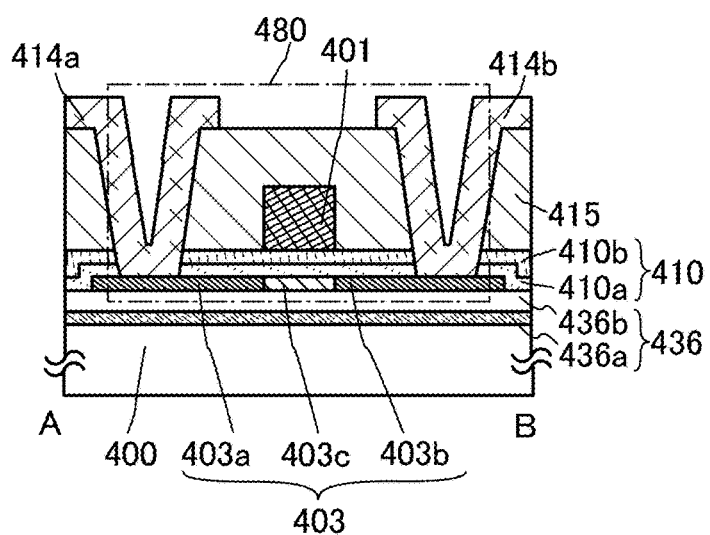
Figure 33C:
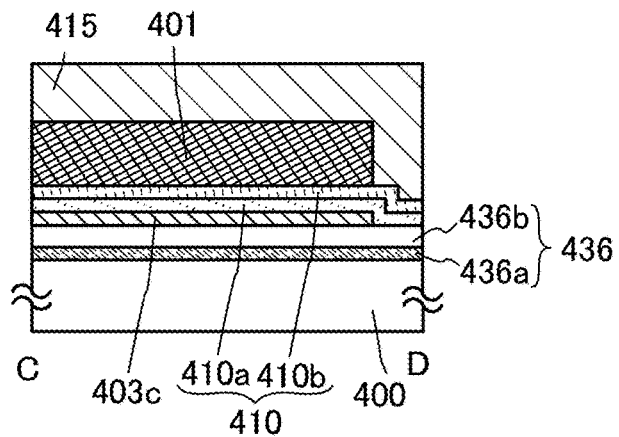

In this embodiment, another embodiment of a semiconductor device will be described with reference to FIGS. 33A to 33C. FIG. 33A is a top view of a transistor included in the semiconductor device, FIG. 33B is a cross-sectional view taken along dashed-dotted line A-B (channel length direction) in FIG. 33A, and FIG. 33C is a cross-sectional view taken along dashed-dotted line C-D in FIG. 33A. Note that some components illustrated in FIG. 33B or 33C are not illustrated in FIG. 33A for simplicity of the drawing.

A transistor 480 illustrated in FIGS. 33A to 33C includes, over the substrate 400 having an insulating surface and provided with the base insulating film 436, the oxide semiconductor film 403 including the channel formation region 403c, the source region 403a, and the drain region 403b; the gate insulating film 410 over the oxide semiconductor film 403; the gate electrode 401 overlapping with the oxide semiconductor film 403 over the gate insulating film 410; the interlayer insulating film 415 over the gate electrode 401 and the gate insulating film 410; and the wiring layer 414a and the wiring layer 414b which serve as the source electrode and the drain electrode, respectively, and are in contact with the oxide semiconductor film 403 through openings in the gate insulating film 410 and the interlayer insulating film 415.

As illustrated in FIG. 16A, the oxide semiconductor film 403 includes the first region 431, and the second region 432 and the third region 433 with part of the first region 431 interposed therebetween. The gate electrode 401 is provided so as to at least partly overlap with each of the first region 431 to the third region 433. Note that the oxide semiconductor film 403 illustrated in FIG. 16A has a different hatching pattern for simplicity of the drawing.

The first region 431 includes the channel formation region 403c overlapping with the gate electrode 401, and a pair of low-resistance regions (also referred to as the source region 403a and the drain region 403b because the low-resistance regions serve as the source region and the drain region) with the channel formation region 403c interposed therebetween. Further, each of the low-resistance regions is in contact with the channel formation region 403c and has a lower resistance than the channel formation region 403c. The length of each of the second region 432 and the third region 433 in the channel length direction is smaller than that of the first region 431 in the channel length direction.

A dopant is added to the oxide semiconductor film 403 with the use of the gate electrode 401 as a mask, whereby the source region 403a and the drain region 403b is formed with the channel formation region 403c interposed therebetween in the oxide semiconductor film 403. Further, each of the source region 403a and the drain region 403b is a low-resistance region having a lower resistance than the channel formation region 403c and containing the dopant. In this case, resist masks are formed over the second region 432 and the third region 433 of the oxide semiconductor film 403 so as to prevent the addition of the dopant thereto. In this manner, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced.

Further, the length of the outline of each of the second region 432 and the third region 433 of the oxide semiconductor film 403 (total length of double of length $L_1$ and length $L_2$, i.e., $2L_1+L_2$, in FIG. 33A) is larger than the length of the first region 431 in the channel width direction (length W in FIG. 33A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 33A; however, by increasing the length of the outline of each of the second region 432 and the third region 433 of the oxide semiconductor film 403, the leakage path becomes longer and resistance components at the outline increase. Thus, formation of a parasitic channel and an increase in leakage current can be suppressed at an end portion of the oxide semiconductor film 403 when the transistor is in an off-state. Even if oxygen desorbs from the channel formation region 403c, oxygen desorbs directly from a corner portion of the channel formation region 403c or indirectly from end portions of the second region 432 and the third region 433 of the oxide semiconductor film 403; therefore, the desorbed amount of oxygen is small. Thus, an influence on electrical characteristics of the transistor 480 can be reduced. Accordingly, electrical characteristics of the transistor 480 can be prevented from degrading and be favorable.

The dopant is an impurity which changes the conductivity of the oxide semiconductor film 403. Examples of a method for adding the dopant include an ion implantation method, an ion doping method, and a plasma immersion ion implantation method.

With the oxide semiconductor film 403 including the source region 403a and the drain region 403b with the channel formation region 403c interposed therebetween in the channel length direction, on-state characteristics (e.g., on-state current and field-effect mobility) of the transistor 480 are increased, which enables high-speed operation and high-speed response of the transistor 480.

An example of a method for manufacturing the semiconductor device including the transistor 480 will be described below.

FIG. 34A1 is a top view illustrating a step for manufacturing the transistor, FIG. 34A2 is a cross-sectional view taken along dashed-dotted line A-B in FIG. 34A1, and FIG. 34A3 is a cross-sectional view taken along dashed-dotted line C-D in FIG. 34A1.

First, a first base insulating film 436a is deposited over the substrate 400 having an insulating surface, and a second base insulating film 436b is deposited over the first base insulating film 436a, whereby the base insulating film 436 including the first base insulating film 436a and the second base insulating film 436b is formed. Then, the oxide semiconductor film 402 is formed over the base insulating film 436 (see FIG. 34A).

The first base insulating film 436a is preferably an insulating film serving as a barrier film that prevents the entry of an impurity that disperses from a layer(s) under the first base insulating film 436a. In particular, in the case where a single crystal silicon substrate, an SOI substrate, a substrate provided with a semiconductor element such as a transistor is used as the substrate 400, hydrogen and the like contained in the substrate can be prevented from dispersing and entering the later-formed oxide semiconductor film. The above first base insulating film 436a can be formed using, for example, a silicon nitride film, a silicon nitride oxide film, or an aluminum oxide film deposited by a plasma CVD method or a sputtering method. Note that in this specification and the like, silicon nitride oxide contains more nitrogen than oxygen.

In this embodiment, a silicon nitride film deposited by a plasma CVD method is used as the first base insulating film 436a.

The second base insulating film 436b is preferably an insulating film containing excessive oxygen (insulating film containing oxygen at an amount exceeding the stoichiometry), because in that case excessive oxygen contained in the second base insulating film 436b can repair an oxygen vacancy in the later-formed oxide semiconductor film. To make the second base insulating film 436b contain excessive oxygen, for example, the second base insulating film 436b is formed in an oxygen atmosphere. Alternatively, an oxygen-excess region may be formed by implanting oxygen (including at least one of an oxygen radical, an oxygen atom, and an oxygen ion) into the second base insulating film 436b after its deposition. Oxygen can be implanted by an ion implantation method, an ion doping method, a plasma immersion ion implantation method, plasma treatment, or the like.

Examples of the above second base insulating film 436b include a silicon oxynitride film or a silicon oxide film deposited by a plasma CVD method or a sputtering method. Oxygen can be supplied to any of these insulating films with, for example, an apparatus for etching treatment on a semiconductor device or an apparatus for ashing on a resist mask. Note that in this specification and the like, silicon oxynitride contains more oxygen than nitrogen.

In this embodiment, as the second base insulating film 436b, a silicon oxynitride film deposited by a plasma CVD method and subjected to plasma treatment in an atmosphere containing oxygen to contain excessive oxygen is used.

The oxide semiconductor film 402 can be formed using a material and a method which are similar to those of the oxide semiconductor film 403 in Embodiment 1.

Next, the oxide semiconductor film 402 is processed by a photolithography step, whereby the island-shaped oxide semiconductor film 403 is formed (see FIG. 34B). Here, as described above, the island-shaped oxide semiconductor film 403 has a shape such that the first region 431 is interposed between the second region 432 and the third region 433, and the length of each of the second region 432 and the third region 433 in the channel length direction is smaller than the length of the first region 431 in the channel length direction.

For a method for processing the oxide semiconductor film 402, Embodiment 1 can be referred to.

Next, the oxygen supplying film 410a is deposited to cover the oxide semiconductor film 403, and the barrier film 410b is deposited over the oxygen supplying film 410a, whereby the gate insulating film 410 including the oxygen supplying film 410a and the barrier film 410b is formed (see FIG. 35A).

The oxygen supplying film 410a and the barrier film 410b can be formed using materials and methods similar to those in Embodiment 1.

Then, the gate electrode 401 is formed to overlap with the first region 431 to the third region 433 over the barrier film 410b.

Here, a mask used for processing a conductive film (not shown) for forming the gate electrode 401 can be a mask having a finer pattern by sliming a mask formed by a photolithography method or the like.

As the slimming process, an ashing process in which oxygen in a radical state (an oxygen radical) or the like is used can be employed, for example. However, the slimming process is not limited to the ashing process as long as the mask formed by a photolithography method or the like can be processed into a finer pattern. Since the channel length of a transistor is determined by the mask formed by the slimming process, a process with high controllability can be employed as the slimming process.

As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, more preferably less than or equal to one third of the resolution limit of the light exposure apparatus. This enables further miniaturization of the transistor.

Next, the dopant 421 is added to the oxide semiconductor film 403 with the use of the gate electrode 401 as a mask, whereby the source region 403a and the drain region 403b are formed in the first region 431. In the first region 431, a region where the dopant 421 is not added serves as the channel formation region 403c (see FIG. 35B).

By forming resist masks over the second region 432 and the third region 433 of the oxide semiconductor film 403 so as to prevent the addition of the dopant thereto, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced. The source region 403a and the drain region 403b of the oxide semiconductor film 403, to which the dopant 421 is added, has a disordered crystal structure, and thus the oxide semiconductor film 403 becomes amorphous. The amorphous oxide semiconductor is likely to absorb an impurity which serves as a donor, such as hydrogen, from the channel formation region 403c having crystallinity, such as the CAAC-OS film. Accordingly, favorable transistor characteristics can be obtained.

Further, the length of the outline of each of the second region 432 and the third region 433 of the oxide semiconductor film 403 (total length of double of length $L_1$ and length $L_2$, i.e., $2L_1+L_2$, in FIG. 33A) is larger than the length of the first region 431 in the channel width direction (length W in FIG. 33A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 33A; however, by increasing the length of the outline of each of the second region 432 and the third region 433 of the oxide semiconductor film 403, the leakage path becomes longer and resistance components at the outline increase. Thus, formation of a parasitic channel and an increase in leakage current can be suppressed at an end portion of the oxide semiconductor film 403 when the transistor is in an off-state. Even if oxygen desorbs from the channel formation region 403c interposed between the source electrode 405a and the drain electrode 405b, oxygen desorbs directly from a corner portion of the channel formation region 403c or indirectly from end portions of the second region 432 and the third region 433 of the oxide semiconductor film 403; therefore, the desorbed amount of oxygen is small. Thus, an influence on electrical characteristics of the transistor 480 can be reduced. Accordingly, electrical characteristics of the transistor 480 can be prevented from degrading and be favorable.

For the material of the gate electrode 401 and the kinds, addition method, and the like of the dopant 421, Embodiment 1 can be referred to.

Next, the interlayer insulating film 415 is formed over the barrier film 410b and the gate electrode 401 (see FIG. 36A).

For the interlayer insulating film 415, Embodiment 1 can be referred to. The interlayer insulating film 415 has a thickness which is large enough to planarize unevenness caused by the transistor 480. Further, the interlayer insulating film 415 may have a stacked-layer structure of an oxygen supplying film and a barrier film, like the gate insulating film.

Next, the wiring layer 414a and the wiring layer 414b are formed to be in contact with the source region 403a and the drain region 403b, respectively, through openings provided in the interlayer insulating film 415 and the gate insulating film 410 (see FIG. 36B).

The wiring layers 414a and 414b can be formed using a material and a method which are similar to those of the gate electrode 401. In this manner, the transistor 480 can be manufactured.

As described above, with the transistor including the oxide semiconductor film formed in a cross shape by etching treatment so as to have different lengths in the channel length direction, it is possible to reduce the probability of electrical connection between the source electrode and the drain electrode of the transistor through a region (a region in which the resistance is lowered by desorption of oxygen (O) or the like) in the vicinity of a side surface (end surface) of the oxide semiconductor film.

Accordingly, it is possible to provide a transistor which has favorable transistor characteristics and includes an oxide semiconductor, and to provide a highly reliable semiconductor device which includes the transistor including the oxide semiconductor.

The methods and structures described in this embodiment can be combined as appropriate with any of the methods and structures described in the other embodiments.

Embodiment 5

Figure 37A:
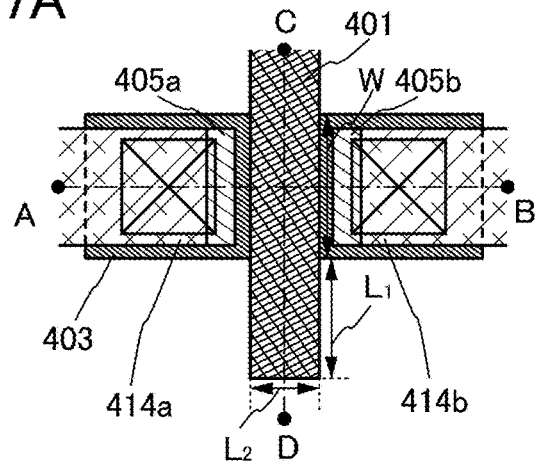
FIGS. 37A to 37C are a plan view and cross-sectional views illustrating one embodiment of a semiconductor device.
Figure 37B:
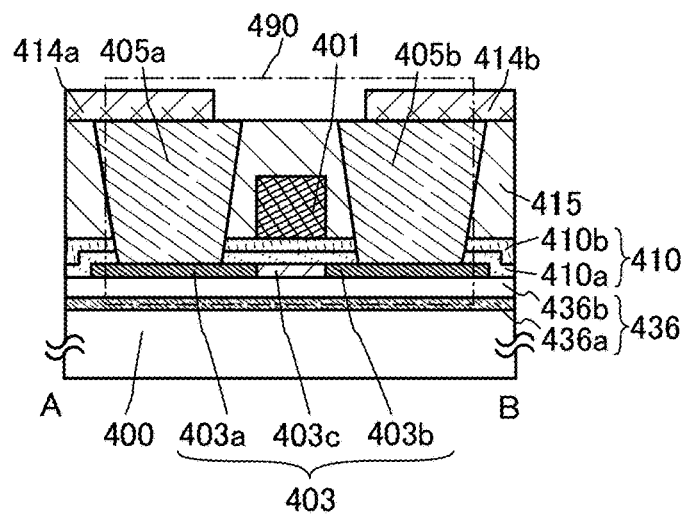
Figure 37C:
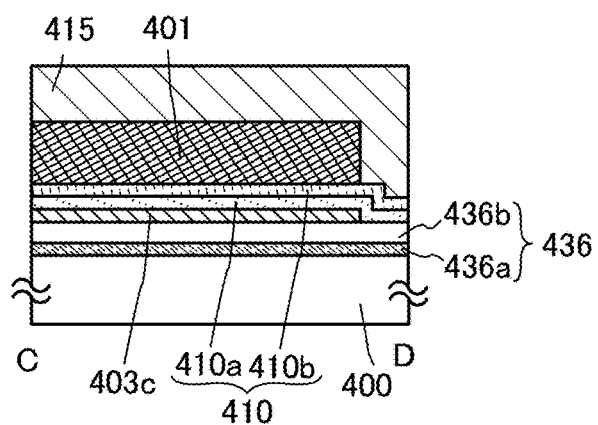

In this embodiment, another embodiment of a semiconductor device will be described with reference to FIGS. 37A to 37C. FIG. 37A is a top view of a transistor included in the semiconductor device, FIG. 37B is a cross-sectional view taken along dashed-dotted line A-B (channel length direction) in FIG. 37A, and FIG. 37C is a cross-sectional view taken along dashed-dotted line C-D in FIG. 37A. Note that some components illustrated in FIG. 37B or 37C are not illustrated in FIG. 37A for simplicity of the drawing.

A transistor 490 illustrated in FIGS. 37A to 37C includes, over the substrate 400 having an insulating surface and provided with the base insulating film 436, the oxide semiconductor film 403 including the channel formation region 403c, the source region 403a, and the drain region 403b; the gate insulating film 410 over the oxide semiconductor film 403; the gate electrode 401 overlapping, over the gate insulating film 410, with the oxide semiconductor film 403; the interlayer insulating film 415 over the gate electrode 401 and the gate insulating film 410; the source electrode 405a and the drain electrode 405b which are embedded in openings provided in the gate insulating film 410 and the interlayer insulating film 415 to be in contact with the oxide semiconductor film 403; and the wiring layer 414a and the wiring layer 414b which are formed over and in contact with the source electrode 405a and the drain electrode 405b, respectively.

As illustrated in FIG. 16A, the oxide semiconductor film 403 includes the first region 431, and the second region 432 and the third region 433 with part of the first region 431 interposed therebetween. The gate electrode 401 is provided so as to at least partly overlap with each of the first region 431 to the third region 433. Note that the oxide semiconductor film 403 illustrated in FIG. 16A has a different hatching pattern for simplicity of the drawing.

The first region 431 includes the channel formation region 403c overlapping with the gate electrode 401, and a pair of low-resistance regions (also referred to as the source region 403a and the drain region 403b because the low-resistance regions serve as the source region and the drain region) with the channel formation region 403c interposed therebetween.

Further, each of the low-resistance regions is in contact with the channel formation region 403c and has a lower resistance than the channel formation region 403c. The length of each of the second region 432 and the third region 433 in the channel length direction is smaller than that of the first region 431 in the channel length direction.

A dopant is added to the oxide semiconductor film 403 with the use of the gate electrode 401 as a mask, whereby the source region 403a and the drain region 403b is formed with the channel formation region 403c interposed therebetween in the oxide semiconductor film 403. Further, each of the source region 403a and the drain region 403b is a low-resistance region having a lower resistance than the channel formation region 403c and containing the dopant. In this case, resist masks are formed over the second region 432 and the third region 433 of the oxide semiconductor film 403 so as to prevent the addition of the dopant thereto. In this manner, the resistance of the outline of each of the second region 432 and the third region 433 of the oxide semiconductor film 403 is not lowered. Thus, leakage current flowing in an end portion of the oxide semiconductor film 403 when the transistor is in an off-state can be reduced.

Further, the length of the outline of each of the second region 432 and the third region 433 of the oxide semiconductor film 403 (total length of double of length $L_1$ and length $L_2$, i.e., $2L_1+L_2$, in FIG. 37A) is larger than the length of the first region 431 in the channel width direction (length W in FIG. 37A). Specifically, the length of the outline of each of the second region 432 and the third region 433 of the oxide semiconductor film 403 is three times or more, preferably ten times or more, as large as the length of the first region 431 in the channel width direction. If the oxide semiconductor film 403 has only the first region 431, a leakage path between the source electrode and the drain electrode would only have the length $L_2$ in FIG. 37A; however, by increasing the length of the outline of each of the second region 432 and the third region 433 of the oxide semiconductor film 403, the leakage path becomes longer and resistance components at the outline increase. Thus, formation of a parasitic channel and an increase in leakage current can be suppressed at an end portion of the oxide semiconductor film 403 when the transistor is in an off-state. Even if oxygen desorbs from the channel formation region 403c, oxygen desorbs directly from a corner portion of the channel formation region 403c or indirectly from end portions of the second region 432 and the third region 433 of the oxide semiconductor film 403; therefore, the desorbed amount of oxygen is small. Thus, an influence on electrical characteristics of the transistor 490 can be reduced. Accordingly, electrical characteristics of the transistor 490 can be prevented from degrading and be favorable.

The dopant is an impurity which changes the conductivity of the oxide semiconductor film 403. Examples of a method for adding the dopant include an ion implantation method, an ion doping method, and a plasma immersion ion implantation method.

With the oxide semiconductor film 403 including the source region 403a and the drain region 403b with the channel formation region 403c interposed therebetween in the channel length direction, on-state characteristics (e.g., on-state current and field-effect mobility) of the transistor 490 are increased, which enables high-speed operation and high-speed response of the transistor 490.

An example of a method for manufacturing the semiconductor device including the transistor 490 will be described below.

Figure 38A:
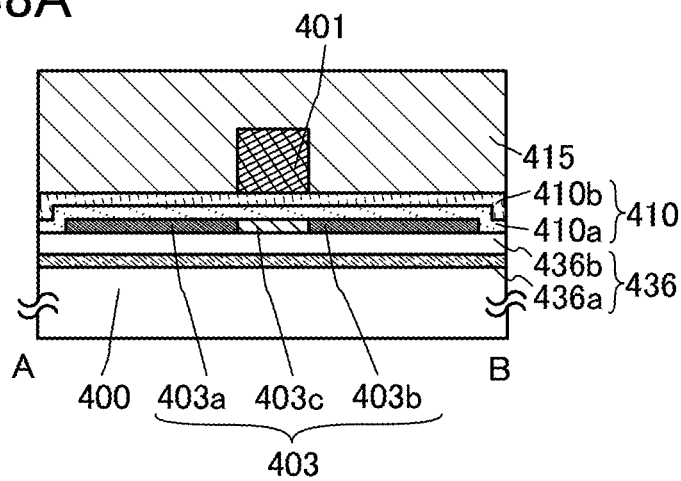
FIGS. 38A to 38C illustrate one embodiment of a method for manufacturing a semiconductor device.

The method for manufacturing the transistor 490 is the same as that for the transistor 480 in Embodiment 4 until the formation of the interlayer insulating film 415 (see FIG. 38A). Therefore, for details of the manufacturing method until the step in FIG. 38A, the manufacturing method until the step in FIG. 36A in Embodiment 4 can be referred to.

Figure 38B:
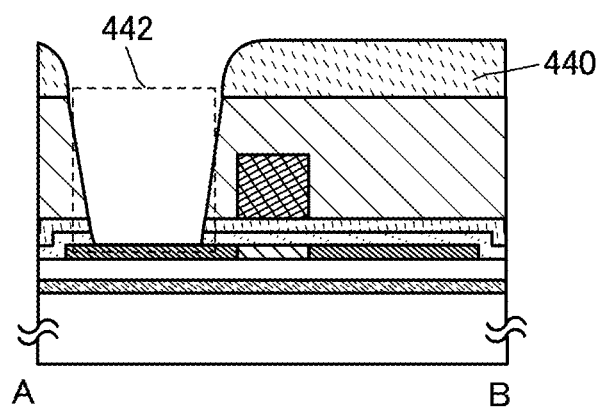

Next, a mask 440 is formed over the interlayer insulating film 415; and the interlayer insulating film 415, the oxygen supplying film 410a, and the barrier film 410b are etched with the use of the mask 440, whereby an opening 442 which reaches the oxide semiconductor film 403 (specifically, the source region 403a) is formed (see FIG. 38B).

The mask 440 can be formed by a photolithography method using a material such as a photoresist. For light exposure at the time of forming the mask 440, extreme ultraviolet light having a wavelength as short as several nanometers to several tens of nanometers is preferably used. In the light exposure by extreme ultraviolet light, the resolution is high and the focus depth is large. Thus, the mask 440 having a fine pattern can be formed.

Figure 38C:
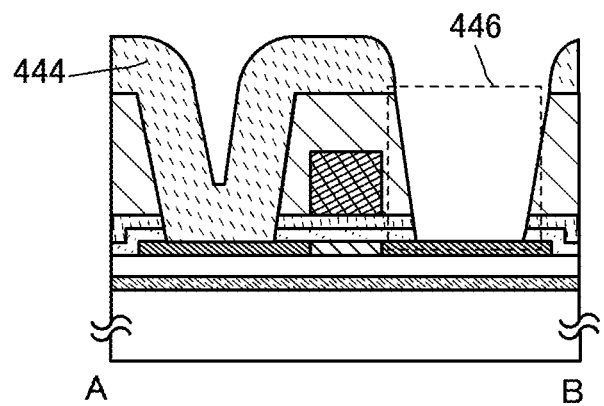

After the opening 442 is formed, the mask 440 is removed and then a mask 444 is formed over the opening 442 and the interlayer insulating film 415. The mask 444 can be formed in a manner similar to that of the mask 440. The interlayer insulating film 415, the oxygen supplying film 410a, and the barrier film 410b are etched with the use of the mask 444, whereby an opening 446 which reaches the oxide semiconductor film 403 (specifically, the drain region 403b) is formed (see FIG. 38C). Thus, a pair of openings with the gate electrode 401 interposed therebetween is formed in the interlayer insulating film 415, the oxygen supplying film 410a, and the barrier film 410b.

Figure 39A:
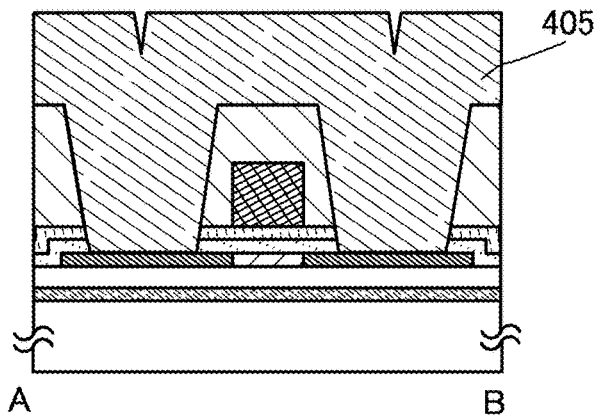
FIGS. 39A to 39C illustrate one embodiment of a method for manufacturing a semiconductor device.

Next, the conductive film 405 to be the source electrode 405a and the drain electrode 405b is deposited over the interlayer insulating film 415 to be embedded in the opening 442 and the opening 446 (see FIG. 39A). The conductive film 405 can be formed using a material and a method similar to those of the conductive film 405 in Embodiment 1.

Figure 39B:
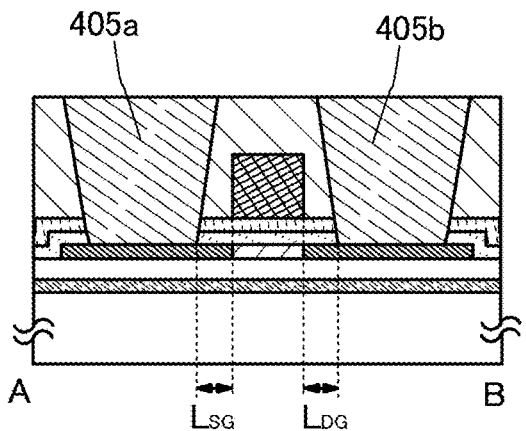

Next, removing (polishing) treatment is performed on the conductive film 405 (see FIG. 39B). The removing (polishing) treatment is performed on the conductive film 405 in order to remove the conductive film 405 provided over the interlayer insulating film 415 (at least a region overlapping with the gate electrode 401), whereby the source electrode 405a and the drain electrode 405b embedded in the opening 442 and the opening 446 can be formed. In this embodiment, through the CMP treatment performed on the conductive film 405 under such conditions that the surface of the interlayer insulating film 415 is exposed, the source electrode 405a and the drain electrode 405b are formed. Note that the surface of the interlayer insulating film 415 or the surface of the gate electrode 401 may also be polished depending on conditions of the CMP treatment.

As described above, the source electrode 405a and the drain electrode 405b are formed to be embedded in the openings provided in the interlayer insulating film 415, the oxygen supplying film 410a, and the barrier film 410b. Therefore, in the transistor 490, a distance ($L_{SG}$ in FIG. 39B) between the gate electrode 401 and a region where the source electrode 405a is in contact with the oxide semiconductor film 403 (a source side contact region) is determined by a distance between an end portion of the gate electrode 401 and an end portion of the opening 442. In the same manner, in the transistor 490, a distance ($L_{DG}$ in FIG. 39B) between the gate electrode 401 and a region where the drain electrode 405b is in contact with the oxide semiconductor film 403 (a drain side contact region) is determined by a distance between an end portion of the gate electrode 401 and an end portion of the opening 446.

In the case where the opening 442 for providing the source electrode 405a and the opening 446 for providing the drain electrode 405b are formed by performing etching treatment once, the minimum feature size of a width between the opening 442 and the opening 446 in the channel length direction is limited to a resolution limit of a light-exposure apparatus used for forming a mask. Therefore, it is difficult to reduce a distance between the opening 442 and the opening 446 sufficiently, so that it is also difficult to reduce the distances between the gate electrode 401 and the source side contact region ($L_{SG}$), and between the gate electrode 401 and the drain side contact region ($L_{DG}$).

However, in the manufacturing method shown in this embodiment, the opening 442 and the opening 446 are formed separately by different etching treatments using different masks; therefore, the position of the openings can be set freely without depending on the resolution limit of a light-exposure apparatus. By reducing $L_{SG}$ and $L_{DG}$, the resistance between the channel formation region 403c and the source electrode 405a (or the drain electrode 405b) of the transistor 490 can be reduced, so that the electrical characteristics of the transistor (e.g., on-state current characteristics) can be improved.

Further, since etching treatment using a resist mask is not performed in a step for removing the conductive film 405 over the interlayer insulating film 415 in order to form the source electrode 405a and the drain electrode 405b, fine processing can be performed accurately even in the case where the width between the source electrode 405a and the drain electrode 405b in the channel length direction is scaled-down. Thus, in the manufacturing process of the semiconductor device, the transistor 490 having little variation in shapes and characteristics and a minute structure can be manufactured with a high yield.

Figure 39C:
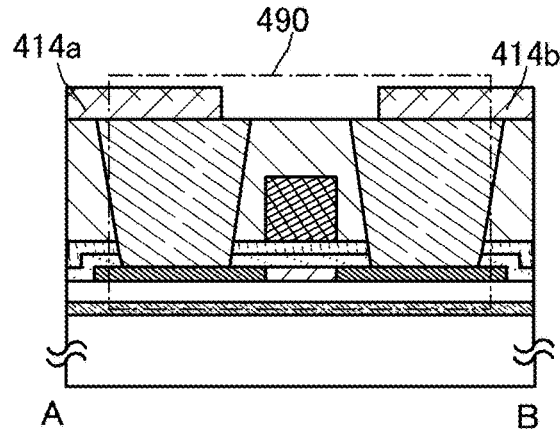

Next, a conductive film to be wiring layers (a source wiring and a drain wiring (including a wiring formed in the same layer as the wiring layers)) is deposited over the source electrode 405a, the drain electrode 405b, and the interlayer insulating film 415 and is processed, whereby the wiring layer 414a and the wiring layer 414b are formed (see FIG. 39C).

The wiring layers 414a and 414b can be formed using a material and a method which are similar to those of the gate electrode 401. In this manner, the transistor 490 can be manufactured.

As described above, the opening for providing the source electrode 405a and the opening for providing the drain electrode 405b are formed separately by different etching treatments using different masks. Thus, the transistor can be miniaturized sufficiently and distances between the gate electrode 401 and the source side contact region, and between the gate electrode 401 and the drain side contact region can be reduced sufficiently, so that the resistance between the channel formation region and the source electrode 405a (or the drain electrode 405b) of the transistor can be reduced. Accordingly, on-state characteristics (e.g., on-state current and field-effect mobility) among electrical characteristics of the transistor can be improved.

Further, in the step of removing the conductive film 405 over the interlayer insulating film 415 for forming the source electrode 405a and the drain electrode 405b, etching treatment using a resist mask is not performed, so that fine processing can be performed accurately even in the case where the distance between the source electrode 405a and the drain electrode 405b is reduced. Thus, in the manufacturing process of the semiconductor device, the transistor 490 having little variation in shapes and characteristics and a minute structure can be manufactured with a high yield.

As described above, with the transistor including the oxide semiconductor film formed in a cross shape by etching treatment so as to have different lengths in the channel length direction, it is possible to reduce the probability of electrical connection between the source electrode and the drain electrode of the transistor through a region (a region in which the resistance is lowered by desorption of oxygen (O) or the like) in the vicinity of a side surface (end surface) of the oxide semiconductor film.

Accordingly, it is possible to provide a transistor which has favorable transistor characteristics and includes an oxide semiconductor, and to provide a highly reliable semiconductor device which includes the transistor including the oxide semiconductor.

The methods and structures described in this embodiment can be combined as appropriate with any of the methods and structures described in the other embodiments.

Embodiment 6

Figure 40A:
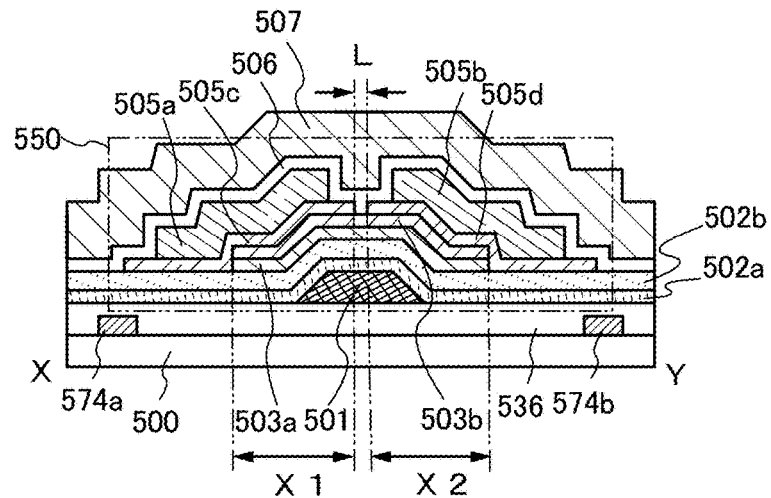
FIGS. 40A and 40B are a cross-sectional view and a plan view illustrating one embodiment of a semiconductor device.
Figure 40B:
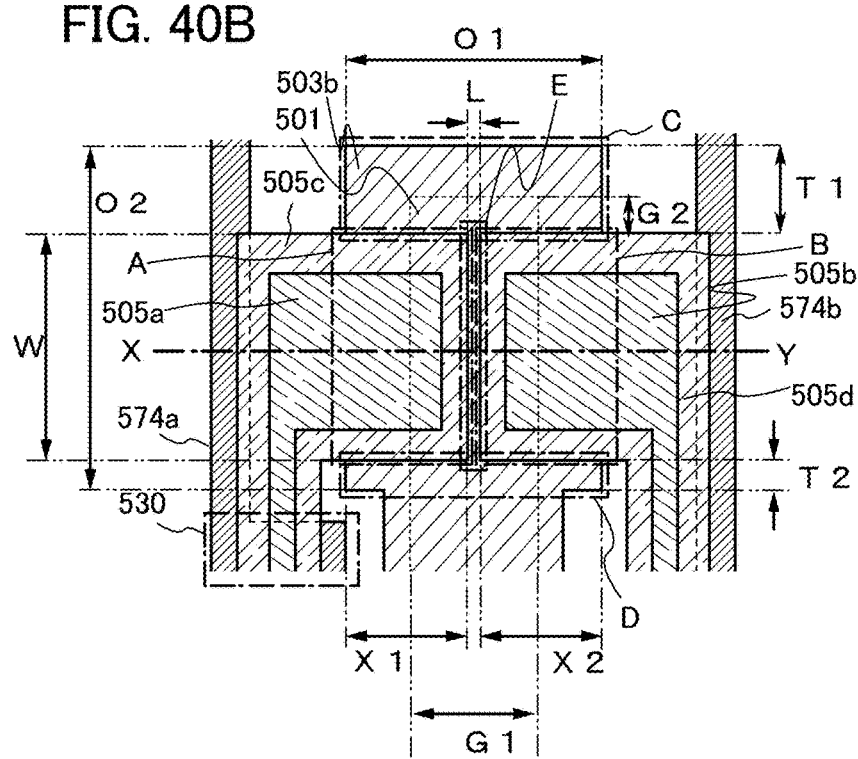

In this embodiment, another embodiment of a semiconductor device will be described with reference to FIGS. 40A and 40B. FIG. 40B is a top view of a transistor 550, and FIG. 40A is a cross-sectional view taken along X-Y in FIG. 40B. Note that some components illustrated in FIG. 40A are not illustrated in FIG. 40B for simplicity of the drawing.

The transistor 550 illustrated in FIGS. 40A and 40B includes a base insulating film 536 over a substrate 500; a gate electrode 501 provided over the base insulating film 536; a first gate insulating film 502a and a second gate insulating film 502b provided over the gate electrode 501; a first oxide semiconductor film 503a and a second oxide semiconductor film 503b provided over the gate electrode 501 with the first gate insulating film 502a and the second gate insulating film 502b interposed therebetween; a source electrode and a drain electrode provided over the second oxide semiconductor film 503b; an insulating film 506 provided over the source electrode, the drain electrode, the first oxide semiconductor film 503a, and the second oxide semiconductor film 503b; and an insulating film 507 provided over the insulating film 506.

The source electrode includes a stack of a first barrier layer 505c and a first low-resistance material layer 505a formed over the first barrier layer 505c, and the drain electrode includes a stack of a second barrier layer 505d and a second low-resistance material layer 505b formed over the second barrier layer 505d.

In the base insulating film 536, a wiring 574a and a wiring 574b are buried, and the wiring 574a and the source electrode (the first barrier layer 505c and the first low-resistance material layer 505a) form a capacitor 530.

In addition, the first oxide semiconductor film 503a and the second oxide semiconductor film 503b formed over the first oxide semiconductor film 503a form a stacked-layer structure of an oxide semiconductor film.

The oxide semiconductor film includes a channel region E, a first region A, a second region B, a third region C, and a fourth region D, as illustrated in FIG. 40B.

At least each part of the first region A, the second region B, the third region C, and the fourth region D overlaps with the gate electrode 501.

It is preferable that the oxide semiconductor film be formed to overlap with the gate electrode 501 in the first region A, the second region B, the third region C, and the fourth region D.

The first region A and the second region B are in contact with part of the channel region E with the channel region E interposed therebetween.

The first region A, the second region B, and the channel region E are sandwiched between the third region C and the fourth region D, which are in contact with part of the channel region E.

The first region A is in contact with the first barrier layer 505$c$. Note that the area where the oxide semiconductor film is in contact with the first barrier layer 505$c$ is equal to the area of the first region A.

The second region B is in contact with the second barrier layer 505$d$. Note that the area where the oxide semiconductor film is in contact with the second barrier layer 505$d$ is equal to the area of the second region B.

Side surfaces of the first oxide semiconductor film are aligned with side surfaces of the second oxide semiconductor film. Note that the side surfaces of the first oxide semiconductor film and the second oxide semiconductor film which are stacked each other are lowered in resistance.

The outline of the oxide semiconductor film is provided at a distance from the gate electrode 501, which is specifically described with reference to FIG. 40B. The channel length and the channel width of the transistor 550 are referred to as a distance L and a distance W, respectively. As for the oxide semiconductor film, the length in the channel length direction and the length in the channel width direction are referred to as a distance O1 and a distance O2, respectively. The length of the gate electrode in the channel length direction is referred to as a distance G1. Further, the length of the first region A in the channel length direction is referred to as a distance X1, and the length of the second region B in the channel length direction is referred to as a distance X2. The length of the third region C in the channel length direction and the length of the fourth region D in the channel length direction are both referred to as a distance (X1+X2+L). The length of the third region C in the channel width direction is referred to as a distance T1. The length of the fourth region D in the channel width direction is referred to as a distance T2.

The length of the oxide semiconductor film in the channel length direction (the distance O1) is equal to the length of the third region C in the channel length direction and the length of the fourth region D in the channel length direction. The length of the oxide semiconductor film in the channel length direction (the distance O1) is equal to the sum of the length of the first region A (the distance X1), the length of the second region B (the distance X2) in the channel length direction, and the channel length (the distance L).

In the transistor 550, the outline of the oxide semiconductor film is preferably provided at a distance from the gate electrode 501. Thus, the distance O1 is preferably longer than the distance G1.

The length of the oxide semiconductor film in the channel width direction (the distance O2) is equal to the sum of the lengths of the third region C (the distance T1), the fourth region D (the distance T2), and the first region A or the second region B (the distance W) in the channel length direction.

The distance O2 is preferably longer than the distance W. Therefore, the distance T1 is at least longer than or equal to the distance L, and the distance T2 is preferably longer than or equal to the distance L. Note that the length of the distance T1 may be different from that of the distance T2.

Further, in the third region C, the length of the gate electrode 501 overlapping with the oxide semiconductor film in the channel width direction is referred to as a distance G2. Since in the transistor 550, the outline of the oxide semiconductor film is preferably provided at a distance from the gate electrode 501, the distance G2 is preferably shorter than the distance T1. When the outline of the oxide semiconductor film is provided at a distance from the gate electrode 501 in the third region C, formation of a parasitic channel and an increase in leakage current can be suppressed.

Note that the distance G2 is preferably longer than the distance L.

There is no particular limitation on the lengths of the distance G1, the distance T1, the distance T2, and the distance O1.

Note that as shown in FIGS. 40A and 40B, the channel length of the transistor 550 (the distance L) denotes the distance between the first barrier layer 505$c$ and the second barrier layer 505$d$. The distance L is determined by the width of a pattern of a resist mask formed by exposure to an electron beam. The distance L is preferably less than 50 nm.

In the source electrode and the drain electrode, the thickness of regions where the first barrier layer 505$c$ and the second barrier layer 505$d$ overlap respectively with the first low-resistance material layer 505$a$ and the second low-resistance material layer 505$b$ is greater than the thickness of regions where they do not overlap with each other.

Note that the first barrier layer 505$c$ and the second barrier layer 505$d$ have a thickness of greater than or equal to 5 nm and less than or equal to 30 nm, preferably 10 nm or less.

The thickness of the insulating film 507 is greater than that of the insulating film 506.

The thickness of the insulating film 506 is greater than 10 nm and smaller than 100 nm.

The thickness of the first gate insulating film 502$a$ can be greater than or equal to 20 nm and less than or equal to 350 nm. The thickness of the second gate insulating film 502$b$ can be greater than or equal to 50 nm and less than or equal to 300 nm.

The thickness of the first oxide semiconductor film 503$a$ can be greater than or equal to 1 nm and less than or equal to 100 nm (preferably greater than or equal to 5 nm and less than or equal to 50 nm). The thickness of the second oxide semiconductor film 503$b$ can be greater than or equal to 1 nm and less than or equal to 100 nm (preferably greater than or equal to 5 nm and less than or equal to 50 nm).

As described above, when a transistor in which the outlines of the first oxide semiconductor film and the second oxide semiconductor film are provided at a distance from the gate electrode is formed, an increase in leakage current caused by a parasitic channel generated by an overlap of the low-resistance outline and the gate electrode can be suppressed. In addition, accuracy of minute processing is increased by precise exposure to an electron beam, so that the channel length can be less than 50 nm.

The substrate 500, the gate electrode 501, and the base insulating film 536 can be formed using a material and a method which are similar to those of the substrate 400, the gate electrode 401, and the base insulating film 436 in Embodiment 1.

The first gate insulating film 502$a$ and the second gate insulating film 502$b$ can be formed using a material and a method similar to those of the barrier film 409$b$ and the oxygen supplying film 409$a$ in Embodiment 1.

Aluminum or the like can be used as a material of the first low-resistance material layer 505a and the second low-resistance material layer 505b. Titanium, tungsten, molybdenum, titanium nitride, tantalum nitride, or the like can be used as a material of the first barrier layer 505c and the second barrier layer 505d. The first barrier layer 505c and the second barrier layer 505d prevent the first low-resistance material layer 505a and the second low-resistance material layer 505b, respectively, from being oxidized by being in contact with the oxide semiconductor film 503.

As a material of the insulating film 506, an insulating layer containing excess oxygen. A $SiO_x$ film containing much oxygen as a result of film formation under the conditions which are set as appropriate for a PECVD method or a sputtering method can be used. In order to make the insulating layer contain much more excess oxygen, oxygen may be added as appropriate by an ion implantation method, an ion doping method, or plasma treatment.

The insulating film 507 is a blocking layer for preventing oxygen from being released from the oxide semiconductor film. As a material for the insulating film 507, an aluminum oxide film, a titanium oxide film, a nickel oxide film, a molybdenum film, a tungsten oxide film, or the like can be used. The aluminum oxide film has a high shielding effect (blocking effect) of preventing penetration of both oxygen and impurities such as hydrogen and moisture.

The aluminum oxide film may be formed by performing an oxygen doping treatment on an aluminum film. Higher productivity can be achieved by using the method for oxidizing the aluminum film than a PECVD method, a sputtering method, or the like. Note that an oxygen doping treatment may be performed plural times. As a material for a metal film subjected to an oxygen doping treatment, a titanium film, an aluminum film to which magnesium is added, an aluminum film to which titanium is added, or the like can be used.

Alternatively, the insulating film 507 may be formed with a stacked-layer structure of two or more layers. For example, a structure in which a titanium oxide film and an aluminum oxide film are stacked from the oxide semiconductor film side. Another example is a structure in which an aluminum oxide film and a titanium oxide film are stacked in this order from the oxide semiconductor film side.

Next, one example of a method for manufacturing the first barrier layer 505c and the second barrier layer 505d will be described with reference to FIGS. 41A to 41C. A conductive film is etched using a resist mask formed by exposure to an electron beam, so that the first barrier layer 505c, the second barrier layer 505d, and the channel region are formed. Accuracy of minute processing is increased by precise exposure to an electron beam, so that the distance L (channel length) between the first barrier layer 505c and the second barrier layer 505d can be less than 50 nm (e.g., 20 nm or 30 nm). Note that a more specific method for manufacturing a transistor will be described below.

Figure 41A:
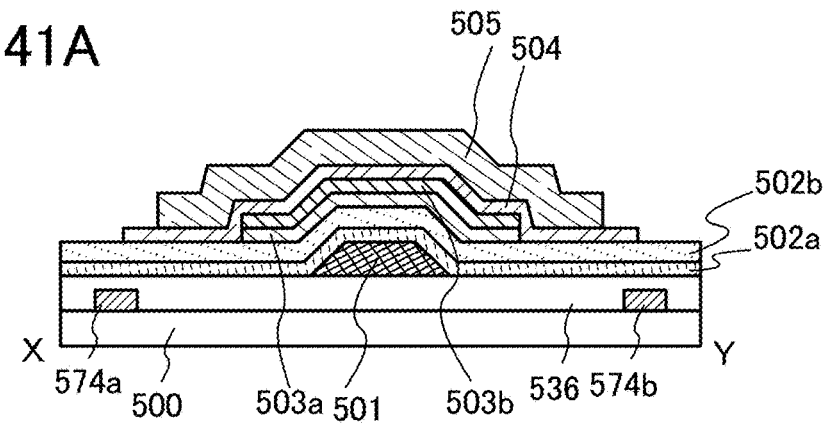
FIGS. 41A to 41C illustrate one embodiment of a method for manufacturing a semiconductor device.
Figure 41B:
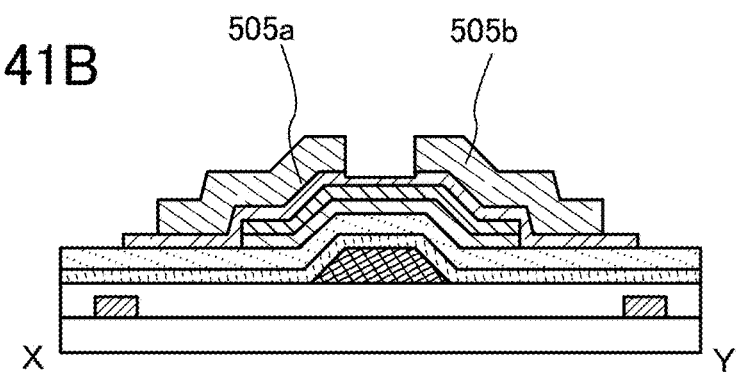
Figure 41C:
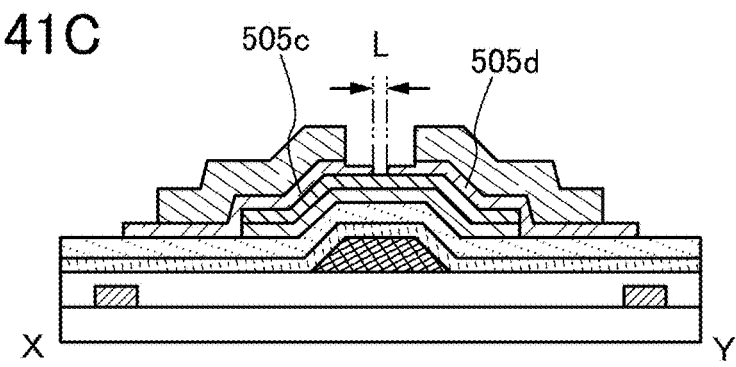

A conductive film 504 which is to be the first barrier layer 505c and the second barrier layer 505d and a conductive film 505 which is to be the first low-resistance material layer 505a and the second low-resistance material layer 505b are deposited over the first oxide semiconductor film 503a and the second oxide semiconductor film 503b (see FIG. 41A).

Next, a first resist mask is formed over the conductive film 505 through a photolithography process, and selective etching is performed. Thus, the first low-resistance material layer 505a and the second low-resistance material layer 505b are formed (see FIG. 41B).

At this time, together with the conductive film 505, the conductive film 504 may also be etched and become thinner. Therefore, it is preferable to employ etching conditions where the etching selectivity of the conductive film 505 to the conductive film 504 is high. When the etching selectivity of the conductive film 505 to the conductive film 504 is high, the thickness decrease of the conductive film 504 can be suppressed.

Then, a resist is formed over the conductive film 504 and subjected to exposure to an electron beam; thus, a second resist mask is formed. The second resist mask is formed so as to overlap with a portion other than a channel region of the transistor 550. Using the second resist mask, the conductive film 504 is etched; thus, the first barrier layer 505c and the second barrier layer 505d are formed (see FIG. 41C).

As a resist material, a siloxane-based resist, a polystyrene-based resist, or the like can be used, for example. Note that it is preferable to use a positive resist rather than a negative resist because a pattern with a small width is to be formed. For example, in the case where the width of the pattern is 30 nm, the thickness of the resist can be 30 nm.

Here, in an electron beam writing apparatus capable of electron beam irradiation, the acceleration voltage is preferably in the range from 5 kV to 50 kV, for example. The current intensity is preferably $5 \times 10^{-12}$ A to $1 \times 10^{-11}$ A. The minimum beam size is preferably 2 nm or less. The minimum possible pattern line width is preferably 8 nm or less.

At a higher acceleration voltage, an electron beam can provide a more precise pattern. The use of multiple electron beams can shorten the process time per substrate.

Under the above conditions, a pattern with a width of, for example, 30 nm or less, preferably 20 nm or less, more preferably 8 nm or less, can be obtained.

Note that the method is described here in which after the first low-resistance material layer 505a and the second low-resistance material layer 505b are formed, the resist mask is formed by exposure to an electron beam and the first barrier layer 505c and the second barrier layer 505d are formed. However, the order of forming the first and second low-resistance material layers and the first and second barrier layers is not limited thereto.

Note that the substrate 500 is provided with a semiconductor element, which is not illustrated here for simplicity. Further, the wiring 574a, the wiring 574b, and the base insulating film 536 covering the wiring 574a and the wiring 574b are provided over the substrate 500 and included in a memory shown in FIG. 17C in Embodiment 8 described below.

According to this embodiment, when the outline of the two-layered oxide semiconductor film is provided at a distance from the gate electrode, a transistor with high yield can be provided. Accuracy of minute processing is increased by precise exposure to an electron beam, so that a transistor with a channel length of 50 nm or less can be provided.

The methods and structures described in this embodiment can be combined as appropriate with any of the methods and structures described in the other embodiments.

Embodiment 7

Figure 42A:
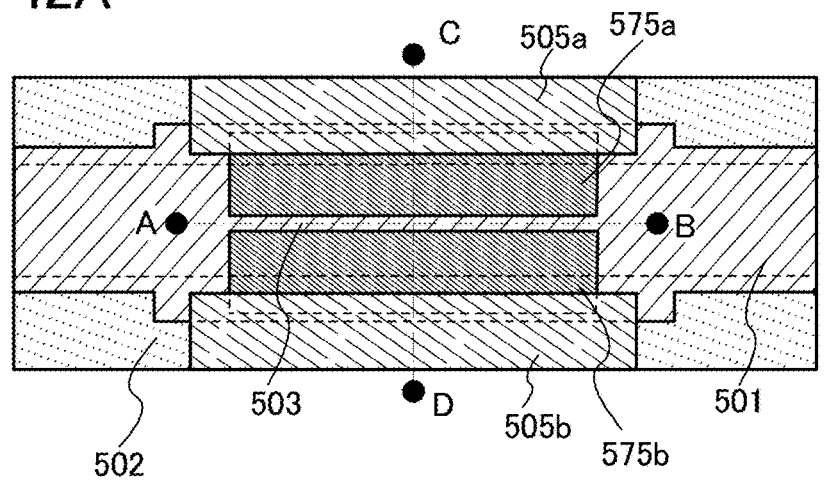
FIGS. 42A to 42C are a plan view and cross-sectional views illustrating one embodiment of a semiconductor device.
Figure 42B:
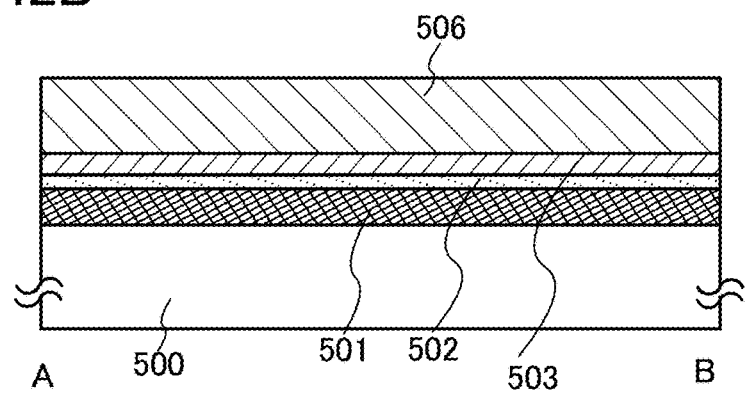
Figure 42C:
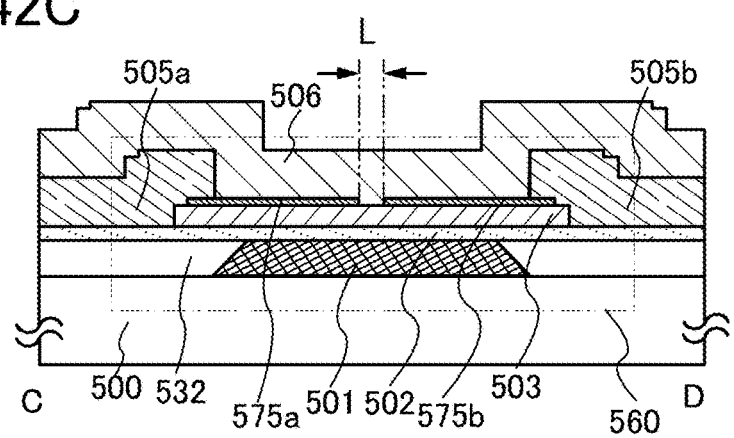

In this embodiment, a semiconductor device of another embodiment, which is different from the semiconductor device described in Embodiment 6, and a method for manufacturing the semiconductor device will be described. FIG. 42A is a top view of a transistor included in the semiconductor device. FIG. 42B is a cross-sectional view taken along dashed-dotted line A-B (channel length direction) in FIG. 42A. FIG. 42C is a cross-sectional view taken along dashed-dotted line C-D in FIG. 42A. Note that some components illustrated in FIG. 42B or 42C are not illustrated in FIG. 42A for simplicity of the drawing.

Note that, in this embodiment, portions that are similar to the portions in Embodiment 6 are denoted by the same reference numerals in the drawings, and detailed description thereof is skipped.

A transistor 560 illustrated in FIGS. 42A to 42C includes the gate electrode 501 over the substrate 500, a base insulating film 532 which is in contact with side surfaces of the gate electrode 501 and in which the gate electrode 501 is embedded, a gate insulating film 502 over the base insulating film 532 and the gate electrode 501, an oxide semiconductor film 503 formed over the gate electrode 501 with the gate insulating film 502 provided therebetween, a source electrode stacked over the oxide semiconductor film 503, a drain electrode stacked over the oxide semiconductor film 503, and the insulating film 506 formed over the source electrode and the drain electrode.

The source electrode includes a first barrier layer 575a and a first low-resistance material layer 505a in contact with the first barrier layer 575a. The drain electrode includes a second barrier layer 575b and a second low-resistance material layer 505b in contact with the second barrier layer 575b. The first barrier layer 575a and the second barrier layer 575b prevent the first low-resistance material layer 505a and the second low-resistance material layer 505b, respectively, from being oxidized by being in contact with the oxide semiconductor film 503. Note that the first low-resistance material layer 505a and the second low-resistance material layer 505b are each in contact with the side surface of the oxide semiconductor film 503; however, the first barrier layer 575a and the second barrier layer 575b prevent the first low-resistance material layer 505a and the second low-resistance material layer 505b from being oxidized because the oxide semiconductor film 503 is sufficiently thin.

In addition, as illustrated in FIG. 42A, the outline of the oxide semiconductor film 503 does not overlap with the gate electrode 501. The width of the oxide semiconductor film 503 in the channel width direction (in the direction C-D in FIGS. 42A to 42C) is longer than the width of the gate electrode 501 in the channel width direction. There is no particular limitation on the length of the width. When the outline of the oxide semiconductor film 503 is provided at a distance from the gate electrode 501, an increase in leakage current caused by a parasitic channel generated by an overlap of the low-resistance outline of the oxide semiconductor film 503 and the gate electrode can be suppressed.

As illustrated in FIG. 42C, the distance L between the first barrier layer 575a and the second barrier layer 575b denotes the channel length of the transistor 560. The distance L is determined by the width of a pattern of a resist mask formed by exposure to an electron beam. Accuracy of minute processing is increased by precise exposure to an electron beam, so that the transistor 560 with a channel length of 50 nm or less can be provided.

An example of a method for manufacturing the semiconductor device including the transistor 560 is illustrated in FIGS. 43A1 to 43A3, 43B1 to 43B3, and 43C1 to 43C3, FIGS. 44A1 to 44A3, 44B1 to 44B3, and 44C1 to 44C3, FIGS. 45A1 to 45A3, 45B1 to 45B3, and 45C1 to 45C3, and FIGS. 467A1 to 46A3 and 46B1 to 46B3, and FIGS. 47A1 to 47A3, 47B1 to 47B3, and 47C1 to 47C3.

FIG. 43A1 is a top view for explaining a manufacturing process of a transistor. FIG. 43A2 is a cross-sectional view taken along a dashed-dotted line A-B in FIG. 43A1. FIG. 43A3 is a cross-sectional view taken along a dashed-dotted line C-D in FIG. 43A1.

First, a conductive film is formed over the substrate 500 having an insulating surface and is etched into the gate electrode 501. Then, an insulating film to be the base insulating film 532 is formed to cover the gate electrode 501 and the substrate 500. Further, the insulating film is subjected to removing (polishing) treatment or etching treatment, so that the upper surface of the gate electrode 501 becomes exposed and not covered with the insulating film. Thus, the base insulating film 532 whose upper surface is at the same level as the upper surface of the gate electrode 501 is formed (see FIG. 43A).

When the base insulating film 532 is provided, the coverage of the gate electrode 501 with the gate insulating film 502 can be improved. In addition, a surface on which a resist mask is to be formed in a later step through exposure to an electron beam can be flat; thus, the resist mask which is thin can be formed.

Note that in this embodiment, the method is described in which the base insulating film 532 is formed after the gate electrode 501 is formed; however, a method for forming the gate electrode 501 and the base insulating film 532 is not limited thereto. For example, the gate electrode 501 may be formed as follows: the base insulating film 532 is provided over the substrate 500, an opening is formed in the base insulating film 532 by an etching step or the like, and the opening is filled with a conductive material.

The substrate 500, the gate electrode 501, and the base insulating film 532 can be formed using a material and a method which are similar to those of the substrate 400, the gate electrode 401, and the base insulating film 436 in Embodiment 1.

Next, the gate insulating film 502 is formed over the gate electrode 501 and the base insulating film 532 (see FIG. 43B).

The gate insulating film 502 can be formed using a material and a method which are similar to those of the gate insulating film 410 in Embodiment 1.

Next, the oxide semiconductor film 541 is formed over the gate insulating film 502. Then, the oxide semiconductor film 541 and the gate insulating film 502 are subjected to oxygen doping treatment; thus, the oxide semiconductor film 541 and the gate insulating film 502 which excessively contain oxygen 551 are formed (see FIG. 43C).

The oxide semiconductor film 541 can be formed using a material and a method which are similar to those of the oxide semiconductor film 403 in Embodiment 1.

Then, a conductive film 575 is formed over the oxide semiconductor film 541 (see FIG. 44A).

The conductive film 575 is to be processed into the first barrier layer 575a and the second barrier layer 575b, which are one layer of the drain electrode and one layer of the source electrode, respectively.

As the conductive film 575, it is possible to use, for example, a metal layer containing an element selected from Al, Cr, Cu, Ta, Ti, Mo, and W, a metal nitride layer containing any of these elements as its component (a titanium nitride layer, a molybdenum nitride layer, or a tungsten nitride layer), or the like. Alternatively, a layer of a high-melting-point metal such as Ti, Mo, or W or a metal nitride layer thereof (e.g., a titanium nitride layer, a molybdenum nitride layer, or a tungsten nitride layer) may be formed over and/or under a metal layer of Al, Cu, or the like. Alternatively, the conductive film may be formed using a conductive metal oxide. As the conductive metal oxide, indium oxide (In$_2$O$_3$), tin oxide (SnO$_2$), zinc oxide (ZnO), an indium oxide-tin oxide alloy (In$_2$O$_3$—SnO$_2$), indium oxide-zinc oxide alloy (In$_2$O$_3$—ZnO), or any of these metal oxide materials in which silicon oxide is contained can be used.

Then, a resist is formed over the conductive film 575 and subjected to exposure to an electron beam; thus, a resist mask 553 is formed (see FIG. 44B). The positive resist mask 553 is formed so as to overlap with a portion other than a channel region of the transistor 560.

A method for forming a resist mask by exposure to an electron beam is described in detail in Embodiment 6, and therefore the description is omitted here. Note that in Embodiment 6, the method is described in which after the first low-resistance material layer 505a and the second low-resistance material layer 505b are formed, the resist mask is formed by exposure to an electron beam and the first barrier layer 575a and the second barrier layer 575b are formed by etching with the mask. In Embodiment 7, a method is described in which etching for the first barrier layer 575a and the second barrier layer 575b is performed earlier.

For the exposure to an electron beam, the resist mask 553 is preferably as thin as possible. To make the resist mask 553 thin, a surface on which the resist mask is formed is preferably as flat as possible. In the method for manufacturing the semiconductor device of this embodiment, the unevenness due to the gate electrode 501 and the base insulating film 532 can be reduced by planarization treatment of the gate electrode 501 and the base insulating film 532; thus, the resist mask can be thin. This facilitates the exposure to an electron beam.

Next, the conductive film 575 is selectively etched using the resist mask 553 as a mask; thus, an opening is formed in a region where a channel is formed (see FIG. 44C). Here, the region from which the conductive film 575 has been removed serves as a channel formation region of the transistor 560. Accuracy of minute processing is increased by precise exposure to an electron beam, so that the channel length can be less than 50 nm (e.g., 20 nm or 30 nm).

At that time, it is preferable to employ etching conditions where the etching selectivity of the conductive film 575 to the resist mask 553 is high. For example, it is preferable to employ dry etching using a mixed gas of Cl$_2$ and HBr as an etching gas with the flow rate of HBr higher than the flow rate of Cl$_2$. For example, it is preferable that the flow rate ratio be Cl$_2$:HBr=20:80. In the case of etching with inductively coupled plasma (also referred to as ICP etching) with an ICP power of 500 W, the etching selectivity of the conductive film to the resist mask 553 can be high when the bias power is set to 30 W to 40 W.

Then, a resist mask 555 is provided over the oxide semiconductor film 541 and the conductive film 575 through a photolithography process (see FIG. 45A).

The outline of the resist mask 555 is formed not to overlap with the gate electrode 501. As illustrated in FIG. 45A, there is a distance H between one end of the resist mask 555 and one end of the gate electrode 501, and there is a distance F between the other end of the resist mask 555 and the other end of the gate electrode 501.

Note that the resist mask 555 may be formed by an ink-jet method. Formation of the resist mask by an inkjet method needs no photomask; thus, manufacturing cost can be reduced.

Next, the conductive film 575 and the oxide semiconductor film 541 are etched in this order using the resist mask 555. By etching the conductive film 575, the oxide semiconductor film 503 which has a shape similar to the shape of the resist mask 555 is formed (see FIG. 45B). The outline of the oxide semiconductor film 503 is provided at a distance from the gate electrode 501.

The conductive film 575 can be etched using a gas containing chlorine, for example, a gas containing chlorine (Cl$_2$), boron trichloride (BCl$_3$), silicon tetrachloride (SiCl$_4$), or carbon tetrachloride (CCl$_4$). Alternatively, a gas containing fluorine such as a gas containing carbon tetrafluoride (CF$_4$), sulfur hexafluoride (SF$_6$), nitrogen trifluoride (NF$_3$), or trifluoromethane (CHF$_3$) can be used. Alternatively, any of these gases to which a rare gas such as helium (He) or argon (Ar) is added, or the like can be used.

For example, a parallel plate RIE (reactive ion etching) method or an ICP (inductively coupled plasma) etching method can be used as an etching method. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, a titanium film is used as the conductive film 575 and a dry etching method is used as an etching method.

Note that it is preferable that etching conditions be optimized so as not to etch and divide the oxide semiconductor film 541 when the conductive film 575 is etched. However, it is difficult to obtain etching conditions in which only the conductive film is etched and the oxide semiconductor film 541 is not etched at all. In some cases, part of the oxide semiconductor film 541 is etched off through the etching of the conductive film, so that an oxide semiconductor film having a groove (depressed portion) is formed.

The resist mask 555 is removed, and then, a resist mask 557 is formed over the oxide semiconductor film 503 and the etched conductive film 575 by a photolithography process (see FIG. 45C).

The resist mask 557 can be formed using a method similar to that of the resist mask 555.

Next, the etched conductive film 575 is further etched using the resist mask 557 to form the island-shaped first barrier layer 575a and the island-shaped second barrier layer 575b (see FIG. 46A).

Note that it is difficult to obtain etching conditions in which only the conductive film is etched and the oxide semiconductor film 503 is not etched at all, in order to form the island-shaped first barrier layer 575a and the island-shaped second barrier layer 575b. In some cases, part of the oxide semiconductor film 503 is etched off, so that the oxide semiconductor film 503 having a groove (depressed portion) is formed.

Next, the resist mask 557 is removed, and then a conductive film 552 is formed over the oxide semiconductor film 503, the island-shaped first barrier layer 575a, and the island-shaped second barrier layer 575b (see FIG. 46B). The outline of the oxide semiconductor film 503 is preferably provided at a distance from the gate electrode 501.

The conductive film 552 is to be processed into the first low-resistance material layer 505a and the second low-resistance material layer 505b.

Note that in the drawings, the first barrier layer 575a and the second barrier layer 575b are thinner than the conductive film 552 to be the first low-resistance material layer 505a and the second low-resistance material layer 505b; however, the present invention is not limited thereto. The first barrier layer 575a and the second barrier layer 575b are formed using the resist mask which is formed by the electron beam exposure, and are therefore preferably thin in terms of the manufacturing process. In addition, when the conductive film 552 to be the first low-resistance material layer 505a and the second low-resistance material layer 505b are formed thick, the resistance of the source electrode and the drain electrode can be lowered.

In addition, the distance between the first barrier layer 575a and the second barrier layer 575b is shorter than the distance between the first low-resistance material layer 505a and the second low-resistance material layer 505b. In particular, when the first barrier layer 575a and the second barrier layer 575b have higher resistance than the first low-resistance material layer 505a and the second low-resistance material layer 505b, the resistance between the source electrode, the oxide semiconductor film 503, and the drain electrode can be lowered by shorting the distance between the first barrier layer 575a and the second barrier layer 575b.

Next, a resist mask 556 is formed over the conductive film 552 through a photolithography process (see FIG. 47A), and selective etching is performed. Thus, the first low-resistance material layer 505a and the second low-resistance material layer 505b are formed. After the first low-resistance material layer 505a and the second low-resistance material layer 505b are formed, the resist mask is removed (see FIG. 47B).

The first barrier layer 575a and the first low-resistance material layer 505a function as the source electrode of the transistor 560. The second barrier layer 575b and the second low-resistance material layer 505b function as the drain electrode of the transistor 560.

The conductive film 552 can be etched under conditions similar to those for the conductive film 575.

Through the above-described process, the transistor 560 of this embodiment can be manufactured.

In this embodiment, the insulating film 506 is formed over the stacked source electrode, the stacked drain electrode, and the oxide semiconductor film 503 (see FIG. 47C).

As the insulating film 506, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

Note that the insulating film 506 may be subjected to oxygen doping treatment. When the insulating film 506 is subjected to the oxygen doping treatment, the oxide semiconductor film 503 can be supplied with oxygen. The oxygen doping of the insulating film 506 can be similar to the above-described oxygen doping treatment of the insulating film 506 and the oxide semiconductor film 503.

Alternatively, a dense inorganic insulating film may be provided over the insulating film 506. For example, an aluminum oxide film is formed over the insulating film 506 by a sputtering method. Note that when the aluminum oxide film has high density (film density higher than or equal to 3.2 g/cm$^3$, preferably higher than or equal to 3.6 g/cm$^3$), the transistor 560 can have stable electric characteristics. The film density can be measured by Rutherford backscattering spectrometry or X-ray reflectometry.

The aluminum oxide film which can be used as the insulating film provided over the transistor 560 has a high shielding effect (blocking effect) of preventing penetration of both oxygen and impurities such as hydrogen and moisture.

Therefore, in and after the manufacturing process, the aluminum oxide film functions as a protective film for preventing entry of impurities such as hydrogen and moisture, which cause a change, into the oxide semiconductor film 503 and release of oxygen, which is a main component material of the oxide semiconductor, from the oxide semiconductor film 503.

In addition, a planarization insulating film may be formed in order to reduce surface unevenness due to the transistor 560. As the planarization insulating film, an organic material such as a polyimide resin, an acrylic resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

For example, a 1500-nm-thick acrylic resin film can be formed as the planarization insulating film. The acrylic resin film can be formed in such a manner that an acrylic resin is applied by a coating method and then baked (e.g., at 250° C. in a nitrogen atmosphere for one hour).

Heat treatment may be performed after the planarization insulating film is formed. For example, the heat treatment is performed at 250° C. in a nitrogen atmosphere for one hour.

As described above, heat treatment may be performed after formation of the transistor 560. The heat treatment may be performed more than once.

In the transistor 560 in this embodiment, the outline of the oxide semiconductor film is provided at a distance from the gate electrode 501. Thus, an increase in leakage current caused by a parasitic channel generated by an overlap of the low-resistance outline of the oxide semiconductor film and the gate electrode can be suppressed. Accordingly, the transistor 560 with high yield can be provided.

In the transistor 560 in this embodiment, the channel length is determined by the distance between the first barrier layer 575a and the second barrier layer 575b. The channel length is determined by the width of a pattern of a resist mask formed by exposure to an electron beam. Accuracy of minute processing is increased by precise exposure to an electron beam, so that a transistor with a channel length of 50 nm or less can be provided.

This embodiment can be implemented in appropriate combination with the other embodiments.

Embodiment 8

In this embodiment, an example of a semiconductor device which includes the transistor described in Embodiment 1, which can hold stored data even when not powered, and which does not have a limitation on the number of write cycles, will be described with reference to drawings. Note that a transistor 162 included in the semiconductor device in this embodiment is the transistor 450 described in Embodiment 1.

Figure 17A:
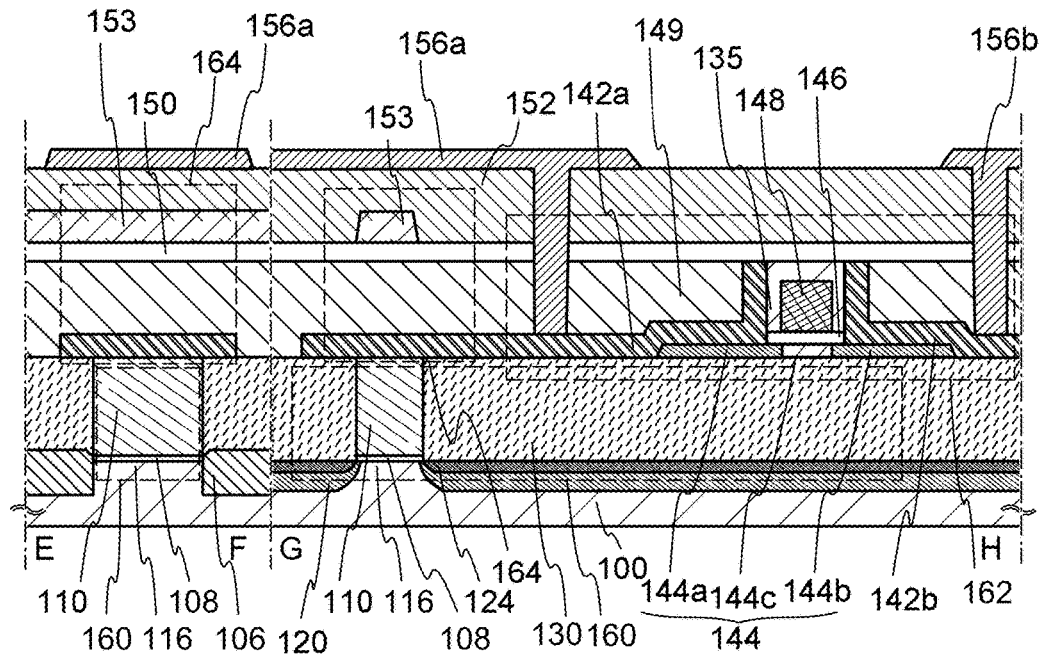
FIGS. 17A to 17C are a cross-sectional view, a plan view, and a circuit diagram illustrating one embodiment of a semiconductor device.
Figure 17B:
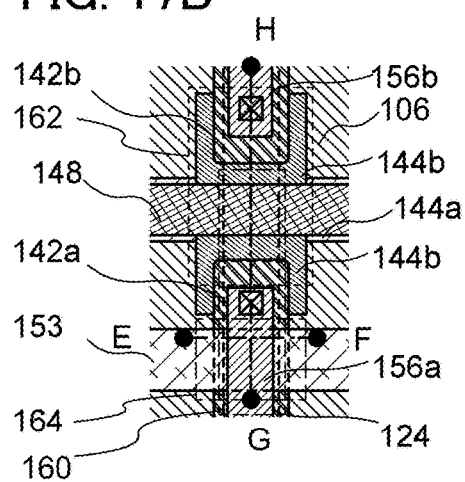
Figure 17C:
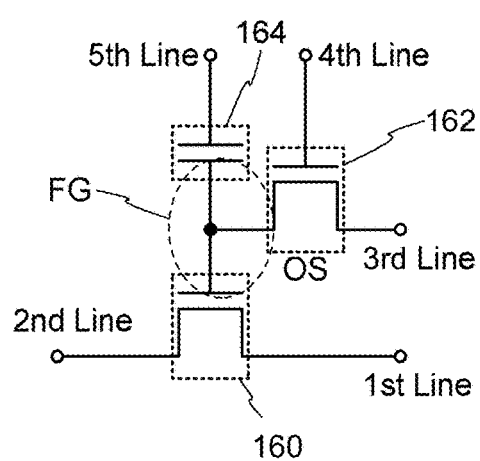

FIGS. 17A to 17C illustrate an example of a structure of a semiconductor device. FIG. 17A is a cross-sectional view of the semiconductor device, FIG. 17B is a plan view of the semiconductor device, and FIG. 17C is a circuit diagram of the semiconductor device. Here, FIG. 17A corresponds to cross sections taken along line E-F and line G-H in FIG. 17B.

The semiconductor device illustrated in FIGS. 17A and 17B includes a transistor 160 including a first semiconductor material in a lower portion, and the transistor 162 including a second semiconductor material in an upper portion. The transistor 162 has the same structure as the transistor 450 described in Embodiment 1.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

The transistor 162 includes an oxide semiconductor and thus has small off-state current; thus, the use of the transistor 162 enables stored data to be held for a long time. In other words, a semiconductor device in which refresh operation is not needed or the frequency of refresh operation is extremely low can be provided, which results in a sufficient reduction in power consumption.

Although all the transistors are n-channel transistors here, p-channel transistors can also be used. The technical feature of the disclosed invention is to use an oxide semiconductor in the transistor 162 so that data can be held; therefore, it is not necessary to limit a specific structure of the semiconductor device, such as a material of the semiconductor device or a structure of the semiconductor device, to the structure described here.

The transistor 160 in FIG. 17A includes a channel formation region 116 provided in a substrate 100 including a semiconductor material (e.g., silicon), impurity regions 120 provided such that the channel formation region 116 is sandwiched therebetween, intermetallic compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for convenience. Further, in such a case, in description of a connection of a transistor, a source region and a source electrode may be collectively referred to as a "source electrode," and a drain region and a drain electrode may be collectively referred to as a "drain electrode". That is, in this specification, the term "source electrode" may include a source region.

Element isolation insulating films 106 are formed over the substrate 100 so that the transistor 160 is interposed therebetween. An insulating film 130 is formed so that the transistor 160 is covered with the insulating film 130. Note that for higher integration, the transistor 160 preferably has a structure without a sidewall insulating layer as illustrated in FIG. 17A. On the other hand, when the characteristics of the transistor 160 have priority, the sidewall insulating layers may be formed on the side surfaces of the gate electrode 110, so that the impurity regions 120 each include regions having different impurity concentrations.

The transistor 162 illustrated in FIG. 17A includes an oxide semiconductor in the channel formation region. An oxide semiconductor film 144 includes a source region 144a which is a low-resistance region, a drain region 144b, and a channel formation region 144c. The channel formation region 144c is sandwiched between the source region 144a and the drain region 144b.

In a manufacturing process of the transistor 162, a sidewall insulating film 135 is formed along the side surfaces and the top surface of the gate electrode 148 in a step of removing the insulating film provided over the gate electrode 148 by chemical mechanical polishing treatment. The gate insulating film 146 is a stacked film in which a silicon nitride oxide film and an aluminum oxide film are stacked in this order from the oxide semiconductor film 144 side. The oxide semiconductor film 144 is subjected to etching treatment and has a cross shape having different lengths in the channel length direction.

Further, the source electrode 142a and the drain electrode 142b are provided in contact with the exposed portion of a top surface of the oxide semiconductor film 144 and the sidewall insulating film 135.

An interlayer insulating film 149 and an insulating film 150 each having a single-layer structure or a stacked-layer structure are provided over the transistor 162. In this embodiment, an aluminum oxide film is used as the insulating film 150. The density of the aluminum oxide film is made to be high (the film density is higher than or equal to 3.2 g/cm$^3$, preferably higher than or equal to 3.6 g/cm$^3$), whereby stable electrical characteristics can be given to the transistor 162.

Further, a conductive film 153 is provided in a region overlapping with the source electrode 142a with the interlayer insulating film 149 and the insulating film 150 provided therebetween. The source electrode 142a, the interlayer insulating film 149, the insulating film 150, and the conductive film 153 constitute a capacitor 164. That is, the source electrode 142a functions as one electrode of the capacitor 164 and the conductive film 153 functions as the other electrode of the capacitor 164. Note that the capacitor 164 may be omitted if a capacitor is not needed. Alternatively, the capacitor 164 may be separately provided above the transistor 162.

An insulating film 152 is provided over the transistor 162 and the capacitor 164. Further, wirings 156a and 156b for connecting the transistor 162 to another transistor are provided over the insulating film 152. The wiring 156a is electrically connected to the source electrode 142a through the electrode formed in an opening provided in the interlayer insulating film 149, the insulating film 150, the insulating film 152, and the like. The wiring 156b is electrically connected to the drain electrode 142b through the electrode formed in an opening provided in the interlayer insulating film 149, the insulating film 150, the insulating film 152, and the like.

In FIGS. 17A and 17B, the transistor 160 and the transistor 162 are provided so as to overlap with each other at least partly. The source region or the drain region of the transistor 160 is preferably provided so as to overlap with part of the oxide semiconductor film 144. In addition, the transistor 162 and the capacitor 164 are provided so as to overlap with at least part of the transistor 160. For example, the conductive film 153 of the capacitor 164 is provided so as to overlap with at least part of the gate electrode 110 of the transistor 160. With such a planar layout, the area occupied by the semiconductor device can be reduced; thus, higher integration can be achieved.

FIG. 17C illustrates an example of a circuit configuration corresponding to FIGS. 17A and 17B.

In FIG. 17C, a first wiring (1st Line) is electrically connected to a source electrode of the transistor 160. A second wiring (2nd Line) is electrically connected to a drain electrode of the transistor 160. A third wiring (3rd Line) is electrically connected to one of a source electrode and a drain electrode of the transistor 162. A fourth wiring (4th Line) is electrically connected to a gate electrode of the transistor 162. A gate electrode of the transistor 160 and one of the source electrode and the drain electrode of the transistor 162 are electrically connected to one electrode of the capacitor 164. A fifth wiring (5th Line) is electrically connected to the other electrode of the capacitor 164.

The semiconductor device in FIG. 17C utilizes a characteristic in which the potential of the gate electrode of the transistor 160 can be held, and thus can write, hold, and read data as described below.

Writing and holding of data will be described. First, the potential of the fourth wiring is set to a potential at which the transistor 162 is turned on, so that the transistor 162 is turned on. Thus, the potential of the third wiring is supplied to a node (node FG) to which the gate electrode of the transistor 160 and the capacitor 164 are connected. In other words, predetermined charge is supplied to the node FG (data writing). Here, charge for supply of a potential level or charge for supply of a different potential level (hereinafter referred to as low-level charge and high-level charge) is given. After that, the potential of the fourth wiring is set to a potential at which the transistor 162 is turned off, so that the transistor 162 is turned off. Thus, the charge given to the node FG is held (data holding).

Since the off-state current of the transistor 162 is extremely small, the charge of the gate electrode of the transistor 160 is held for a long time.

Next, reading of data will be described. When an appropriate potential (reading potential) is supplied to the fifth wiring while a predetermined potential (fixed potential) is supplied to the first wiring, the potential of the second wiring varies depending on the amount of charge held in the node FG This is generally because when the transistor 160 is an n-channel transistor, apparent threshold voltage $V_{th\_H}$ in the case where a high-level charge is supplied to the node FG (also referred to as the gate electrode of the transistor 160) is lower than apparent threshold voltage $V_{th\_L}$ in the case where a low-level charge is supplied to the node FG Here, the apparent threshold voltage refers to the potential of the fifth wiring, which is needed to turn on the transistor 160. Thus, the potential of the fifth wiring is set to a potential $V_0$ between $V_{th\_H}$ and $V_{th\_L}$, whereby charge supplied to the node FG can be determined. For example, in the case where a high-level charge is supplied in writing, when the potential of the fifth wiring is $V_0$ ($>V_{th\_H}$), the transistor 160 is turned on. In the case where a low-level charge is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed, only data of desired memory cells need to be read. In the case where reading is not performed, a potential at which the transistor 160 is turned off regardless of the state of the gate electrode of the transistor 160, that is, a potential smaller than $V_{th\_H}$ may be supplied to the fifth wiring. Alternatively, a potential at which the transistor 160 is turned on regardless of the state of the gate electrode, that is, a potential higher than $V_{th\_L}$ may be supplied to the fifth wiring.

When a transistor which includes a channel formation region formed using an oxide semiconductor and has extremely small off-state current is applied to the semiconductor device in this embodiment, the semiconductor device can hold data for an extremely long period. In other words, refresh operation is not needed or the frequency of the refresh operation can be extremely low, which results in a sufficient reduction in power consumption. Moreover, stored data can be held for a long time even during a period in which power is not supplied (the potential is preferably fixed).

Further, the semiconductor device described in this embodiment does not need high voltage for writing data and has no problem of deterioration of elements. For example, unlike a conventional non-volatile memory, it is not necessary to inject and extract electrons into and from a floating gate; thus, a problem such as deterioration of a gate insulating film does not occur at all. In other words, the semiconductor device according to one embodiment of the present invention does not have a limit on the number of write cycles, which is a problem in a conventional nonvolatile memory, and reliability thereof is drastically improved. Furthermore, data is written depending on the on state and the off state of the transistor, whereby high-speed operation can be easily achieved.

The methods and structures described in this embodiment can be combined as appropriate with any of the methods and structures described in the other embodiments.

Embodiment 9

In this embodiment, a semiconductor device which includes the transistor described in Embodiment 1, can hold stored data even when not powered, does not have a limitation on the number of write cycles, and has a structure different from the structure described in Embodiment 7 will be described with reference to FIGS. 18A and 18B, FIGS. 19A and 19B, and FIG. 20. Note that the transistor 162 included in the semiconductor device in this embodiment is the transistor described in Embodiment 2. Any of the structures of the transistors described in Embodiment 1 can be employed for the transistor 162.

Figure 18A:
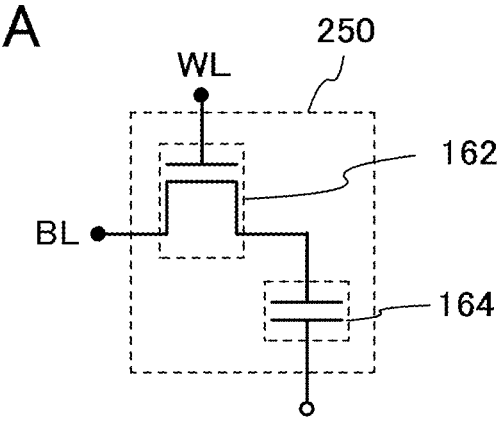
FIGS. 18A and 18B are a circuit diagram and a perspective view illustrating one embodiment of a semiconductor device.
Figure 18B:
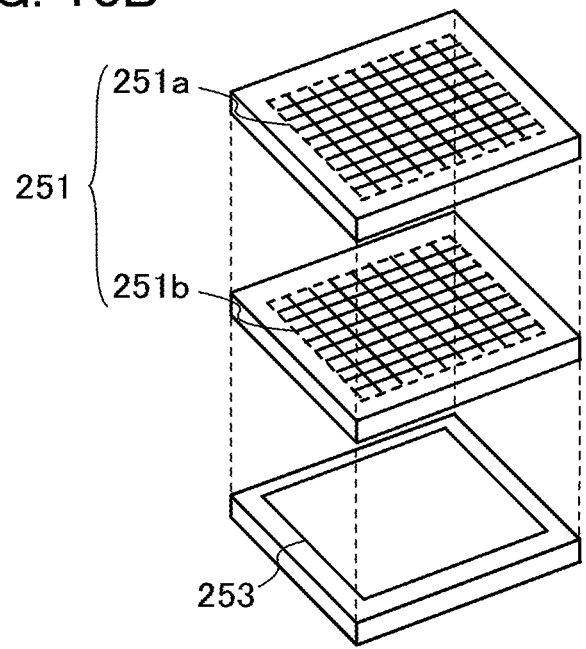

FIG. 18A illustrates an example of a circuit configuration of a semiconductor device, and FIG. 18B is a conceptual diagram illustrating an example of a semiconductor device. First, the semiconductor device illustrated in FIG. 18A will be described, and then the semiconductor device illustrated in FIG. 18B will be described.

In the semiconductor device illustrated in FIG. 18A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 164.

Moreover, the transistor 162 including an oxide semiconductor has extremely small off-state current. For that reason, the potential of the first terminal of the capacitor 164 (or charge accumulated in the capacitor 164) can be held for an extremely long period by turning off the transistor 162.

Next, writing and holding of data in the semiconductor device (a memory cell 250) illustrated in FIG. 18A will be described.

First, the potential of the word line WL is set to a potential at which the transistor 162 is turned on, so that the transistor 162 is turned on. Thus, the potential of the bit line BL is supplied to the first terminal of the capacitor 164 (data writing). After that, the potential of the word line WL is set to a potential at which the transistor 162 is turned off, so that the transistor 162 is turned off. Thus, the potential at the first terminal of the capacitor 164 is held (data holding).

Since the off-state current of the transistor 162 is extremely small, the potential of the first terminal of the capacitor 164 (or the charge accumulated in the capacitor) can be held for a long time.

Next, reading of data will be described. When the transistor 162 is turned on, the bit line BL which is in a floating state and the capacitor 164 are electrically connected to each other, and the charge is redistributed between the bit line BL and the capacitor 164. As a result, the potential of the bit line BL changes. The amount of change in the potential of the bit line BL varies depending on the potential of the first terminal of the capacitor 164 (or the charge accumulated in the capacitor 164).

For example, the potential of the bit line BL after charge redistribution is $(C_B \times V_{B0} + C \times V)/(C_B + C)$, where V is the potential of the first terminal of the capacitor 164, C is the capacitance of the capacitor 164, $C_B$ is the capacitance of the bit line BL (hereinafter also referred to as "bit line capacitance"), and $V_{B0}$ is the potential of the bit line BL before the charge redistribution. Therefore, it can be found that assuming that the memory cell 250 is in either of two states in which the potentials of the first terminal of the capacitor 164 are $V_1$ and $V_0$ ($V_1 > V_0$), the potential of the bit line BL in the case of holding the potential $V_1$ (=$(C_B \times V_{B0} + C \times V_1)/(C_B + C)$) is higher than the potential of the bit line BL in the case of holding the potential $V_0$ (=$(C_B \times V_{B0} + C \times V_0)/(C_B + C)$).

Then, by comparison between the potential of the bit line BL and a predetermined potential, data can be read.

As described above, the semiconductor device illustrated in FIG. 18A can hold charge that is accumulated in the capacitor 164 for a long time because the off-state current of the transistor 162 is extremely small. In other words, refresh operation is not needed or the frequency of refresh operation can be extremely low, which results in a sufficient reduction in power consumption. Moreover, stored data can be held for a long time even during a period in which power is not supplied.

Next, the semiconductor device illustrated in FIG. 18B will be described.

The semiconductor device illustrated in FIG. 18B includes memory cell arrays 251 (memory cell arrays 251a and 251b) each having a plurality of memory cells 250 illustrated in FIG. 18A in an upper portion and a peripheral circuit 253 for operating the memory cell arrays 251a and 251b in a lower portion. Note that the peripheral circuit 253 is electrically connected to the memory cell arrays 251a and 251b.

In the structure illustrated in FIG. 18B, the peripheral circuit 253 can be provided directly under the memory cell arrays 251a and 251b. Thus, a reduction in the size of the semiconductor device can be achieved.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 18B illustrates, as an example, the semiconductor device in which two memory cell arrays, the memory cell array 251a and the memory cell array 251b, are stacked; however, the number of memory cell arrays to be stacked is not limited thereto. Three or more memory cell arrays may be stacked.

Next, a specific structure of the memory cell 250 illustrated in FIG. 18A will be described with reference to FIGS. 19A and 19B.

Figure 19A:
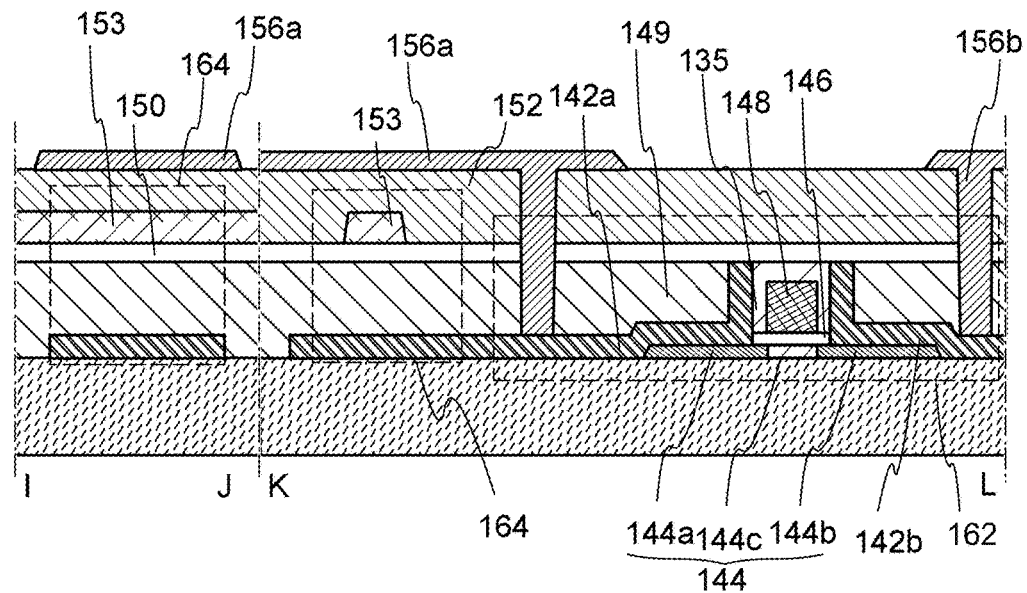
FIGS. 19A and 19B are a cross-sectional view and a plan view illustrating one embodiment of a semiconductor device.
Figure 19B:
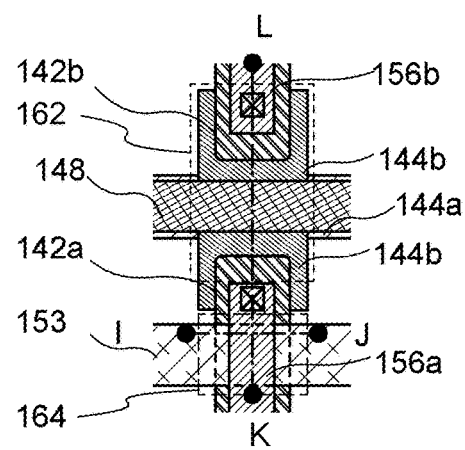

FIGS. 19A and 19B illustrate an example of a structure of the memory cell 250. FIG. 19A is a cross-sectional view and FIG. 19B is a plan view of the memory cell 250. FIG. 19A is a cross-sectional view taken along line I-J and K-L in FIG. 19B.

The transistor 162 in FIGS. 19A and 19B can have the same structure as the transistor in Embodiment 1.

The interlayer insulating film 149 having a single-layer structure or a stacked-layer structure is provided over the transistor 162. In addition, the conductive film 153 is provided in a region overlapping with the source electrode 142a of the transistor 162 with the interlayer insulating film 149 and the insulating film 150 interposed therebetween, and the source electrode 142a, the interlayer insulating film 149, the insulating film 150, and the conductive film 153 form the capacitor 164. That is, the source electrode 142a of the transistor 162 functions as one electrode of the capacitor 164, and the conductive film 153 functions as the other electrode of the capacitor 164.

An insulating film 152 is provided over the transistor 162 and the capacitor 164. Further, the wiring 156a and the wiring 156b for connecting the memory cell 250 to an adjacent memory cell 250 is provided over the insulating film 152. The wiring 156a is electrically connected to the source electrode 142a through the electrode formed in an opening formed in the interlayer insulating film 149, the insulating film 150, the insulating film 152, and the like. The wiring 156b is electrically connected to the drain electrode 142b through the electrode formed in an opening provided in the interlayer insulating film 149, the insulating film 150, the insulating film 152, and the like. Note that the wirings 156a and 156b may be electrically connected to the source electrode 142a and the drain electrode 142b, respectively, through another conductive film provided in the opening. The wirings 156a and 156b correspond to the bit line BL in the circuit diagram of FIG. 18A.

In FIGS. 19A and 19B, the drain electrode 142b of the transistor 162 can also function as a source electrode of a transistor included in an adjacent memory cell.

When the planar layout in FIG. 19A is employed, the area occupied by the semiconductor device can be reduced; thus, the degree of integration can be increased.

As described above, the plurality of memory cells formed in multiple layers in the upper portion is each formed with a transistor including an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor with sufficiently small off-state current). Further, with a structure in which the peripheral circuit and the memory circuit are stacked, higher integration of the integration of the semiconductor device can be achieved.

Figure 20:
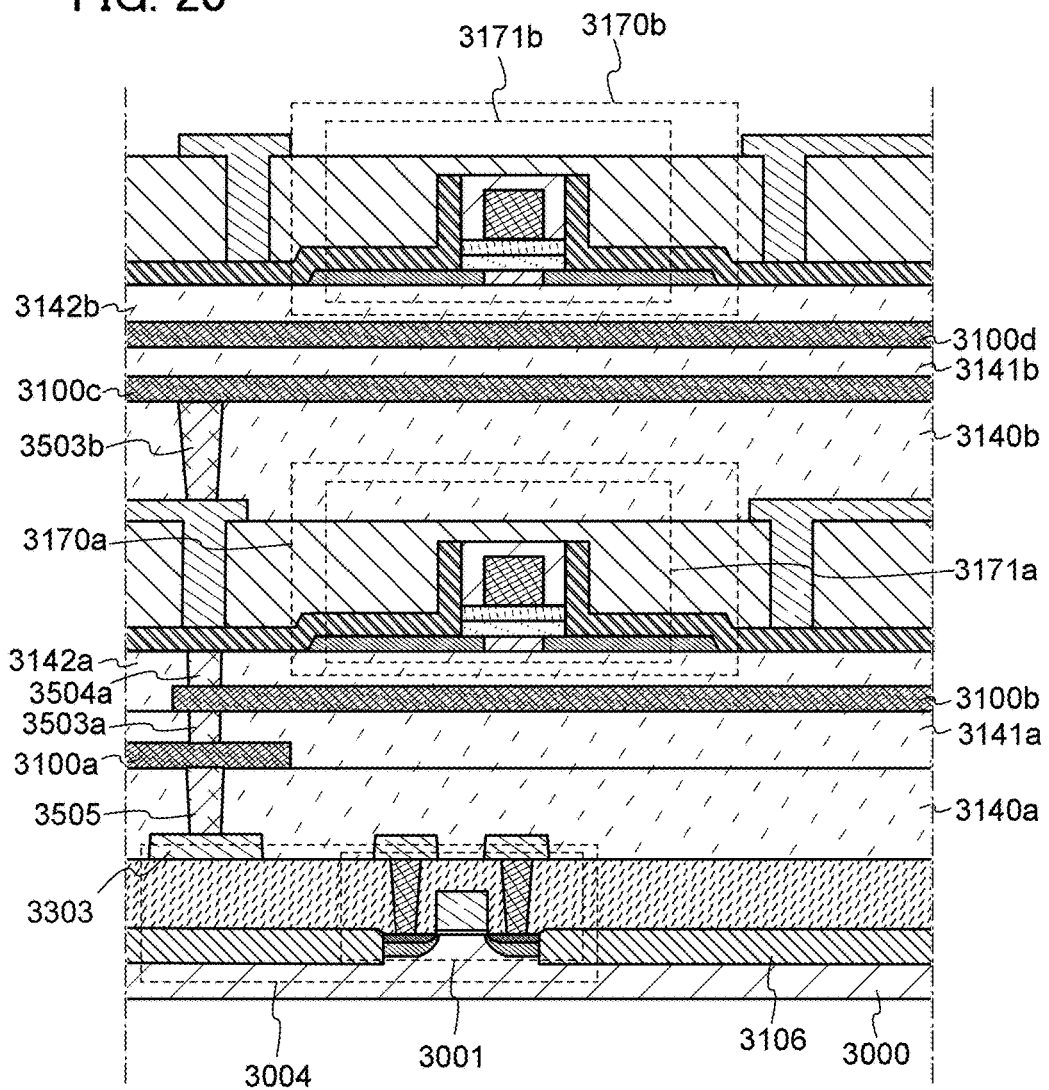
FIG. 20 is a cross-sectional view illustrating one embodiment of a semiconductor device.

FIG. 20 is a cross-sectional view illustrating an example of a stacked-layer structure of the semiconductor device in FIG. 18B. FIG. 20 illustrates the logic circuit 3004, a memory cell 3170a, and a memory cell 3170b as typical examples. The memory cell 3170a and the memory cell 3170b can have a configuration similar to the circuit configuration described in the above embodiment, for example.

Note that a transistor 3171a included in the memory cell 3170a is illustrated as a typical example. A transistor 3171b included in the memory cell 3170b is illustrated as a typical example. Each of the transistors 3171a and 3171b includes a channel formation region in an oxide semiconductor film. The structure of the transistor in which the channel formation region is formed in the oxide semiconductor film is the same as the structure described in any of the other embodiments, and thus the description of the structure is omitted.

The logic circuit 3004 includes a transistor 3001 in which a semiconductor material other than an oxide semiconductor is used for a channel formation region. The transistor 3001 can be a transistor obtained in such a manner that an element isolation insulating layer 3106 is provided on a substrate 3000 including a semiconductor material (e.g., silicon) and a region serving as the channel formation region is formed in a region surrounded by the element isolation insulating layer 3106. Note that the transistor 3001 may be a transistor obtained in such a manner that the channel formation region is formed in a semiconductor film such as a silicon film formed on an insulating surface or in a silicon film of an SOI substrate. A known structure can be used as the structure of the transistor 3001 and thus the description is omitted.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed. An insulating film 3141a is provided between the wiring 3100a and the wiring 3100b. An insulating film 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating film 3140b is provided between the wiring 3100c and the layers in which the transistor 3171a is formed. An insulating film 3141b is provided between the wiring 3100c and the wiring 3100d. An insulating film 3142b is provided between the wiring 3100d and the layers in which the transistor 3171b is formed.

The insulating films 3140a, 3141a, 3142a, 3140b, 3141b, and 3142b each function as an interlayer insulating film whose surface can be planarized.

The wirings 3100a, 3100b, 3100c, and 3100d enable electrical connection between the memory cells, electrical connection between the logic circuit 3004 and the memory cells, and the like.

An electrode 3303 included in the logic circuit 3004 can be electrically connected to a circuit provided in the upper portion.

For example, as illustrated in FIG. 20, the electrode 3303 can be electrically connected to the wiring 3100a through an electrode 3505. The wiring 3100a can be electrically connected to a wiring 3100b through an electrode 3503a. The wiring 3100b can be electrically connected to one of a source electrode or a drain electrode of the transistor 3171a through an electrode 3504a. In this manner, the electrode 3303 can be electrically connected to the source electrode or the drain electrode of the transistor 3171a. In addition, the source electrode or the drain electrode of the transistor 3171a can be electrically connected to a wiring 3100c through an electrode 3503b.

Although FIG. 20 illustrates the example in which two memory cells (the memory cell 3170a and the memory cell 3170b) are stacked, the number of memory cells to be stacked is not limited to this structure.

FIG. 20 illustrates an example in which the electrode 3303 and the transistor 3171a are electrically connected to each other through the wirings 3100a and 3100b; however, one embodiment of the disclosed invention is not limited thereto. The electrode 3303 may be electrically connected to the transistor 3171a through the wiring 3100a, through the wiring 3100b, or through another electrode which is neither the wiring 3100a nor the wiring 3100b.

FIG. 20 illustrates the structure where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer or three or more wiring layers may be provided between the layers in which the transistor 3171a is formed and the layers in which the transistor 3001 is formed.

FIG. 20 illustrates the structure where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the number of wiring layers provided therebetween is not limited to two. One wiring layer or three or more wiring layers may be provided between the layers in which the transistor 3171b is formed and the layers in which the transistor 3171a is formed.

The methods and structures described in this embodiment can be combined as appropriate with any of the methods and structures described in the other embodiments.

Embodiment 10

In this embodiment, examples of application of the semiconductor device described in any of the above embodiments to portable devices such as a mobile phone, a smartphone, or an e-book reader will be described with reference to FIGS. 21A and 21B, FIG. 22, FIG. 23, and FIG. 24.

In portable electronic devices such as a mobile phone, a smart phone, and an e-book reader, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 21A:
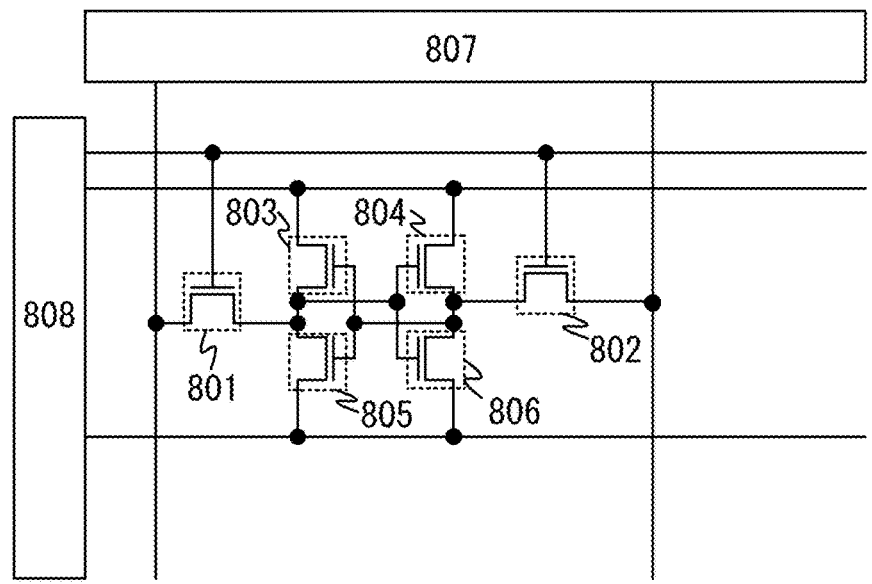
FIGS. 21A and 21B are circuit diagrams of one embodiment of a semiconductor device.

In a normal SRAM, as illustrated in FIG. 21A, one memory cell includes six transistors, which are a transistor 801, a transistor 802, a transistor 803, a transistor 804, a transistor 805, and a transistor 806, and they are driven by an X decoder 807 and a Y decoder 808. A pair of transistors 803 and 805 and a pair of the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the highest among a variety of memory devices.

Figure 21B:
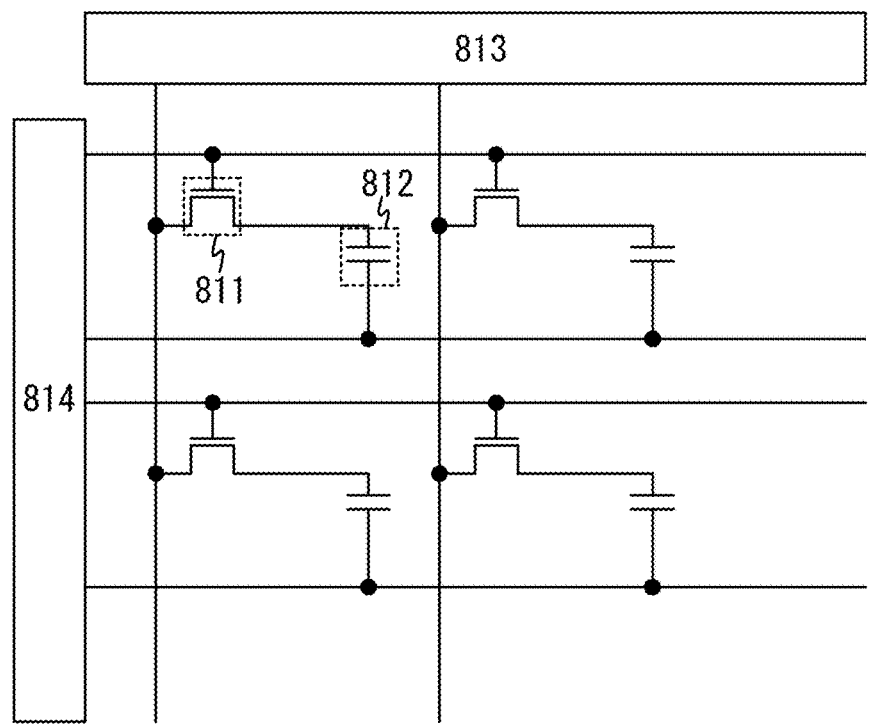

On the other hand, as illustrated in FIG. 21B, a memory cell in a DRAM includes a transistor 811 and a storage capacitor 812, and is driven by an X decoder 813 and a Y decoder 814. One cell includes one transistor and one capacitor and has a small area. The area of a memory cell in a DRAM is generally less than or equal to 10 $F^2$. Note that the DRAM needs to be refreshed periodically and consumes electric power even when a rewriting operation is not performed.

However, the area of the memory cell of the semiconductor device described in the above embodiments is about 10 $F^2$ and frequent refreshing is not needed. Therefore, the area of the memory cell can be reduced, which results in a reduction in power consumption.

Figure 22:
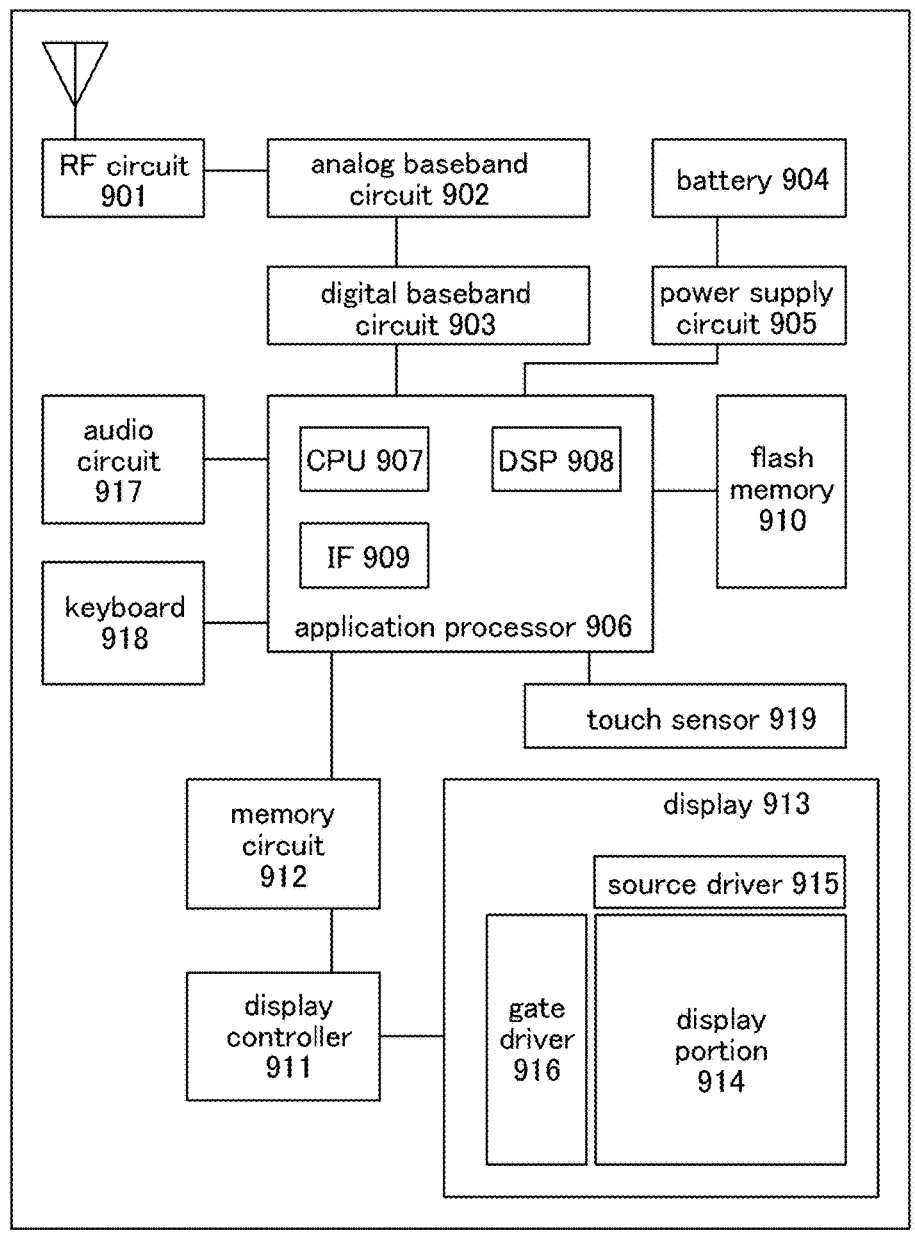
FIG. 22 is a block diagram illustrating one embodiment of a semiconductor device.

FIG. 22 is a block diagram of a portable device. A portable device illustrated in FIG. 22 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 23:
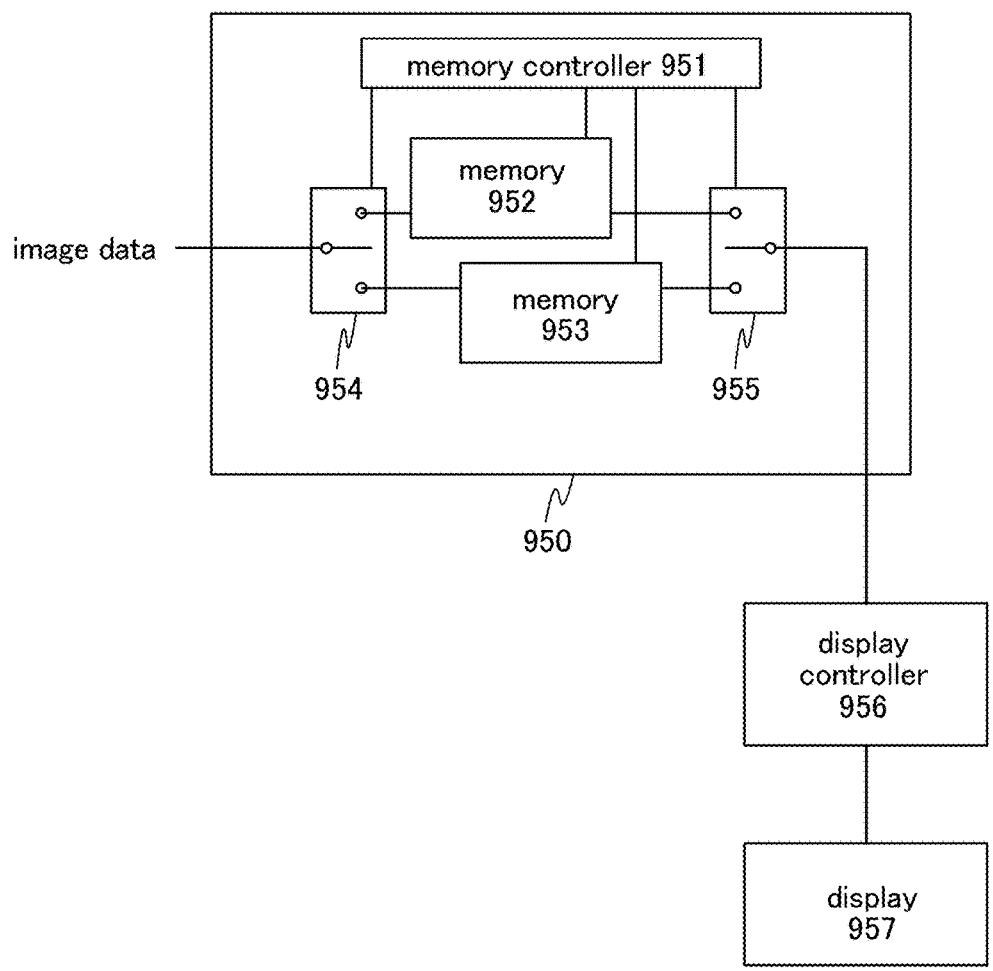
FIG. 23 is a block diagram illustrating one embodiment of a semiconductor device.

FIG. 23 illustrates an example in which any of the semiconductor devices described in the above embodiments is used for a memory circuit 950 in a display. The memory circuit 950 illustrated in FIG. 23 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced.

Figure 24:
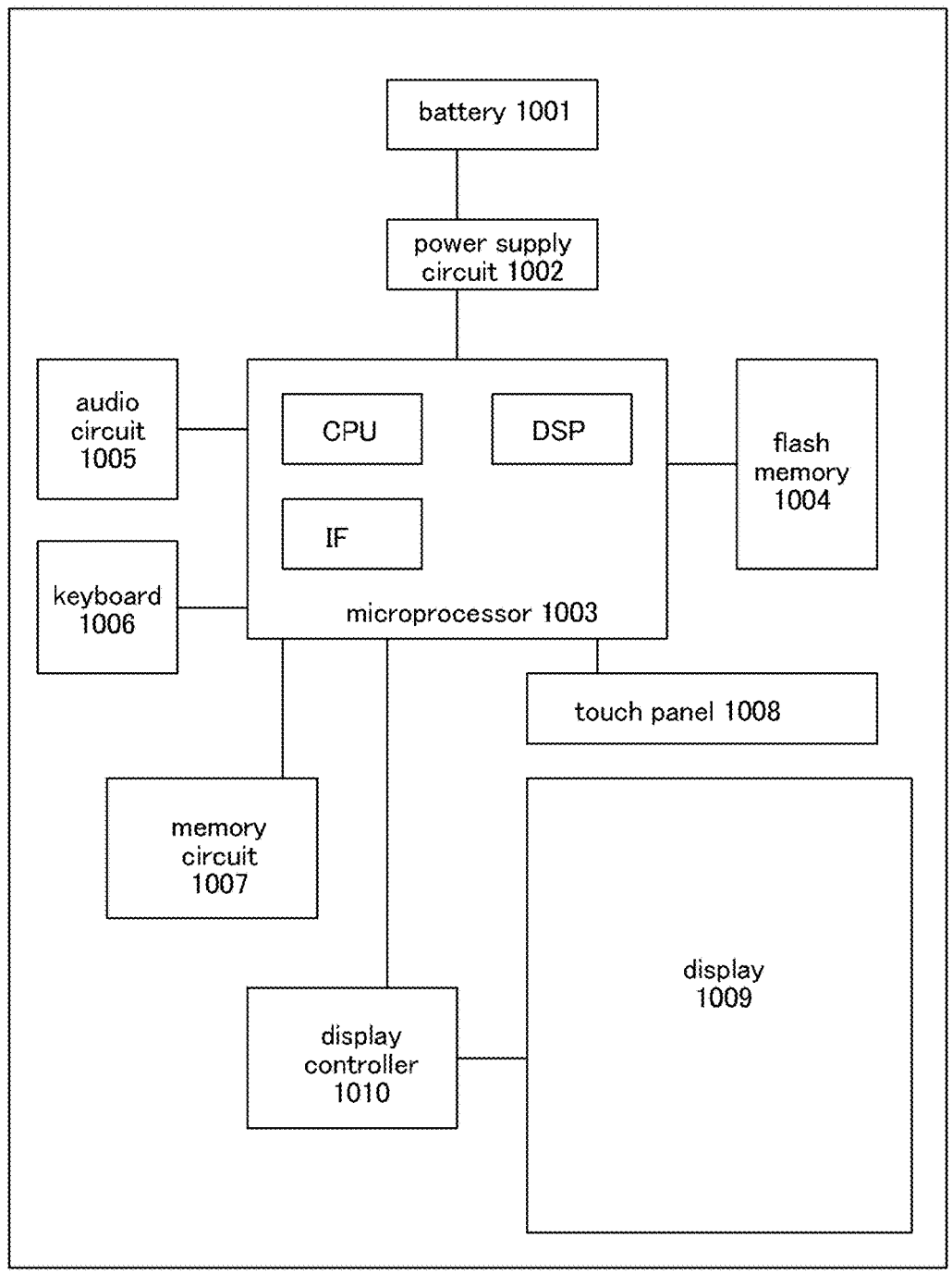
FIG. 24 is a block diagram illustrating one embodiment of a semiconductor device.

FIG. 24 is a block diagram of an e-book reader. FIG. 24 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, any of the semiconductor devices described in the above embodiments can be used for the memory circuit 1007 in FIG. 24. The memory circuit 1007 has a function of temporarily holding the contents of a book. For example, when a user reads an e-book, the user may use a highlighting function of changing a display color, drawing an underline, using a bold font, changing the type of letter, or the like so that the specific portion is in clear contrast to the other portions. In order to save the data for a long time, the data may be copied to the flash memory 1004. Also in such a case, by employing any of the semiconductor device described in the above embodiments, data can be written and read at high speed and held for a long time, and power consumption can be sufficiently reduced.

As described above, the portable devices described in this embodiment each incorporate any of the semiconductor devices according to the above embodiments. Therefore, it is possible to obtain a portable device in which data is read at high speed, the data is held for a long time, and power consumption is sufficiently reduced.

The methods and structures described in this embodiment can be combined as appropriate with any of the methods and structures described in the other embodiments.

Embodiment 11

A semiconductor device disclosed in this specification can be applied to a variety of electronic devices. Examples of electronic devices include a television device (also referred to as a television or a television receiver), a monitor of a computer or the like, a camera such as a digital camera or a digital video camera, a digital photo frame, a mobile phone, a portable game machine, a portable information terminal, an audio reproducing device, a game machine (such as a pachinko machine or a slot machine), and a game console, and the like. Specific examples of such electronic devices are illustrated in FIGS. 25A to 25C.

Figure 25A:
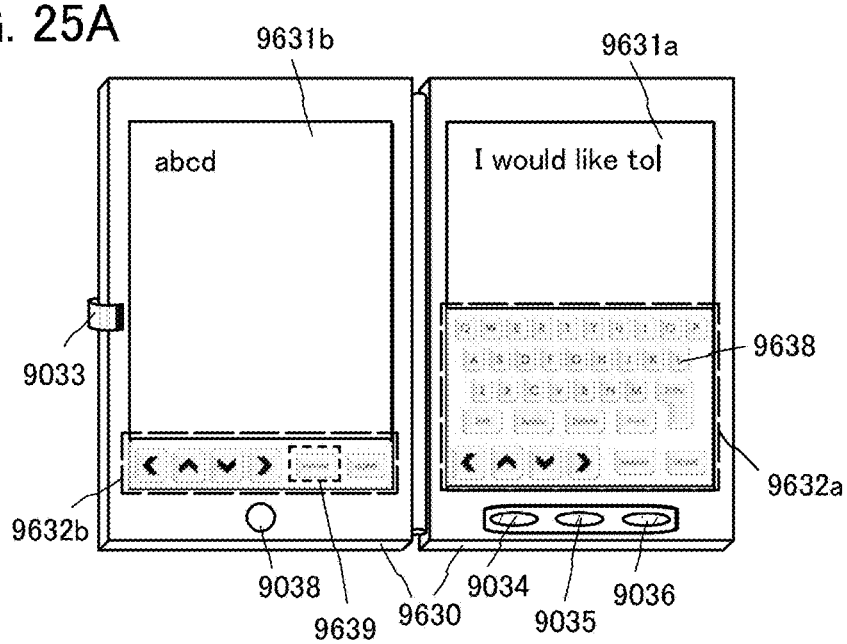
FIGS. 25A to 25C illustrate an electronic devices of one embodiment of the present invention.
Figure 25B:
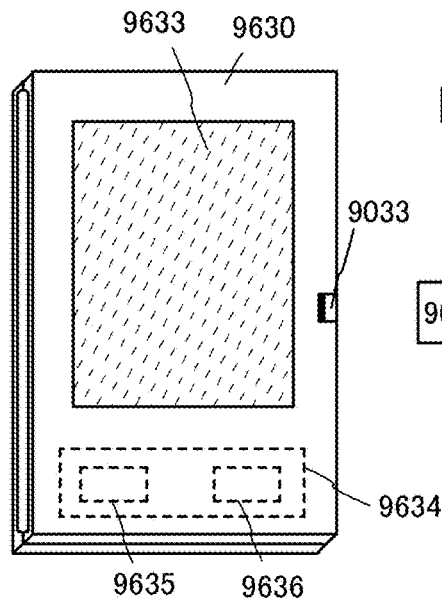
Figure 25C:
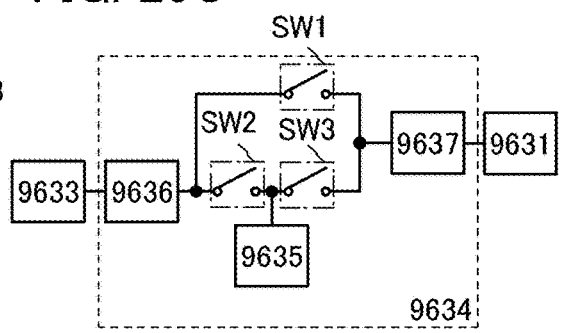

FIGS. 25A and 25B illustrate a foldable tablet terminal. The tablet terminal is opened in FIG. 25A. The tablet terminal includes a housing 9630, a display portion 9631a, a display portion 9631b, a display mode switch 9034, a power switch 9035, a power saver switch 9036, a clasp 9033, and an operation switch 9038.

The semiconductor device described in any of Embodiments 1 to 6 can be used for the display portion 9631a and the display portion 9631b, so that the tablet terminal can have high reliability.

Part of the display portion 9631a can be a touch panel region 9632a and data can be input when a displayed operation key 9638 is touched. Although a structure in which a half region in the display portion 9631a has only a display function and the other half region also has a touch panel function is shown as an example, the display portion 9631a is not limited to the structure. The whole display portion 9631a may have a touch panel function. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Note that FIG. 25A shows an example in which the display portion 9631a and the display portion 9631b have the same display area; however, one embodiment of the present invention is not limited and one of the display portions may be different from the other display portion in size and display quality. For example, one display panel may be capable of higher-definition display than the other display panel.

The tablet terminal is closed in FIG. 25B. The tablet terminal includes the housing 9630, a solar cell 9633, a charge and discharge control circuit 9634, a battery 9635, and a DCDC converter 9636. In FIG. 25B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 25A and 25B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

The structure and the operation of the charge and discharge control circuit 9634 illustrated in FIG. 25B will be described with reference to a block diagram in FIG. 25C. The solar cell 9633, the battery 9635, the DCDC converter 9636, a converter 9637, switches SW1 to SW3, and a display portion 9631 are illustrated in FIG. 25C, and the battery 9635, the DCDC converter 9636, the converter 9637, and the switches SW1 to SW3 correspond to the charge and discharge control circuit 9634 illustrated in FIG. 25B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, one embodiment of the present invention is not limited and the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

The methods and structures described in this embodiment can be combined as appropriate with any of the methods and structures described in the other embodiments.

Embodiment 12

A central processing unit (CPU) can be formed using the transistor described in the above embodiments for at least part of the CPU.

Figure 26A:
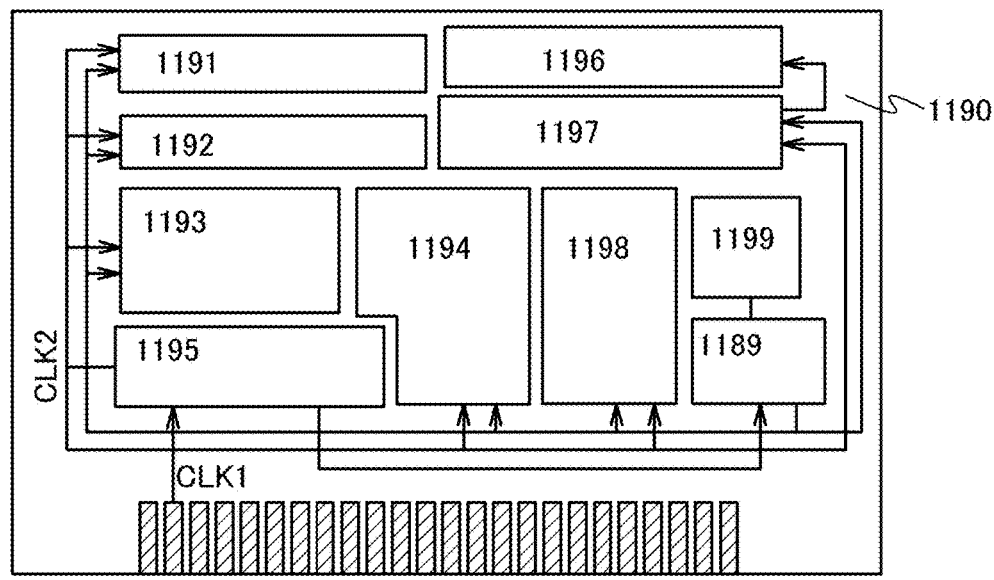
FIG. 26A is a block diagram illustrating a semiconductor device of one embodiment of the present invention.

FIG. 26A is a block diagram illustrating a specific structure of a CPU. The CPU illustrated in FIG. 26A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 26A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 26A, a memory cell is provided in the register 1196. As the memory cell in the register 1196, any of memory cells including the semiconductor device described in the above embodiments can be used.

In the CPU illustrated in FIG. 26A, the register controller 1197 selects operation of holding data in the register 1196 in accordance with an instruction from the ALU 1191. That is, the register controller 1197 determined whether data is held by a logic element reversing the logic (value) or by a capacitor in the memory cell included in the register 1196. When data holding by the phase-inversion element is selected, power supply voltage is supplied to the memory cell in the register 1196. When data holding by the capacitor is selected, the data is rewritten in the capacitor, and supply of power supply voltage to the memory cell in the register 1196 can be stopped.

Figure 26B:
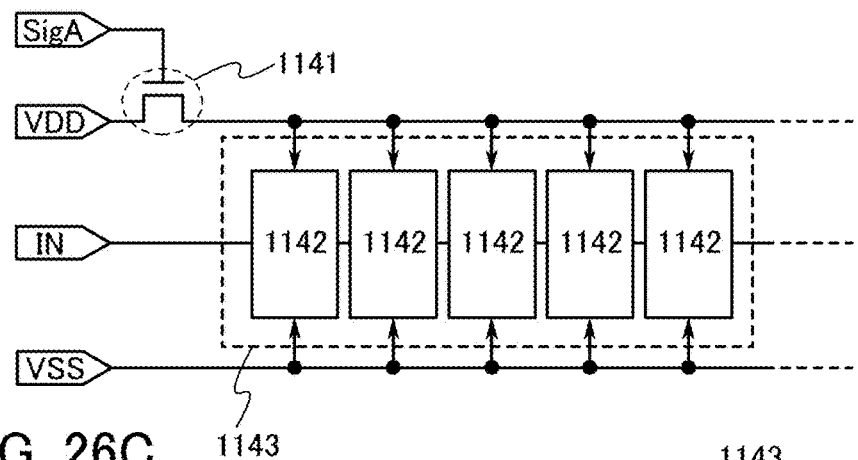
FIGS. 26B and 26C are circuit diagrams of part thereof.
Figure 26C:
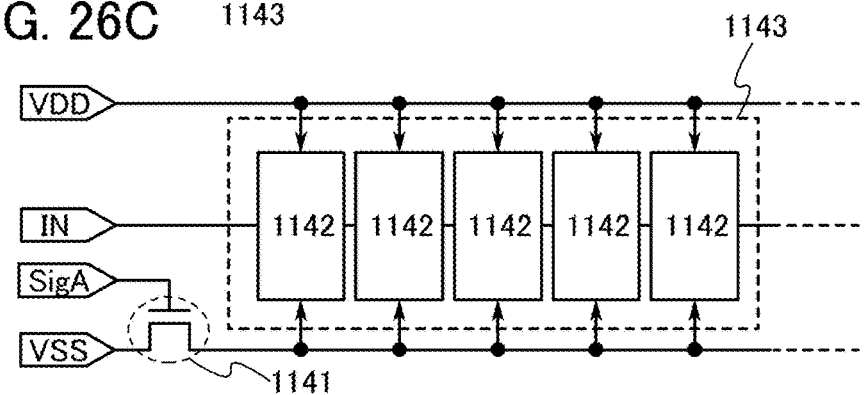

The power supply can be stopped by a switching element provided between a memory cell group and a node to which a power supply potential VDD or a power supply potential VSS is supplied, as illustrated in FIG. 26B or FIG. 26C. Circuits illustrated in FIGS. 26B and 26C are described below.

FIGS. 26B and 26C each illustrate an example of a structure of a memory circuit in which any of the transistors disclosed in the above embodiments is used as a switching element for controlling supply of a power supply potential to a memory cell.

The memory device illustrated in FIG. 26B includes a switching element 1141 and a memory cell group 1143 including a plurality of memory cells 1142. Specifically, as each of the memory cells 1142, the memory cell described in the above embodiments can be used. Each of the memory cells 1142 included in the memory cell group 1143 is supplied with the high-level power supply potential VDD through the switching element 1141. Further, each of the memory cells 1142 included in the memory cell group 1143 is supplied with a potential of a signal IN and the low-level power supply potential VSS.

In FIG. 26B, a transistor disclosed in the above embodiments is used as the switching element 1141, and the switching of the transistor is controlled by a signal SigA supplied to a gate electrode thereof.

FIG. 26B illustrates the structure in which the switching element 1141 includes only one transistor. Note that the structure is not limited and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 26B, the switching element 1141 may control the supply of the low-level power supply potential VSS.

In FIG. 26C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the consumed power can be reduced.

Although the CPU is given as an example, the transistor can also be applied to an LSI such as a digital signal processor (DSP), a custom LSI, or a field programmable gate array (FPGA).

The structures, methods, and the like described in this embodiment can be combined with any of the other embodiments, as appropriate.

Reference Example

The transistor structure disclosed in this specification is useful particularly in the case where a CAAC-OS film is employed as an oxide semiconductor film in which a channel is formed. Specifically, in the CAAC-OS film, the resistance of a region in the vicinity of a side surface is easily lowered owing to desorption of oxygen from the side surface (end surface). On the other hand, the transistor disclosed in this specification includes an oxide semiconductor film which is formed so as to have a cross shape having different lengths in the channel length direction or to have a larger length than a source electrode and a drain electrode in the channel width direction. It is possible to reduce the probability of electrical connection between the source electrode and the drain electrode of the transistor through a region (a region having lower resistance owing to desorption of oxygen (O) or the like) in the vicinity of a side surface (end surface) of the oxide semiconductor film.

The matter that oxygen easily desorbs from the side surface (end surface) of the CAAC-OS film will be described in detail below.

Here, as an example of the oxide semiconductor film, ease of excessive oxygen (an oxygen atom contained in a proportion higher than that of oxygen in the stoichiometric composition) transfer and ease of oxygen vacancy transfer in an In—Ga—Zn-based oxide (hereinafter, referred to as IGZO) film which is a three-component metal oxide are described with reference to scientific computation results.

In the computation, a model (see FIGS. 27A to 27C and FIGS. 29A to 29C) in which one excessive oxygen atom or oxygen vacancy exists in one In—O surface of IGZO having atomic ratio of In:Ga:Zn=3:1:2 was formed by structure optimization, and each energy of intermediate structures along a minimum energy path was calculated by a nudged elastic band (NEB) method.

The computation was performed using calculation program software "OpenMX" based on the density functional theory (DFT). Parameters are described below.

As a basis function, a pseudoatom local basis function was used. The basis function is classified as polarization basis sets STO (slater type orbital).

As a functional, generalized-gradient-approximation/Perdew-Burke-Ernzerhof (GGA/PBE) was used.

The cut-off energy was 200 Ry.

The sampling k-point was 5×5×3.

In the computation of ease of excessive oxygen transfer, the number of atoms which existed in the computation model was set to 85. In the computation of ease of oxygen vacancy transfer, the number of atoms which existed in the computation model was set to 83.

Ease of excessive oxygen transfer and ease of oxygen vacancy transfer are evaluated by calculation of a height of energy barrier Eb which is required to go over in moving to respective sites. That is, when the height of energy barrier Eb which is gone over in moving is high, excessive oxygen or oxygen vacancy hardly moves, and when the height of the energy barrier Eb is low, excessive oxygen or oxygen vacancy easily moves.

Figure 27A:
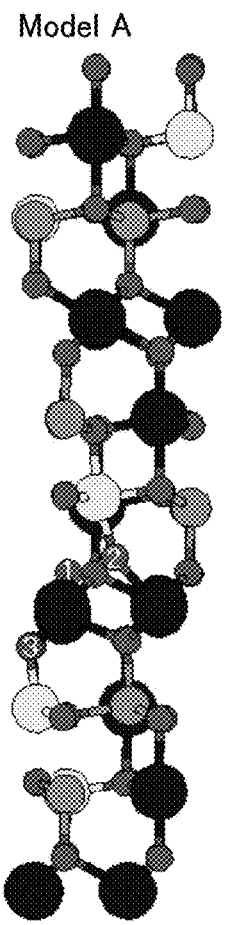
FIGS. 27A to 27C are model diagrams used in computation of excessive oxygen transfer.
Figure 27B:
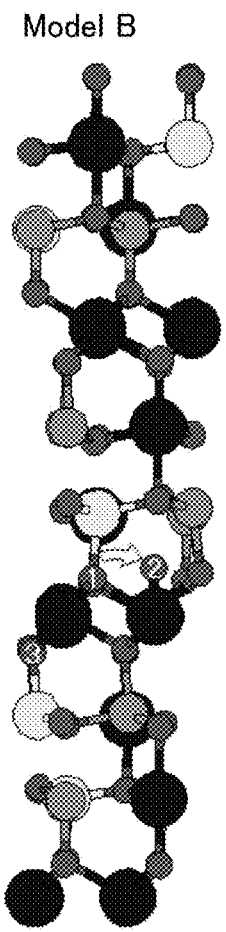
Figure 27C:
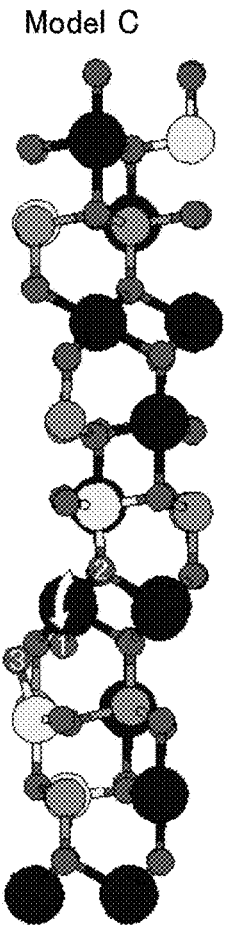
Figure 28:
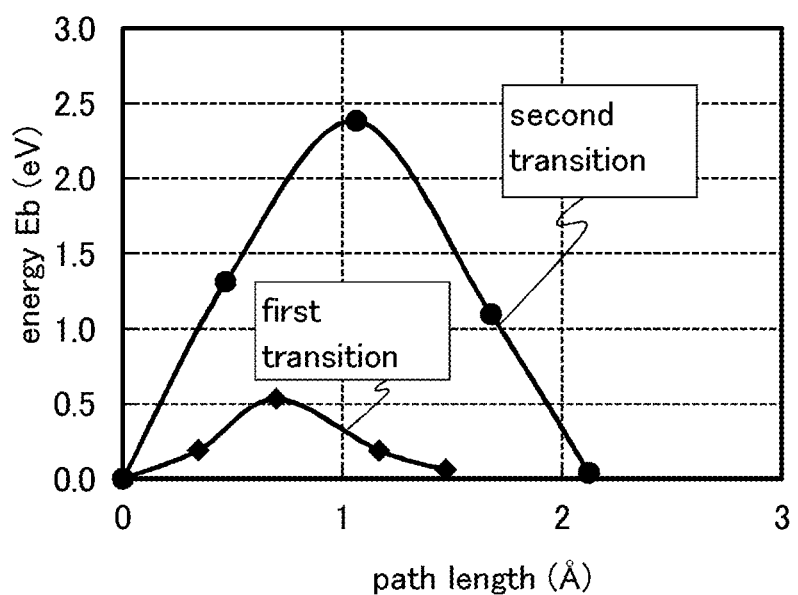
FIG. 28 shows results of the computation of the model diagrams in FIGS. 27A to 27C.

First, excessive oxygen transfer is described. FIGS. 27A to 27C show models used for computation of excessive oxygen transfer. The computations of two transition forms described below were performed. FIG. 28 shows the computations results. In FIG. 28, the horizontal axis indicates a path length (of oxygen vacancy transfer), and the vertical axis indicates energy (required for transfer) based on energy (0 eV) in a state of a model A in FIG. 27A.

In the two transition forms of the excessive oxygen transfer, a first transition is a transition from the model A to a model B and a second transition is a transition from the model A to a model C.

In FIGS. 27A to 27C, an oxygen atom denoted by "1" is referred to as a first oxygen atom of the model A; an oxygen atom denoted by "2" is referred to as a second oxygen atom of the model A; and an oxygen atom denoted by "3" is referred to as a third oxygen atom of the model A.

As seen from FIG. 28, the maximum value ($Eb_{max}$) of the height Eb of the energy barrier in the first transition is 0.53 eV, and that of the second transition is 2.38 eV. That is, the maximum value ($Eb_{max}$) of the height Eb of the energy barrier in the first transition is lower than that of the second transition. Therefore, energy required for the first transition is smaller than energy required for the second transition, and the first transition occurs more easily than the second transition.

That is, the first oxygen atom of the model A moves in the direction in which the second oxygen atom of the model A is pushed more easily than in the direction in which the third oxygen atom of the model A is pushed. Therefore, this shows that the oxygen atom moves along the layer of indium atoms more easily than across the layer of indium atoms.

Figure 30:
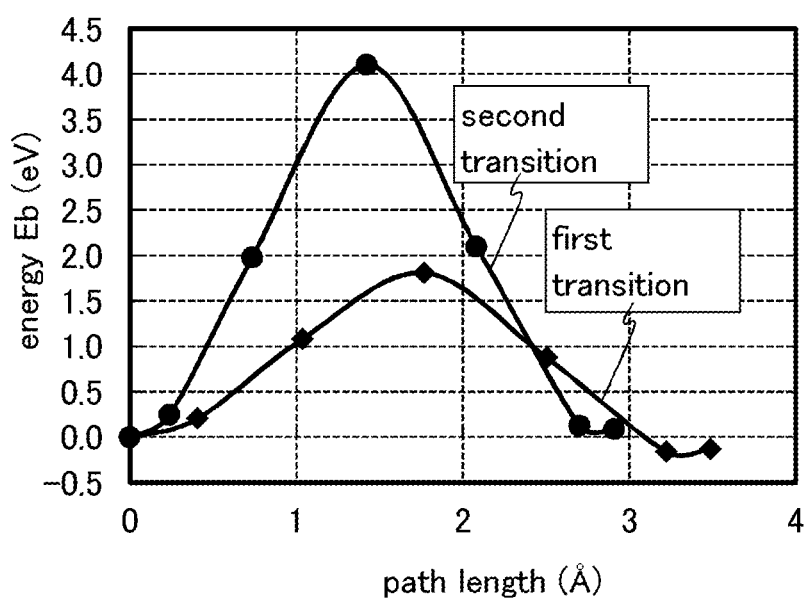
FIG. 30 shows results of the computation of the model diagrams in FIGS. 29A to 29C.

Next, oxygen vacancy transfer is described. FIGS. 29A to 29C show models used for computation of oxygen vacancy transfer. The computations of two transition forms described below were performed. FIG. 30 shows the computations results. In FIG. 30, the horizontal axis indicates a path length (of excessive oxygen transfer), and the vertical axis indicates energy (required for transfer) based on energy (0 eV) in a state of a model A in FIG. 29A.

In the two transition forms of the oxygen vacancy transfer, a first transition is a transition from the model A to a model B and a second transition is a transition from the model A to a model C.

Note that dashed circles in FIGS. 29A to 29C represent oxygen vacancy.

As seen from FIG. 30, the maximum value ($Eb_{max}$) of the height Eb of the energy barrier in the first transition is 1.81 eV, and that of the second transition is 4.10 eV. That is, the maximum value ($Eb_{max}$) of the height Eb of the energy barrier in the first transition is lower than that of the second transition. Therefore, energy required for the first transition is smaller than energy required for the second transition, and the first transition occurs more easily than the second transition.

That is, the oxygen vacancy of the model A moves to the position of oxygen vacancy of the model B more easily than to the position of oxygen vacancy of the model C. Therefore, this shows that the oxygen vacancy also moves along the layer of indium atoms more easily than across the layer of indium atoms.

Next, in order to compare probabilities of occurrence of the above-described four transition forms from another side, temperature dependence of these transitions is described.

The above-described four transition forms are (1) the first transition of excessive oxygen, (2) the second transition of excessive oxygen, (3) the first transition of oxygen vacanry, and (4) the second transition of oxygen vacancy.

Temperature dependence of these transitions is compared with each other based on movement frequency per unit time. Here, movement frequency Z (per second) at certain temperature T (K) is represented by the following formula (2) when the number of vibrations $Z_O$ (per second) of an oxygen atom in the chemically stable position is used.

[FORMULA 2]

$$Z = Z_O \cdot \exp\left(-\frac{Eb_{\max}}{kT}\right) \quad (2)$$

Note that in the formula (2), $Eb_{max}$ represents a maximum value of a height of an energy barrier of each transition, and k represents a Boltzmann constant. Further, $Z_O = 1.0 \times 10^{13}$ (per second) is used for the calculation.

In the case where excessive oxygen or oxygen vacancy moves beyond the maximum value ($Eb_{max}$) of the height of the energy barrier once per one second (in the case of Z=1 (per second)), when the formula (2) is solved for T, the following formulas are obtained.

(1) In the first transition of excessive oxygen of Z=1, T=206K (−67° C.).
(2) In the second transition of excessive oxygen of Z=1, T=923K (650° C.).
(3) In the first transition of oxygen vacancy of Z=1, T=701K (428° C.).
(4) In the second transition of oxygen vacancy of Z=1, T=1590K (1317° C.).

On the other hand, Z in the case of T=300K (27° C.) is represented by the following formulas.
(1) In the first transition of excessive oxygen of T=300K, $Z=1.2 \times 10^4$ (per second).
(2) In the second transition of excessive oxygen of T=300K, $Z=1.0 \times 10^{-27}$ (per second).
(3) In the first transition of oxygen vacancy of T=300K, $Z=4.3 \times 10^{-18}$ (per second).
(4) In the second transition of oxygen vacancy of T=300K, $Z=1.4 \times 10^{-56}$ (per second).

Further, Z in the case of T=723K (450° C.) is represented by the following formulas.
(1) In the first transition of excessive oxygen of T=723K, $Z=2.0 \times 10^9$ (per second).
(2) In the second transition of excessive oxygen of T=723K, $Z=2.5 \times 10^{-4}$ (per second).
(3) In the first transition of excessive oxygen of T=723K, Z=2.5 (per second).
(4) In the second transition of excessive oxygen of T=723K, $Z=2.5 \times 10^{-16}$ (per second)

In view of the above-described calculation, excessive oxygen, in the case of either T=300K or T=723K, moves along the layer of indium atoms more easily than across the layer of indium atoms. Moreover, oxygen vacancy also, in the case where either T=300K or T=723K, moves along the layer of indium atoms more easily than across the layer of indium atoms.

Further, in the case of T=300K, the movement of the excessive oxygen along the layer of indium atoms occurs extremely easily; however, the other transitions do not occur easily. In the case of T=723K, not only the movement of the excessive oxygen along the layer of indium atoms but the movement of the oxygen vacancy along the layer of indium atoms occurs easily; however, it is difficult for either the excessive oxygen or the oxygen vacancy to move across the layer of indium atoms.

That is, it can be said that in the case where the layer of indium atoms exists over a surface parallel to a surface where an oxide semiconductor film is formed or a surface of the oxide semiconductor film (e.g., the case of CAAC-OS film), excessive oxygen and oxygen vacancy easily move in a parallel direction to the surface where the oxide semiconductor film is formed or the surface of the oxide semiconductor film.

As described above, in the oxide semiconductor film formed of the CAAC-OS film, excessive oxygen and oxygen vacancy easily move along the surface where the oxide semiconductor film is formed or a surface of the oxide semiconductor film. Therefore, there is a problem about release of oxygen from the side surface of the oxide semiconductor film. When oxygen is released, excessive oxygen is decreased, so that it is difficult to fill oxygen vacancy. If there is oxygen vacancy, the conductivity of the oxide semiconductor film formed of the CAAC-OS film might be high up to a level at which the film is not preferable used for a switching element.

Note that the case where the excessive oxygen or the oxygen vacancy moves across the layer of indium atoms is described above; however, the present invention is not limited thereto, and the same applies to metals other than indium which are contained in an oxide semiconductor film.

The above release of oxygen is particularly remarkable in the case where the oxide semiconductor film formed of the CAAC-OS film is processed into an island shape. This is because an area of the side surface of the oxide semiconductor film increases in the case where the oxide semiconductor film is processed into an island shape.

Example 1

Figure 31:
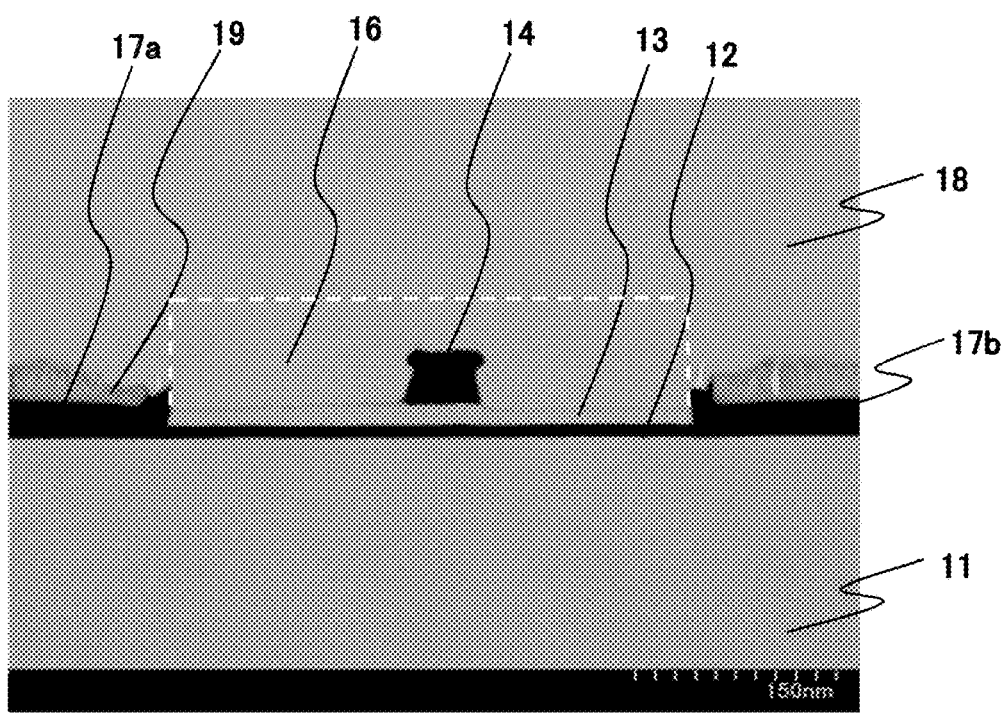
FIG. 31 shows a cross-sectional STEM image of a transistor in Example.

In this example, a transistor described in Embodiment 1 was formed, and a cross-section of the transistor was observed. FIG. 31 is a cross-sectional STEM image of an example transistor in the channel length direction.

As the transistor, the example transistor which has a structure similar to that of the transistor 450 illustrated in FIGS. 1A to 1C was formed. A method for manufacturing the example transistor is described below with reference to FIG. 31. Note that the boundary surface between a sidewall insulating film 16 and an insulating film 18 is hardly seen in the cross-sectional STEM image and thus is denoted by a white dotted line in this example for easy understanding.

A 1000-nm-thick silicon oxide film was deposited as a base insulating film 11 over a silicon substrate by a sputtering method (deposition conditions: an oxygen (50 sccm of oxygen) atmosphere, a pressure of 0.4 Pa, a power supply (power supply output) of 1.5 kW, a distance between the silicon substrate and a target of 60 mm, and a substrate temperature of 100° C.).

A 10-nm-thick IGZO film was formed as an oxide semiconductor film 12 over the silicon oxide film by a sputtering method using an oxide target having an atomic ratio of In:Ga:Zn=3:1:2 (deposition conditions: an atmosphere of argon and oxygen (argon=30 sccm, oxygen=15 sccm), a pressure of 0.4 Pa, a power supply of 0.5 kW, and a substrate temperature of 200° C.).

Next, the oxide semiconductor film 12 was etched by a dry etching method (etching conditions: an etching gas ($BCl_3$=60 sccm, $Cl_2$=20 sccm), a power supply of an ICP power supply of 450 W, a bias power of 100 W, and a pressure of 1.9 Pa).

Next, as a gate insulating film, a 20-nm-thick silicon nitride oxide film was deposited by a CVD method (deposition conditions: $SiH_4$=1 sccm, $N_2O$=800 sccm, a pressure of 40 Pa, a power of an RF power supply (power supply output) of 150 W, a power supply frequency of 60 MHz, a distance between the silicon substrate and the target of 28 mm, and a substrate temperature of 400° C.).

A 30-nm-thick tantalum nitride film was deposited over the gate insulating film by a sputtering method (deposition conditions: an atmosphere of argon and nitrogen (argon=50 sccm, nitrogen=10 sccm), a pressure of 0.6 Pa, a power supply of 1 kW, a substrate temperature of 230° C.). A 70-nm-thick tungsten film was deposited over the tantalum nitride film by a sputtering method (deposition conditions: an atmosphere of argon (Ar=100 sccm), a pressure of 2.0 Pa, a power of 4 kW, and a substrate temperature of 230° C.).

Then, the tungsten film was etched by a dry etching method (etching conditions: an etching gas ($CF_4$=55 sccm, $Cl_2$=45 sccm, $O_2$=55 sccm), a power of an ICP power supply of 3000 W, a bias power of 110 W, a pressure of 0.67 Pa, and a substrate temperature of 40° C.) and the tantalum nitride film was etched (etching conditions: an etching gas ($Cl_2$=100 sccm), a power of an ICP power supply of 2000 W, a bias power of 50 W, a pressure of 0.67 Pa, and a substrate temperature of 40° C.), so that a gate electrode 14 was formed.

A 460-nm-thick silicon nitride oxide film was deposited over the gate electrode 14 as an insulating film by a CVD method (deposition conditions: $SiH_4$=1 sccm, $N_2O$=800 sccm, a pressure of 40 Pa, a power of an RF power supply (power supply output) of 150 W, a power supply frequency of 60 MHz, a distance between the silicon substrate and the target of 28 mm, and a substrate temperature of 400° C.) and the silicon nitride oxide film was subjected to polishing treatment by a chemical mechanical polishing (CMP) method (polishing conditions: a hard polyurethane-based polishing cloth, alkaline silica-based slurry, a slurry temperature of room temperature, a polishing pressure (load) of 0.08 MPa, a rotation number in polishing (table/spindle) of 50 rpm/51 rpm, and a polishing time of 0.8 minutes), so that the silicon nitride oxide film had a thickness of 100 nm over the gate electrode 14 and the rest of the silicon nitride oxide film was removed.

Next, a resist mask was formed over the silicon nitride oxide film and then the silicon nitride oxide film and the gate insulating film were etched by a dry etching method (etching conditions: an etching gas ($CHF_3$=22.5 sccm, He=127.5 sccm, $CH_4$=5.5 sccm), a power of an ICP power supply of 475 W, a bias power of 300 W, a pressure of 3.5 Pa, and a substrate temperature of 70° C.), so that the sidewall insulating film 16 and a gate insulating film 13 were formed.

A 30-nm-thick tungsten film was deposited over the oxide semiconductor film 12, the gate insulating film 13, and the sidewall insulating films 16 by a sputtering method (deposition conditions: an atmosphere of argon (Ar=10 sccm), a pressure of 0.8 Pa, a power of 1 kW, and a substrate temperature of 230° C.).

Then, the tungsten film was etched by a dry etching method (etching conditions: an etching gas ($CF_4$=55 sccm, $Cl_2$=45 sccm, $O_2$=55 sccm), a power of an ICP power supply of 3000 W, a bias power of 110 W, a pressure of 0.67 Pa, and a substrate temperature of 40° C.).

Next, a 70-nm-thick aluminum oxide film was deposited over the island-shaped tungsten film by a sputtering method (deposition conditions: an atmosphere of argon and nitrogen (argon=25 sccm, nitrogen=25 sccm), a pressure of 0.4 Pa, a power supply of 2.5 kW, a distance between the silicon substrate and the target of 60 mm, and a substrate temperature of 250° C.).

Further, over the aluminum oxide film, a 460-nm-thick silicon nitride oxide film was deposited by a CVD method (deposition conditions: $SiH_4$=1 sccm, $N_2O$=800 sccm, a pressure of 40 Pa, a power of an RF power supply (power supply output) of 150 W, a power supply frequency of 60 MHz, a distance between the silicon substrate and the target of 28 mm, and a substrate temperature of 400° C.).

Then, the tungsten film, the aluminum oxide film, and the silicon nitride oxide film were subjected to polishing treatment by a chemical mechanical polishing (CMP) method (polishing conditions: a hard polyurethane-based polishing cloth, alkaline silica-based slurry, a slurry temperature of room temperature, a polishing pressure (load) of 0.08 MPa, a rotation number in polishing (table/spindle) of 50 rpm/51 rpm, and a polishing time of 2 minutes); thus, the tungsten film, the aluminum oxide film, and the silicon nitride oxide film over the gate electrode 14 were removed so that the sidewall insulating films 16 were exposed.

By the polishing treatment, the aluminum oxide film which is a barrier film 19 and the silicon nitride oxide film which is the insulating film 18 were processed and the tungsten film was separated into two parts, so that a source electrode 17a and a drain electrode 17b were formed.

Next, a 400-nm-thick silicon nitride oxide film was deposited as an interlayer insulating film over the sidewall insulating films 16, the source electrode 17a, the drain electrode 17b, and the insulating film 18 by a CVD method. After the interlayer insulating film was formed, heat treatment was performed at 400° C. under an oxygen atmosphere for an hour.

Then, openings reaching the source electrode 17a and the drain electrode 17b were formed in the insulating film 18 and the interlayer insulating film.

A 300-nm-thick tungsten film was formed in the openings by a sputtering method and then was etched to form wiring layers.

A 1.5-µm-polyimide film was formed over the wiring layers and was subjected to heat treatment at 300° C. under an air for an hour.

Through the process, the example transistor was formed.

An end face of the example transistor was cut, and a cross section of the example transistor was observed using a scanning transmission electron microscopy (STEM). In this example, as the STEM, an Ultra-thin Film Evaluation System HD-2300 manufactured by Hitachi High-Technologies Corporation was used.

As shown in FIG. 31, it can be found that the source electrode 17a and the drain electrode 17b were separated from each other through the polishing treatment. The source electrode 17a and the drain electrode 17b are provided in contact with side surfaces of the sidewall insulating films 16 provided along side surfaces of the gate electrode 14. In this example, each of the source electrode 17a and the drain electrode 17b is formed along the side surfaces of the sidewall insulating films 16 so that the top surface of each of the source electrode 17a and the drain electrode 17b is little lower than a half the thickness of the sidewall insulating films 16.

Note that in FIG. 31, the width of the bottom base of the trapezoidal gate electrode 14 was about 58 nm and the width in the channel length direction between the sidewall insulating film 16 and the gate electrode 14 was about 170 nm.

In the transistor in this example, a conductive film provided over the gate electrode 14 and the sidewall insulating film 16 was removed by chemical mechanical polishing treatment, so that the conductive film was divided; thus, the source electrode 17a and the drain electrode 17b are formed.

Accordingly, the distance between the gate electrode 14 and a region (contact region) in which the oxide semiconductor film 12 is in contact with the source electrode 17a or the drain electrode 17b can be made short, so that the resistance between the gate electrode 14 and the region (contact region) in which the oxide semiconductor film 12 is in contact with the source electrode 17a or the drain electrode 17b is reduced; thus, the on-state characteristics of the transistor can be improved.

As described in this example, a miniaturized transistor having high electric characteristics can be provided with high yield. Further, also in a semiconductor device including the transistor, high performance, high reliability, and high productivity can be achieved.

Example 2

Figure 32:
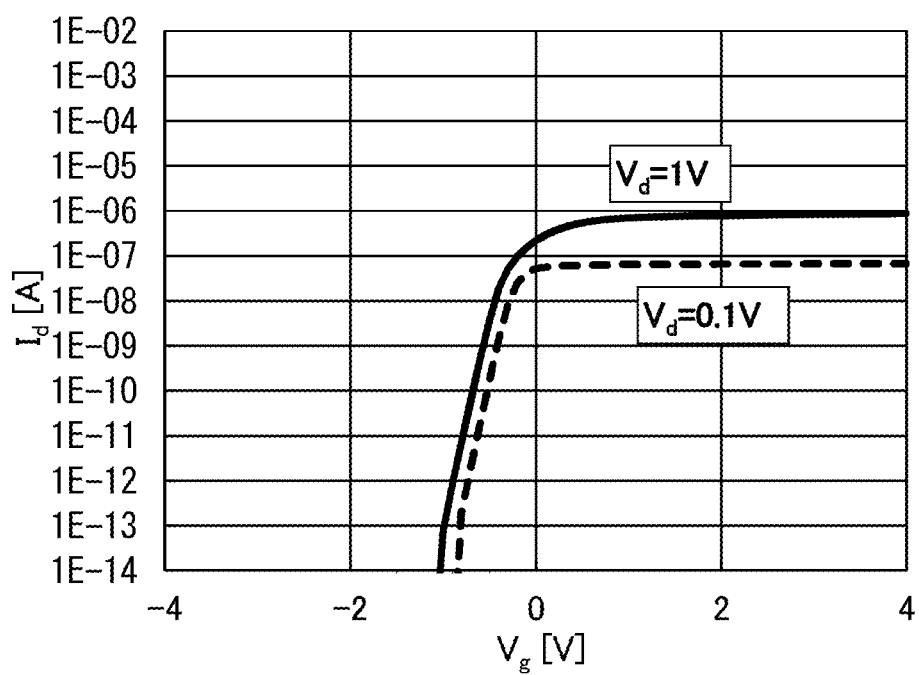
FIG. 32 shows results of electrical characteristic evaluation of a transistor in Example.

In this example, in the transistor formed in Example 1, a drain current ($I_d$: [A]) was measured under conditions that a drain voltage ($V_d$: [V]) was set to 1 V and 0.1 V and a gate voltage ($V_g$: [V]) was swept from −4 V to 4 V. FIG. 32 shows the measurement results. In FIG. 32, the solid line indicates the measurement results when the drain voltage ($V_d$: [V]) was set to 1 V, the dotted line indicates the measurement results when the drain voltage ($V_d$: [V]) was set to 0.1 V, the horizontal axis indicates a gate voltage ($V_g$: [V]), and the vertical axis indicates the drain current ($I_d$: [A]). Note that "drain voltage ($V_d$: [V])" refers to a potential difference between a drain and the source when the potential of the source is used as a reference potential, and "gate voltage ($V_g$: [V])" refers to a potential difference between a gate and a source when the potential of the source is used as a reference potential.

As illustrated in FIG. 32, the transistor formed in Example 1 exhibited electrical characteristics as a switching element. When the drain voltages ($V_d$: [V]) were 1 V and 0.1V, the shift values were −1.03 V and −0.84 V, respectively. These results show that the shift values were small.

The above results suggested that the transistors in this example had extremely high electric characteristics.

This application is based on Japanese Patent Application serial no. 2012-010386 filed with Japan Patent Office on Jan. 20, 2012, Japanese Patent Application serial no. 2012-010423 filed with Japan Patent Office on Jan. 20, 2012, and Japanese Patent Application serial no. 2012-010404 filed with Japan Patent Office on Jan. 20, 2012, the entire contents of which are hereby incorporated by reference.

What is claimed is:
1. A semiconductor device comprising:
an oxide semiconductor film comprising:
   a channel formation region;
   a first region and a second region with the channel formation region interposed therebetween, which are in contact with the channel formation region; and
   a third region and a fourth region with the channel formation region, the first region, and the second region interposed therebetween, which are in contact with the channel formation region;
a source electrode in contact with the first region;
a drain electrode in contact with the second region;

a gate electrode overlapping with the first region, the second region, the third region, and the fourth region; and an insulating film between the oxide semiconductor film and the gate electrode, wherein a sum of a channel length, a length of the first region in a channel length direction, and a length of the second region in the channel length direction is larger than a length of the gate electrode in the channel length direction, and wherein a sum of a channel width, a length of the third region in a channel width direction, and a length of the fourth region in the channel width direction is larger than a length of any of the first region and the second region in the channel width direction.

2. The semiconductor device according to claim 1, wherein the gate electrode is over the oxide semiconductor film.

3. The semiconductor device according to claim 1, wherein the oxide semiconductor film comprises indium, zinc, and a metal element other than indium and zinc.

4. The semiconductor device according to claim 3, wherein the metal element is gallium.

5. The semiconductor device according to claim 1, wherein the oxide semiconductor film has a cross shape.

6. The semiconductor device according to claim 1, wherein the insulating film comprises:
   a first insulating film comprising oxygen; and
   a second insulating film comprising nitrogen between the first insulating film and the gate electrode.

7. The semiconductor device according to claim 1, wherein a concentration of copper in the oxide semiconductor film is lower than or equal to $1 \times 10^{18}$ atoms/cm$^3$.

8. The semiconductor device according to claim 1, wherein a concentration of aluminum in the oxide semiconductor film is lower than or equal to $1 \times 10^{18}$ atoms/cm$^3$.

9. The semiconductor device according to claim 1, wherein a concentration of chlorine in the oxide semiconductor film is lower than or equal to $2 \times 10^{18}$ atoms/cm$^3$.

10. The semiconductor device according to claim 1, wherein each of the length of the third region and the length of the fourth region in the channel width direction is larger than the channel length.

\* \* \* \* \*